United States Patent
Hatakeyama et al.

(10) Patent No.: US 9,310,683 B2
(45) Date of Patent: Apr. 12, 2016

(54) MONOMER, POLYMER, POSITIVE RESIST COMPOSITION AND PATTERNING PROCESS

(71) Applicant: SHIN-ETSU CHEMICAL CO., LTD., Tokyo (JP)

(72) Inventors: Jun Hatakeyama, Joetsu (JP); Koji Hasegawa, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 15 days.

(21) Appl. No.: 13/856,017

(22) Filed: Apr. 3, 2013

(65) Prior Publication Data

US 2013/0288180 A1 Oct. 31, 2013

(30) Foreign Application Priority Data

Apr. 26, 2012 (JP) ................................ 2012-100568

(51) Int. Cl.

| | |
|---|---|
| G03F 7/039 | (2006.01) |
| G03F 7/004 | (2006.01) |
| G03F 7/20 | (2006.01) |
| G03F 7/30 | (2006.01) |
| C08F 212/14 | (2006.01) |
| C08F 212/00 | (2006.01) |
| C08F 12/22 | (2006.01) |
| C08F 220/10 | (2006.01) |
| C08F 220/38 | (2006.01) |

(52) U.S. Cl.
CPC .............. *G03F 7/0397* (2013.01); *C08F 12/22* (2013.01); *C08F 212/00* (2013.01); *C08F 212/14* (2013.01); *C08F 220/10* (2013.01); *C08F 220/38* (2013.01); *G03F 7/0045* (2013.01); *G03F 7/0046* (2013.01); *G03F 7/039* (2013.01); *G03F 7/2041* (2013.01); *G03F 7/30* (2013.01)

(58) Field of Classification Search
None
See application file for complete search history.

(56) References Cited

U.S. PATENT DOCUMENTS

| | | | |
|---|---|---|---|
| 5,879,851 A | 3/1999 | Takahashi et al. | |
| 6,448,420 B1 | 9/2002 | Kinsho et al. | |
| 6,746,817 B2 | 6/2004 | Takeda et al. | |
| 7,312,016 B2 * | 12/2007 | Koitabashi et al. | ........ 430/270.1 |
| 7,482,108 B2 | 1/2009 | Matsumaru et al. | |
| 7,537,880 B2 | 5/2009 | Harada et al. | |
| 7,598,016 B2 | 10/2009 | Kobayashi et al. | |
| 7,887,991 B2 | 2/2011 | Hatakeyama et al. | |
| 2008/0090172 A1 | 4/2008 | Hatakeyama et al. | |
| 2010/0227274 A1 | 9/2010 | Hatakeyama et al. | |
| 2011/0183263 A1 | 7/2011 | Takahashi et al. | |
| 2012/0202153 A1 * | 8/2012 | Hatakeyama | .............. 430/283.1 |

FOREIGN PATENT DOCUMENTS

| | | |
|---|---|---|
| EP | 0 473 547 A1 | 3/1992 |
| JP | 04-230645 A | 8/1992 |
| JP | 2000-327633 A | 11/2000 |
| JP | 3429592 B2 | 7/2003 |
| JP | 2005-084365 A | 3/2005 |
| JP | 2006-045311 A | 2/2006 |
| JP | 2006-169302 A | 6/2006 |
| JP | 3865048 B2 | 1/2007 |
| JP | 2007-240729 A | 9/2007 |
| JP | 2008-111103 A | 5/2008 |
| JP | 2008-122932 A | 5/2008 |
| JP | 2008-239918 A | 10/2008 |
| JP | 2009-211050 A | 9/2009 |
| JP | 2010-237662 A | 10/2010 |
| JP | 2011-175253 A | 9/2011 |

OTHER PUBLICATIONS

Japanese Office Action dated Aug. 5, 2014, issued in corresponding Japanese Patent Application No. 2012-100568 (5 pages).
H. Otsuka et al., "Synthesis and controlled polymerization of p-(1-methylcyclohexyloxy)styrene and quick-response deblocking ability of the obtained polymer", Macromol. Rapid Commun., vol. 21, pp. 48-52, 2000, Japan, cited in Japanese Office Action dated Aug. 5, 2014.

* cited by examiner

*Primary Examiner* — Sin Lee
(74) *Attorney, Agent, or Firm* — Westerman, Hattori, Daniels & Adrian, LLP

(57) ABSTRACT

A polymer for use in resist compositions is obtained from a monomer having formula (1) wherein $R^1$ is methyl, ethyl, propyl, vinyl or ethynyl, the circle designates $C_3$-$C_{12}$ cycloalkyl, a combination wherein $R^1$ is ethyl and the circle is cyclohexyl being excluded, $R^2$ is H or $C_1$-$C_4$ alkyl, and m is 1 to 4.

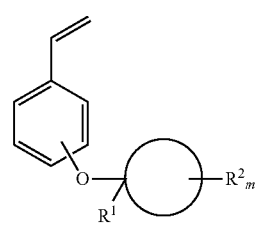

(1)

10 Claims, No Drawings

MONOMER, POLYMER, POSITIVE RESIST COMPOSITION AND PATTERNING PROCESS

CROSS-REFERENCE TO RELATED APPLICATION

This non-provisional application claims priority under 35 U.S.C. §119 (a) on Patent Application No. 2012-100568 filed in Japan on Apr. 26, 2012, the entire contents of which are hereby incorporated by reference.

TECHNICAL FIELD

This invention relates to a positive resist composition, and more particularly to a chemically amplified positive resist composition comprising a specific polymer; and a patterning process using the same. It also relates to a polymerizable monomer and a polymer obtained therefrom and suitable as the base resin in the resist composition.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, extreme ultraviolet (EUV) lithography of 13.5 nm wavelength, and double patterning version of the ArF lithography, on which active research efforts have been made.

With respect to high-energy radiation of very short wavelength such as electron beam (EB) or x-ray, hydrocarbons and similar light elements used in resist materials have little absorption. Then polyhydroxystyrene base resist materials are under consideration. Resist materials for EB lithography are practically used in the mask image writing application. Recently, the mask manufacturing technology becomes of greater interest. Reduction projection exposure systems or steppers have been used since the time when the exposure light was g-line. While their demagnification factor was ⅕, a factor of ¼ is now used as a result of chip size enlargement and projection lens diameter increase. It becomes of concern that a dimensional error of a mask has an impact on the dimensional variation of a pattern on wafer. It is pointed out that as the pattern feature is reduced, the value of a dimensional variation on the wafer becomes greater than the value of a dimensional error of the mask. This is evaluated by a mask error enhancement factor (MEEF) which is a dimensional variation on wafer divided by a dimensional error of mask. Patterns on the order of 45 nm often show an MEEF in excess of 4. In a situation including a demagnification factor of ¼ and a MEEF of 4, the mask manufacture needs an accuracy substantially equivalent to that for equi-magnification masks.

The exposure system for mask manufacturing made a transition from the laser beam exposure system to the EB exposure system to increase the accuracy of line width. Since a further size reduction becomes possible by increasing the accelerating voltage of the electron gun in the EB exposure system, the accelerating voltage increased from 10 keV to 30 keV and reached 50 keV in the current mainstream system, with a voltage of 100 keV being under investigation.

As the accelerating voltage increases, a lowering of sensitivity of resist film becomes of concern. As the accelerating voltage increases, the influence of forward scattering in a resist film becomes so reduced that the contrast of electron image writing energy is improved to ameliorate resolution and dimensional control whereas electrons can pass straightforward through the resist film so that the resist film becomes less sensitive. Since the mask exposure tool is designed for exposure by direct continuous writing, a lowering of sensitivity of resist film leads to an undesirably reduced throughput. Due to a need for higher sensitivity, chemically amplified resist compositions are contemplated.

Thinning of resist film is in progress to facilitate reduction of pattern feature in the EB lithography for mask manufacturing and to prevent the pattern from collapsing due to a higher aspect ratio during development. In the case of photolithography, a thinning of resist film greatly contributes to resolution improvement. This is because introduction of chemical mechanical polishing (CMP) or the like has driven forward device planarization. In the case of mask manufacture, substrates are flat, and the thickness of processable substrates (e.g., Cr, MoSi or $SiO_2$) is predetermined by a percent light shield or phase shift control. The dry etch resistance of resist film must be improved before the film can be reduced in thickness.

It is generally believed that there is a correlation between the carbon density and the dry etch resistance of resist film. For EB writing which is not affected by absorption, resist materials based on novolac resins having better etch resistance have been developed. Indene copolymers described in Patent Document 1 and acenaphthylene copolymers described in Patent Document 2 are expected to have improved etch resistance due to a high carbon density and a robust main chain structure based on cycloolefin structure.

Also, with respect to the soft x-ray (EUV) lithography at wavelength 5-20 nm, the reduced absorption of carbon atoms was reported. Increasing the carbon density is effective not only for improving dry etch resistance, but also for increasing the transmittance in the soft x-ray wavelength region.

As the feature size is reduced, image blurs due to acid diffusion become a problem. To insure resolution for fine patterns with a size of 45 nm et seq., not only an improvement in dissolution contrast is requisite, but control of acid diffusion is also important, as known from previous reports. Since chemically amplified resist compositions are designed such that sensitivity and contrast are enhanced by acid diffusion, an attempt to minimize acid diffusion by reducing the temperature and/or time of post-exposure baking (PEB) fails, resulting in drastic reductions of sensitivity and contrast. Since the distance of acid diffusion is closely related to the type of acid labile group, it would be desirable to have an acid labile group which permits deprotection reaction to proceed at a very short distance of acid diffusion.

A tradeoff among sensitivity, edge roughness and resolution is reported. Increasing sensitivity leads to reductions of edge roughness and resolution. Controlling acid diffusion improves resolution at the sacrifice of edge roughness and sensitivity. Addition of an acid generator capable of generating a bulky acid is effective for suppressing acid diffusion, but leads to reductions of edge roughness and sensitivity as pointed out above. It is then proposed to copolymerize a polymer with an acid generator in the form of an onium salt having polymerizable olefin. Patent Documents 3 to 5 disclose sulfonium salts having polymerizable olefin capable of generating a sulfonic acid and similar iodonium salts. A photoresist using a base polymer having a polymerizable acid generator copolymerized therein exhibits reduced edge roughness due to controlled acid diffusion and uniform dispersion of acid generator within the polymer, succeeding in improving both resolution and edge roughness at the same time.

Patent Documents 6 and 7 disclose resist compositions comprising polymer comprising recurring units having an acid generator and recurring units in which hydroxyl of hydroxystyrene or carboxyl of methacrylate is substituted with an acid labile group. Suitable acid labile groups for hydroxystyrene include acetal, linear tertiary ether, ethylcyclohexyl, and tert-butoxycarbonyl (t-BOC). Of these, the acetal compounds are so sensitive to acid that they undergo deprotection reaction upon EB or EUV exposure in vacuum, resulting in outgassing. The linear ether and t-BOC groups undergo slow deprotection reaction, but still suffer from the outgassing problem because components resulting from deprotection are volatile. It would be desirable to have an acid labile group on hydroxystyrene featuring minimal outgassing.

CITATION LIST

Patent Document 1: JP 3865048
Patent Document 2: JP-A 2006-169302
Patent Document 3: JP-A H04-230645
Patent Document 4: JP-A 2005-084365
Patent Document 5: JP-A 2006-045311
Patent Document 6: JP-A 2009-211050
Patent Document 7: JP-A 2011-175253

DISCLOSURE OF INVENTION

An object of the present invention is to provide a positive resist composition, typically chemically amplified positive resist composition, comprising a specific polymer, which exhibits a high resolution surpassing prior art positive resist compositions, and forms a resist film having minimal outgassing upon exposure, a minimal edge roughness (LER or LWR) and a good pattern profile after exposure, and improved etch resistance; and a pattern forming process using the same. Another object is to provide a polymerizable monomer and a polymer obtained therefrom and suitable as the base resin in the resist composition.

Making investigations to seek for a positive resist composition which exhibits minimal outgassing, a high resolution, a minimal edge roughness (LER or LWR), a good pattern profile, and improved etch resistance, the inventors have found that better results are obtained when a polymer comprising recurring units of styrene having cyclic tertiary ether and recurring units having an acid generator is used as a base resin to formulate a positive resist composition, typically chemically amplified positive resist composition.

Styrene having an acid labile group of cyclic tertiary ether does not cause outgassing because the cyclic olefin resulting from deprotection has a high boiling point. Polymers of styrene having an acid labile group of cyclic tertiary ether have the advantages of high etch resistance, little swell and minimized pattern collapse in alkaline developer, as compared with polymers of methacrylate having an acid labile group of cyclic ester.

From the standpoint of dissolution contrast in alkaline developer, methacrylates having substituted thereon an acid labile group capable of generating carboxylic acid are advantageous. However, the carboxylic acid thus generated can cause swell in the developer, resulting in pattern collapse. On the other hand, an acid labile group capable of generating phenol group has the merit of reduced swell, but is inferior in dissolution contrast to the carboxylic acid generation type. One prior art approach for attaining both an improvement in dissolution contrast and a reduction in swell is to copolymerize recurring units of both acid labile groups, methacrylic acid labile groups and hydroxystyrene acid labile groups as disclosed in Patent Documents 4 and 5.

The inventors have found the following. The above-specified polymer is used as a base resin in a positive resist composition, especially chemically amplified positive resist composition for the purposes of suppressing acid diffusion, improving dissolution contrast, and minimizing swell in alkaline developer to prevent pattern collapse. Since the composition has advantages including a high resolution, a good pattern profile and minimal edge roughness after exposure, and improved etch resistance, it is best suited as a fine pattern-forming material for the fabrication of VLSIs and photomasks.

Since the polymer is designed for optimum deprotection reaction, the positive resist composition comprising the same forms a resist film which has a high dissolution contrast, effective suppression of acid diffusion, a high resolution, exposure latitude, process adaptability, a pattern of good profile after exposure, and improved etch resistance. By virtue of these advantages, the composition is fully useful in commercial application and is best suited as the resist material for the fabrication of VLSIs and mask pattern-forming material.

In one aspect, the invention provides a polymerizable monomer having the general formula (1).

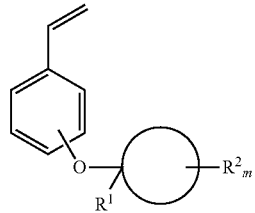

(1)

Herein $R^1$ is methyl, ethyl, propyl, vinyl or ethynyl, the circle designates an optionally bridged $C_3$-$C_{12}$ cycloalkyl group which may contain a double bond, a combination wherein $R^1$ is ethyl and the circle is cyclohexyl being excluded, $R^2$ is hydrogen or a straight, branched or cyclic $C_1$-$C_4$ alkyl group, and m is an integer of 1 to 4.

In a second aspect, the invention provides a polymer comprising recurring units (a) of acid labile group-substituted hydroxystyrene having the general formula (2) and having a weight average molecular weight of 1,000 to 500,000.

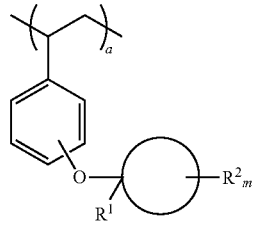

(2)

Herein $R^1$, $R^2$, the circle, and m are as defined above.

The polymer may have further copolymerized therein units selected from sulfonium salt units (b1) to (b3) represented by the general formula (3).

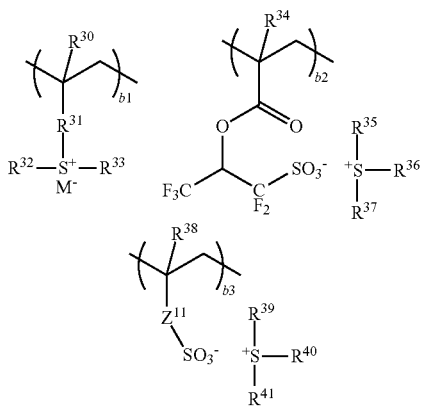

(3)

Herein $R^{30}$, $R^{34}$, and $R^{38}$ each are hydrogen or methyl, $R^{31}$ is a single bond, phenylene, —O—$R^{42}$—, or —C(=O)—$Y^{11}$—$R^{42}$—, $Y^{11}$ is oxygen or NH, $R^{42}$ is a straight, branched or cyclic $C_1$-$C_6$ alkylene group, alkenylene or phenylene group, which may contain a carbonyl, ester, ether or hydroxyl radical, $R^{32}$, $R^{33}$, $R^{35}$, $R^{36}$, $R^{37}$, $R^{39}$, $R^{40}$, and $R^{41}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group, $Z^{11}$ is a single bond, methylene, ethylene, phenylene, fluorophenylene, —O—$R^{43}$—, or —C(=O)—$Z^{12}$—$R^{43}$—, $Z^{12}$ is oxygen or NH, $R^{43}$ is a straight, branched or cyclic $C_1$-$C_6$ alkylene group, alkenylene or phenylene group, which may contain a carbonyl, ester, ether or hydroxyl radical, $M^-$ is a non-nucleophilic counter ion, b1, b2 and b3 are in the range of $0 \leq b1 \leq 0.3$, $0 \leq b2 \leq 0.3$, $0 \leq b3 \leq 0.3$, and $0 < b1+b2+b3 \leq 0.3$.

The polymer may have further copolymerized therein recurring units (c) selected from (meth)acrylic acid and derivatives thereof, styrenecarboxylic acid, and vinylnaphthalenecarboxylic acid, each having an acid labile group substituted thereon, represented by the general formula (4).

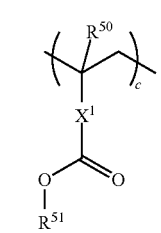

(4)

Herein $R^{50}$ is hydrogen or methyl, $R^{51}$ is an acid labile group, $X^1$ is a single bond, —C(=O)—O—$R^{52}$—, phenylene or naphthylene group, and $R^{52}$ is a straight, branched or cyclic $C_1$-$C_{10}$ alkylene group which may have an ester radical, ether radical or lactone ring.

The polymer may have further copolymerized therein recurring units having a phenolic hydroxyl group, selected from recurring units (d1) to (d9) represented by the general formula (5).

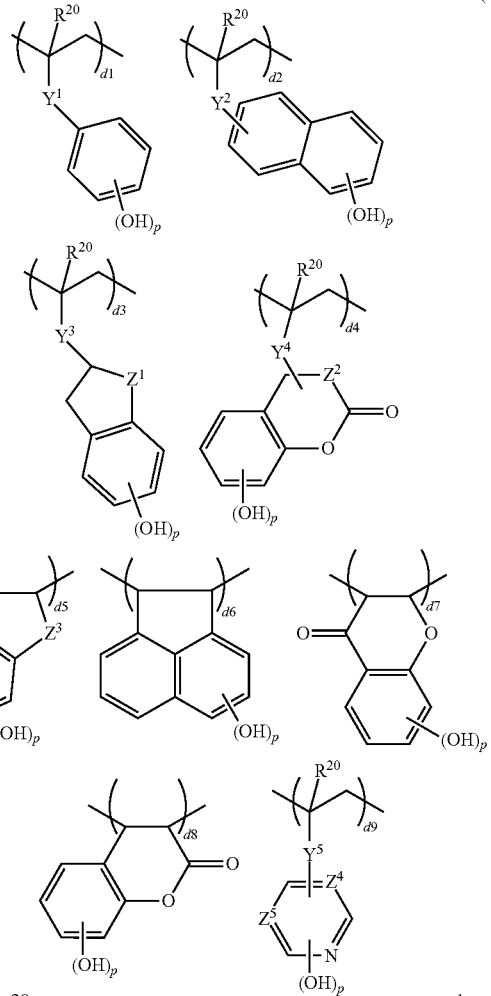

(5)

Herein $R^{20}$ is each independently hydrogen or methyl, $Y^1$, $Y^2$ and $Y^5$ each are a single bond or —C(=O)—O—$R^{21}$—, $Y^3$ and $Y^4$ each are —C(=O)—O—$R^{22}$—, $R^{22}$ and $R^{22}$ each are a single bond or a straight, branched or cyclic $C_1$-$C_{10}$ alkylene group which may contain an ether or ester radical, $Z^1$ and $Z^2$ each are methylene or ethylene, $Z^3$ is methylene, oxygen or sulfur, $Z^4$ and $Z^5$ each are CH or nitrogen, and p is 1 or 2.

The polymer may have further copolymerized therein recurring units (e) having an adhesive group selected from the class consisting of hydroxyl (exclusive of phenolic hydroxyl), lactone ring, ether, ester, carbonyl, cyano, sulfonic acid ester, sulfonamide, cyclic —O—C(=O)—S— and —O—C(=O)—NH—.

In a third aspect, the invention provides a positive resist composition comprising the polymer defined above as a base resin.

Preferably the resist composition may further comprise an organic solvent and an acid generator, the composition being a chemically amplified positive resist composition. The resist composition may further comprise a dissolution regulator, a basic compound, and/or a surfactant as an additive.

In a fourth aspect, the invention provides a pattern forming process comprising the steps of applying the positive resist composition defined above onto a substrate to form a coating, baking, exposing the coating to high-energy radiation, and developing the exposed coating in a developer.

The positive resist composition, typically chemically amplified positive resist composition is used not only in the lithography for forming semiconductor circuits, but also in the formation of mask circuit patterns, micromachines, and thin-film magnetic head circuits.

Advantageous Effects of Invention

The positive resist composition exhibits a remarkably high contrast of alkaline dissolution rate before and after exposure, minimized swell in alkaline developer sufficient to prevent pattern collapse, a high resolution, a good pattern profile and minimal edge roughness (LER or LWR) after exposure, a significant effect of suppressing acid diffusion rate, and improved etch resistance. The composition is thus suited as a fine pattern-forming material for the fabrication of VLSIs or photomasks and a pattern-forming material for EUV lithography.

DESCRIPTION OF EMBODIMENTS

The singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not.

As used herein, the terminology "(meth)acrylic acid" or "(meth)acrylate" refers collectively to acrylic and methacrylic acid or acrylate and methacrylate. The terminology "$C_x$—$C_y$," as applied to a particular unit, such as, for example, a chemical compound or a chemical substituent group, means having a carbon atom content of from "x" carbon atoms to "y" carbon atoms per such unit.

The abbreviations have the following meaning.
EB: electron beam
EUV: extreme ultraviolet
PAG: photoacid generator
PEB: post-exposure bake
LER: line edge roughness
LWR: line width roughness
Mw: weight average molecular weight
Mn: number average molecular weight
Mw/Mn: dispersity or average molecular weight distribution
GPC: gel permeation chromatography Embodiments of the invention include a polymerizable monomer, a polymer or high molecular weight compound obtained therefrom, and a resist composition comprising the polymer as a base resin. Specifically a monomer of hydroxystyrene whose hydrogen is substituted by an acid labile group is represented by the general formula (1). A polymer obtained therefrom has the general formula (2).

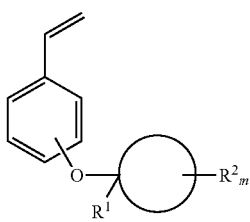
(1)

Herein $R^1$ is methyl, ethyl, propyl, vinyl or ethynyl, the circle designates a cyclic or bridged cyclic $C_3$-$C_{12}$ cycloalkyl group which may contain a double bond, with the proviso that a combination wherein $R^1$ is ethyl and the circle is cyclohexyl is excluded, $R^2$ is hydrogen or a straight, branched or cyclic $C_1$-$C_4$ alkyl group, and m is an integer of 1 to 4.

The acid labile group-substituted hydroxystyrene having formula (1) may be polymerized to form a polymer comprising recurring units (a) of formula (2) and having a weight average molecular weight of 1,000 to 500,000.

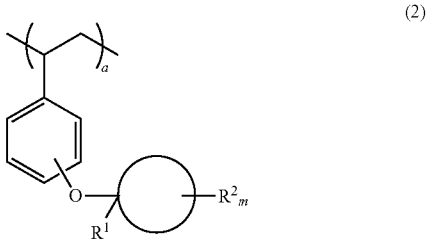
(2)

Herein $R^1$, $R^2$, the circle, and m are as defined above.

Illustrative, non-limiting examples of the monomer having formula (1) are given below.

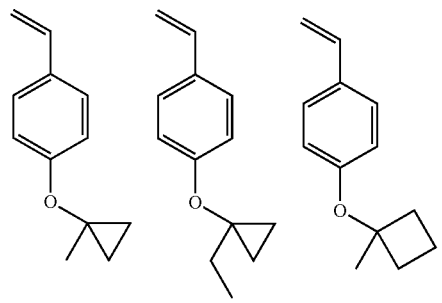

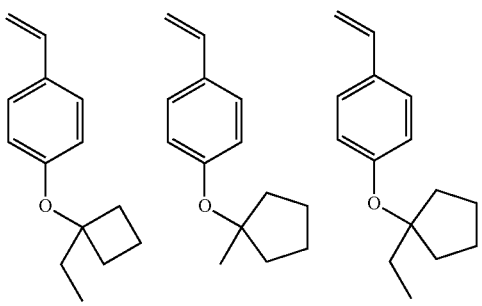

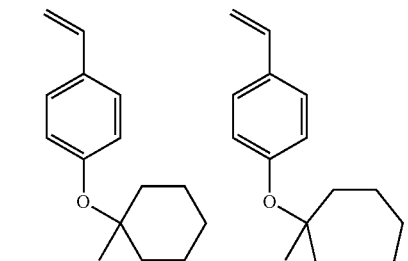

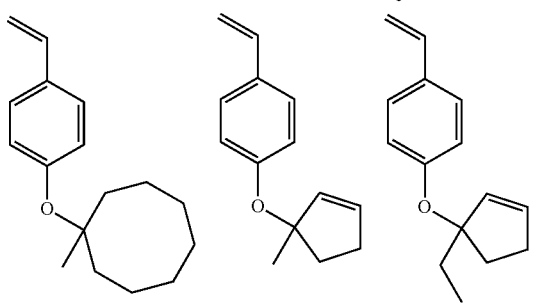

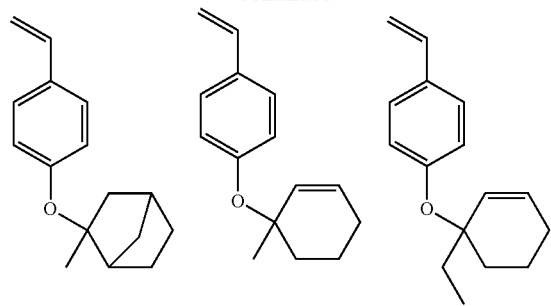
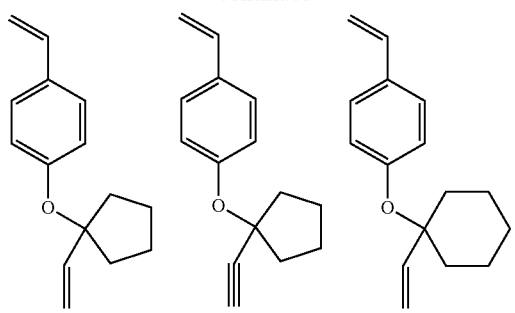
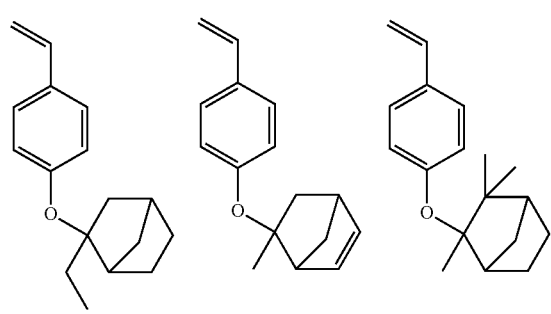
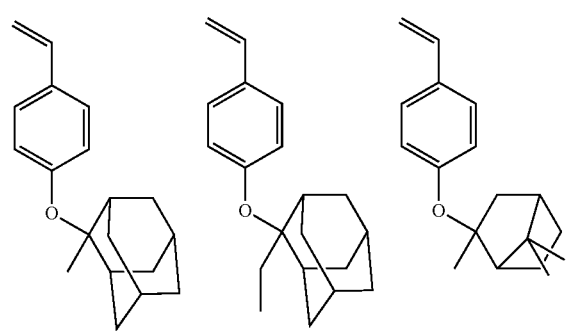
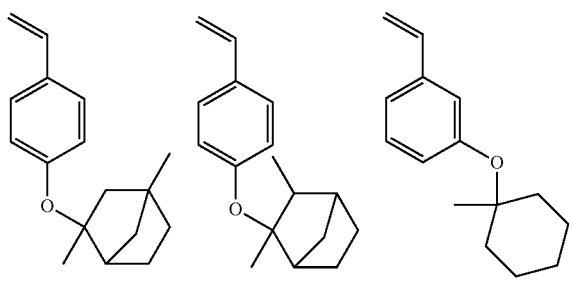

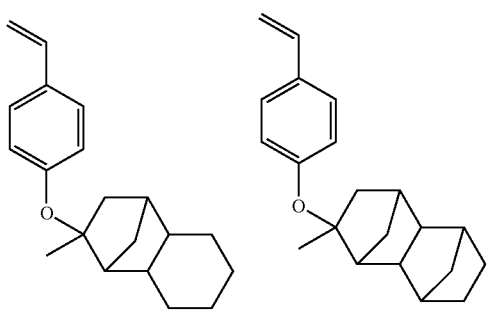
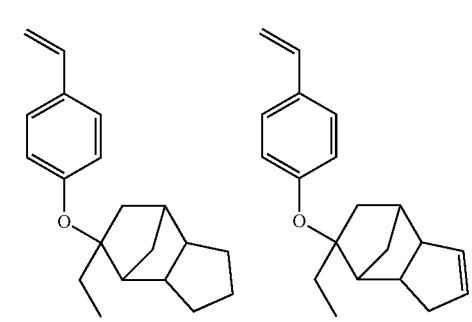
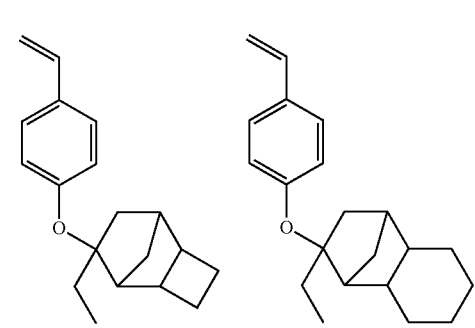
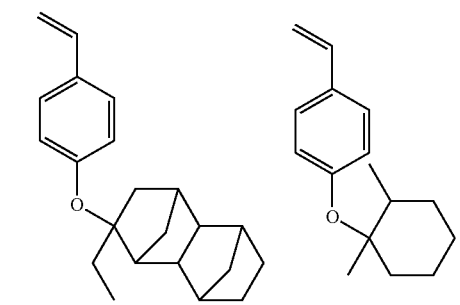
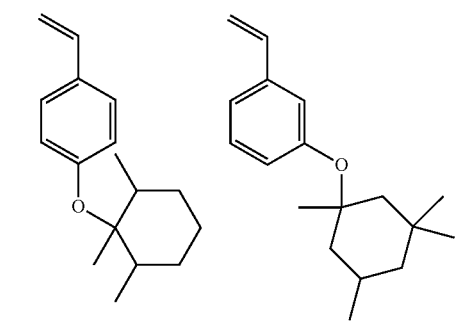
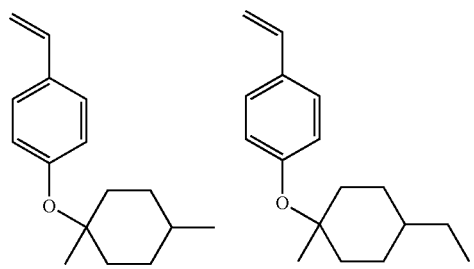
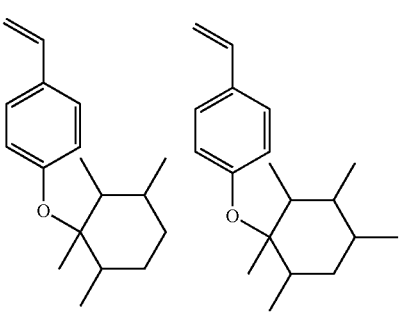
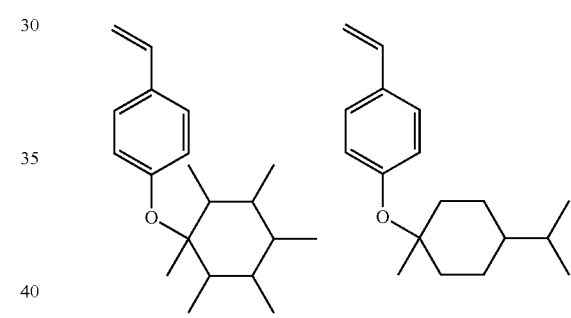
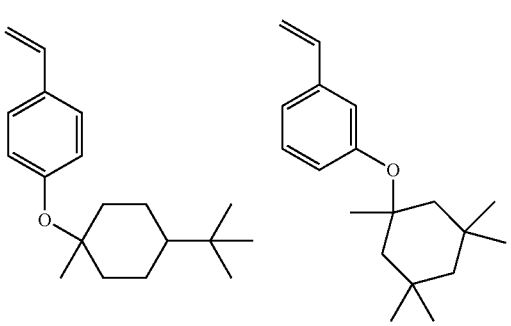
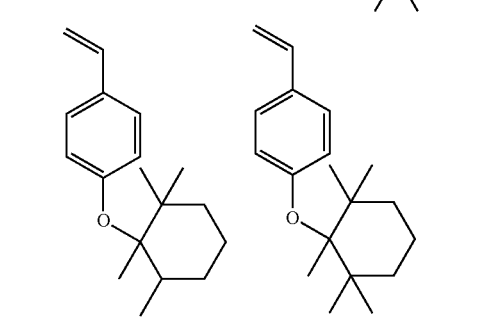

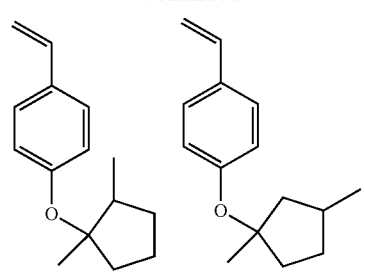
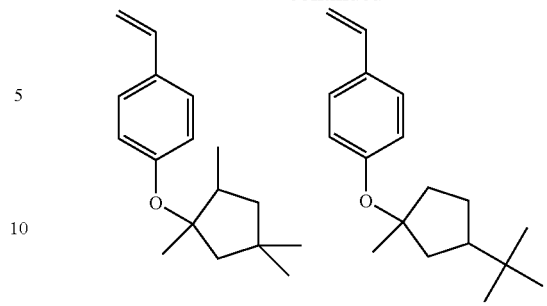
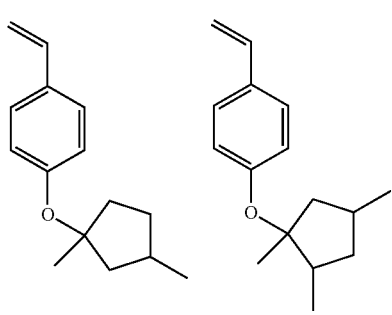
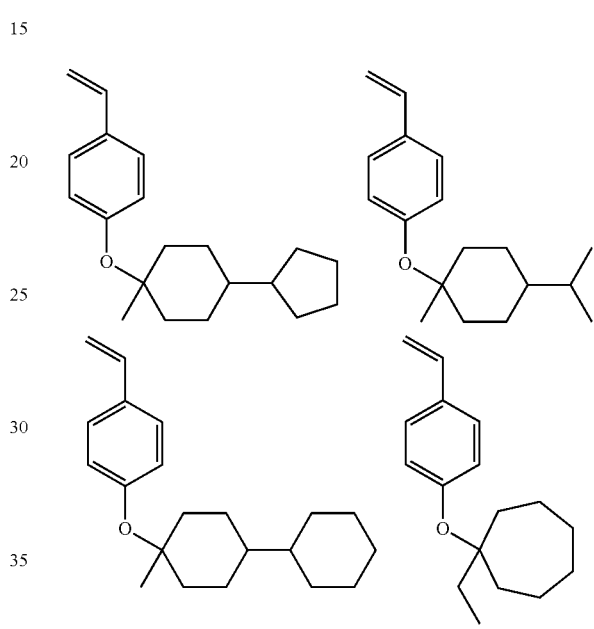
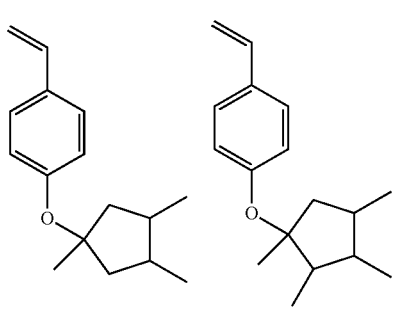
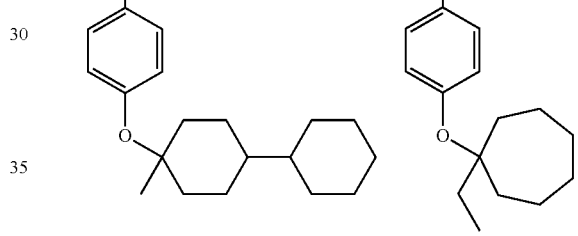
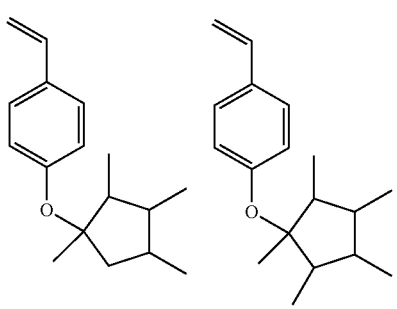
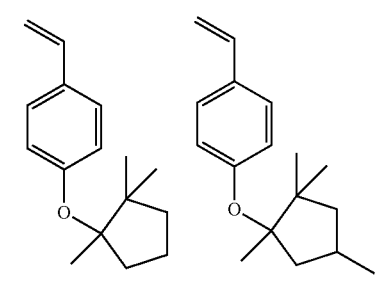
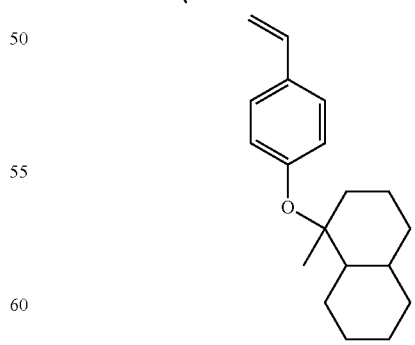
The monomer of formula (1), from which recurring units of formula (2) are derived, may be prepared, for example, via steps i) and ii) or step iii) as shown by the following reaction scheme although the synthesis route is not limited thereto.

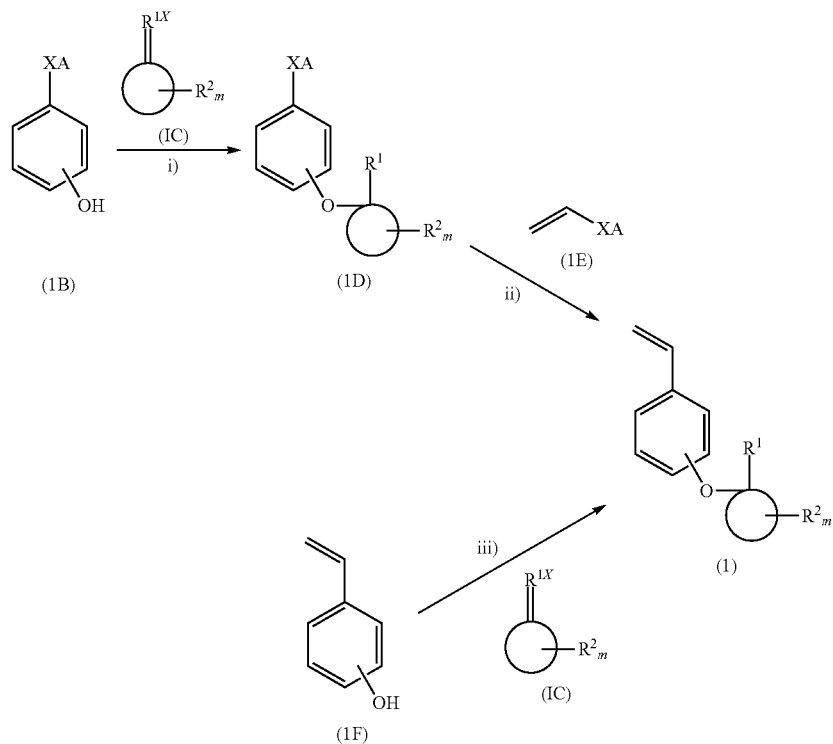

Herein $R^1$, $R^2$, the circle, and m are as defined above, XA is halogen atom, and $R^{1x}$ is as defined for $R^1$, with one hydrogen atom eliminated.

Step i) is to protect a halogenated phenol compound (1B) into an intermediate halogenated aryl compound (1D). The reaction may readily run under well-known conditions. Preferably a halogenated phenol compound (1B) is reacted with an olefin compound (10) in a solventless system or in a solvent (e.g., toluene or hexane) in the presence of an acid catalyst and at a temperature of −30° C. to 50° C. Suitable acid catalysts include mineral acids such as hydrochloric acid, sulfuric acid, nitric acid, and perchloric acid, and organic acids such as methanesulfonic acid, trifluoromethanesulfonic acid, p-toluenesulfonic acid and benzenesulfonic acid.

Step ii) is cross-coupling reaction between halogenated aryl compound (1D) and a vinyl derivative (1E) to form the desired monomer (1). During cross-coupling reaction, an organometallic compound is concomitantly formed from the compound (1D) or (1E), examples of which include organolithium, organomagnesium, organozinc, organocopper, organotitanium, organotin, and organoboron compounds. Upon cross-coupling reaction, transition metal catalysts of palladium, nickel and copper are necessary. Suitable palladium catalysts include zero-valent palladium compounds such as tetrakis(triphenylphosphine)palladium(0) and di(1,2-bis (diphenylphosphino)ethane)palladium(0), and divalent palladium compounds such as palladium acetate, palladium chloride, and [1,1'-bis(diphenylphosphino)-ferrocene]palladium(II) chloride, complexes of these divalent palladium compounds with ligands, and combinations of these divalent palladium compounds with reducing agents.

Suitable nickel catalysts include divalent nickel compounds such as (1,3-bis(diphenylphosphino)propane)-nickel (II) chloride, (1,2-bis(diphenylphosphino)ethane)-nickel(II) chloride, and bis(triphenylphosphine)nickel(II) chloride, and zero-valent nickel compounds such as tetrakis(triphenylphosphine)nickel(0).

Suitable copper catalysts include monovalent copper salts such as copper(I) chloride, copper(I) bromide, copper(I) iodide, and copper(I) cyanide, divalent copper salts such as copper(II) chloride, copper(II) bromide, copper(II) iodide, copper(II) cyanide, and copper(II) acetate, and copper complexes such as dilithium tetracupurate.

Step iii) is to protect a hydroxystyrene derivative (1F) into the desired monomer (1). The reaction may be performed by a method as described for step i).

In addition to the recurring units (a) of acid labile group-substituted hydroxystyrene having formula (2), the polymer may have further copolymerized therein recurring units (b1) to (b3) having a sulfonium salt, represented by the following general formula (3).

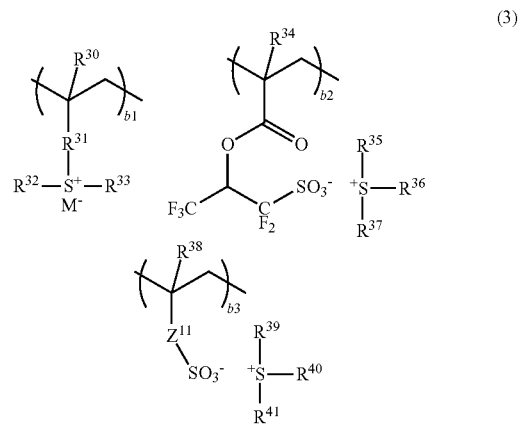

(3)

Herein $R^{30}$, $R^{34}$, and $R^{38}$ each are hydrogen or methyl. $R^{31}$ is a single bond, phenylene, —O—$R^{42}$—, or —C(=O)—

Y$^{11}$—R$^{42}$—, wherein Y$^{11}$ is oxygen or NH, and R$^{42}$ is a straight, branched or cyclic C$_1$-C$_6$ alkylene group, alkenylene or phenylene group, which may contain a carbonyl (—CO—), ester (—COO—), ether (—O—) or hydroxyl radical. R$^{32}$, R$^{33}$, R$^{35}$, R$^{36}$, R$^{37}$, R$^{39}$, R$^{40}$, and R$^{41}$ are each independently a straight, branched or cyclic C$_1$-C$_{12}$ alkyl group which may contain a carbonyl, ester or ether radical, or a C$_6$-C$_{12}$ aryl, C$_7$-C$_{20}$ aralkyl, or thiophenyl group. Z$^{11}$ is a single bond, methylene, ethylene, phenylene, fluorophenylene, —O—R$^{43}$—, or —C(=O)—Z$^{12}$—R$^{43}$—, wherein Z$^{12}$ is oxygen or NH, and R$^{43}$ is a straight, branched or cyclic C$_1$-C$_6$ alkylene group, alkenylene or phenylene group, which may contain a carbonyl, ester, ether or hydroxyl radical. M$^-$ is a non-nucleophilic counter ion. Molar fractions b1, b2 and b3 are in the range of $0 \leq b1 \leq 0.3$, $0 \leq b2 \leq 0.3$, $0 \leq b3 \leq 0.3$, and $0 \leq b1+b2+b3 \leq 0.3$. It is noted that sometimes units (b1), (b2) and (b3) are collectively referred to as units (b), i.e., b=b1+b2+b3.

Examples of the non-nucleophilic counter ion represented by M$^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide and bis(perfluorobutylsulfonyl)imide; methidates such as tris(trifluoromethylsulfonyl)methide and tris(perfluoroethylsulfonyl)methide.

The attachment of an acid generator to the polymer main chain is effective in restraining acid diffusion, thereby preventing a reduction of resolution due to blur by acid diffusion. Also edge roughness (LER or LWR) is improved since the acid generator is uniformly dispersed.

In addition to the recurring units (a) of acid labile group-substituted hydroxystyrene having formula (2) and the acid generator-bearing recurring units (b) having formula (3), the polymer may have further copolymerized therein recurring units (c) of (meth)acrylic acid and derivatives thereof, styrenecarboxylic acid, and vinylnaphthalenecarboxylic acid substituted with an acid labile group, as represented by the general formula (4).

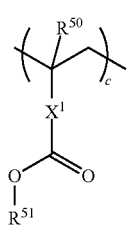

(4)

Herein R$^{50}$ is hydrogen or methyl, R$^{51}$ is an acid labile group, and X$^1$ is a single bond, —C(=O)—O—R$^{52}$—, phenylene or naphthylene group, wherein R$^{52}$ is a straight, branched or cyclic C$_1$-C$_{10}$ alkylene group which may have an ester (—COO—) radical, ether (—O—) radical or lactone ring.

In addition to the recurring units (a), (b) and (c), the polymer may have further copolymerized therein recurring units (d) selected from phenolic hydroxyl-containing units (d1) to (d9) represented by the following general formula (5).

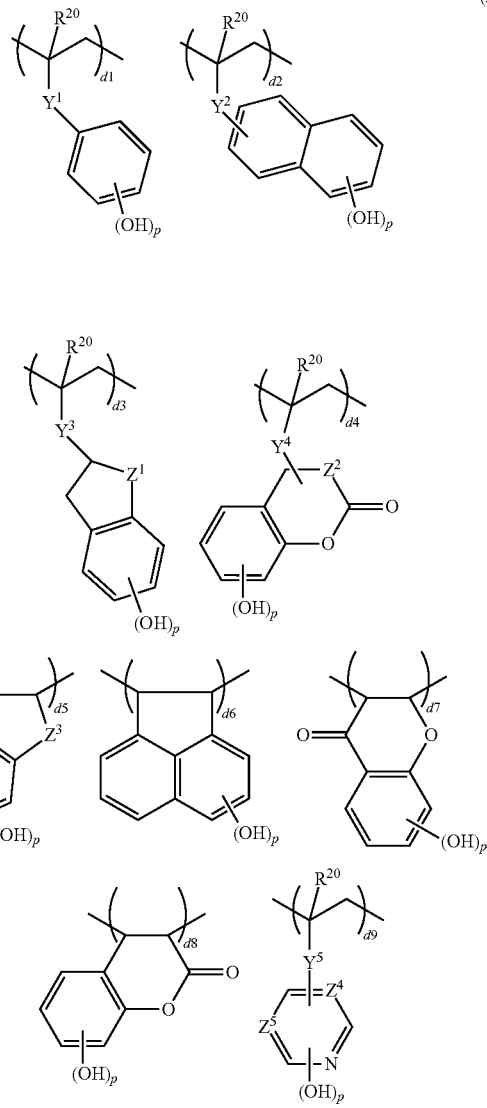

(5)

Herein R$^{20}$ is each independently hydrogen or methyl, Y$^1$, Y$^2$ and Y$^5$ each are a single bond or —C(=O)—O—R$^{21}$—, Y$^3$ and Y$^4$ each are —C(=O)—O—R$^{22}$—, R$^{21}$ and R$^{22}$ each are a single bond or a straight, branched or cyclic C$_1$-C$_{10}$ alkylene group which may contain an ether or ester radical, Z$^1$ and Z$^2$ each are methylene or ethylene, Z$^3$ is methylene, oxygen atom or sulfur atom, Z$^4$ and Z$^5$ each are CH or nitrogen atom, and p is 1 or 2.

Examples of suitable monomers from which the phenolic hydroxyl-containing units (d1) to (d9) are derived are given below.

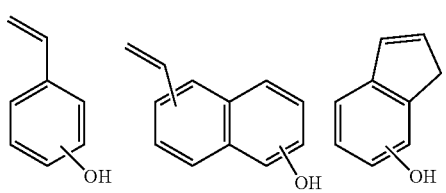

-continued

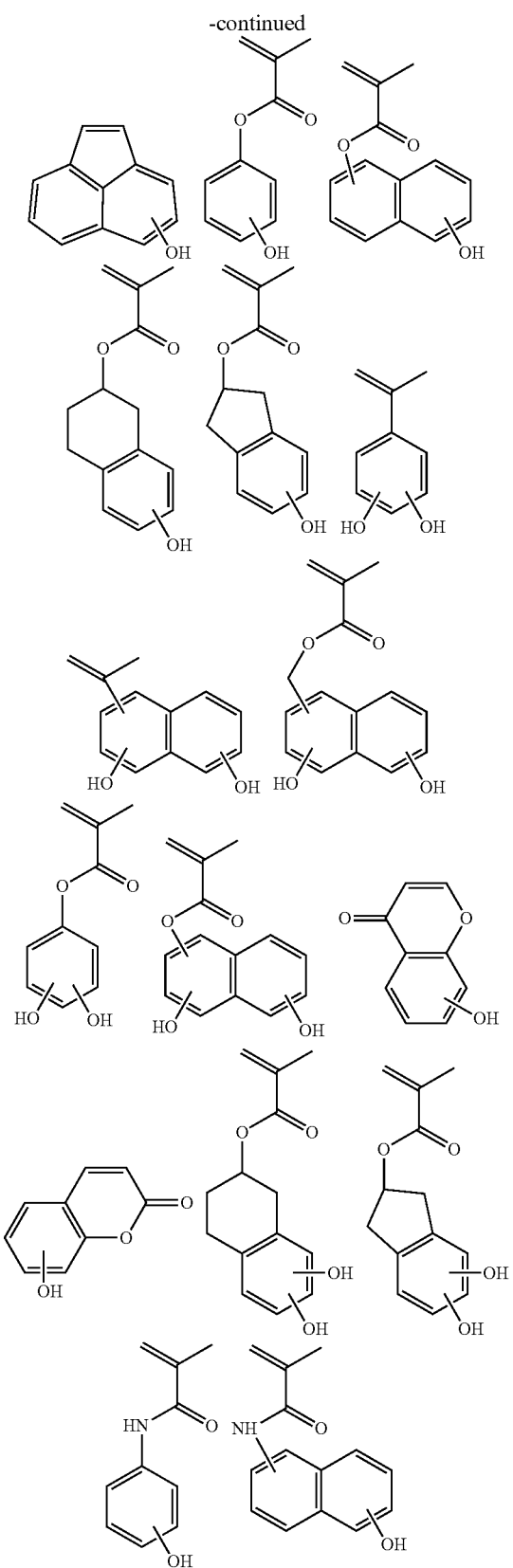

Preferably, the polymer may have further copolymerized therein recurring units (e) having an adhesive group selected from among hydroxyl (exclusive of phenolic hydroxyl), lactone ring, ether, ester, carbonyl, cyano, sulfonic acid ester, sulfonamide groups, cyclic —O—C(=O)—S— and —O—C(=O)—NH— groups.

Examples of suitable monomers from which the recurring units (e) having an adhesive group selected from among non-phenolic hydroxyl group, lactone ring, ether group, ester group, carbonyl group, cyano group, sulfonic acid ester group, sulfonamide group, cyclic —O—C(=O)—S— and —O—C(=O)—NH— group are derived are given below.

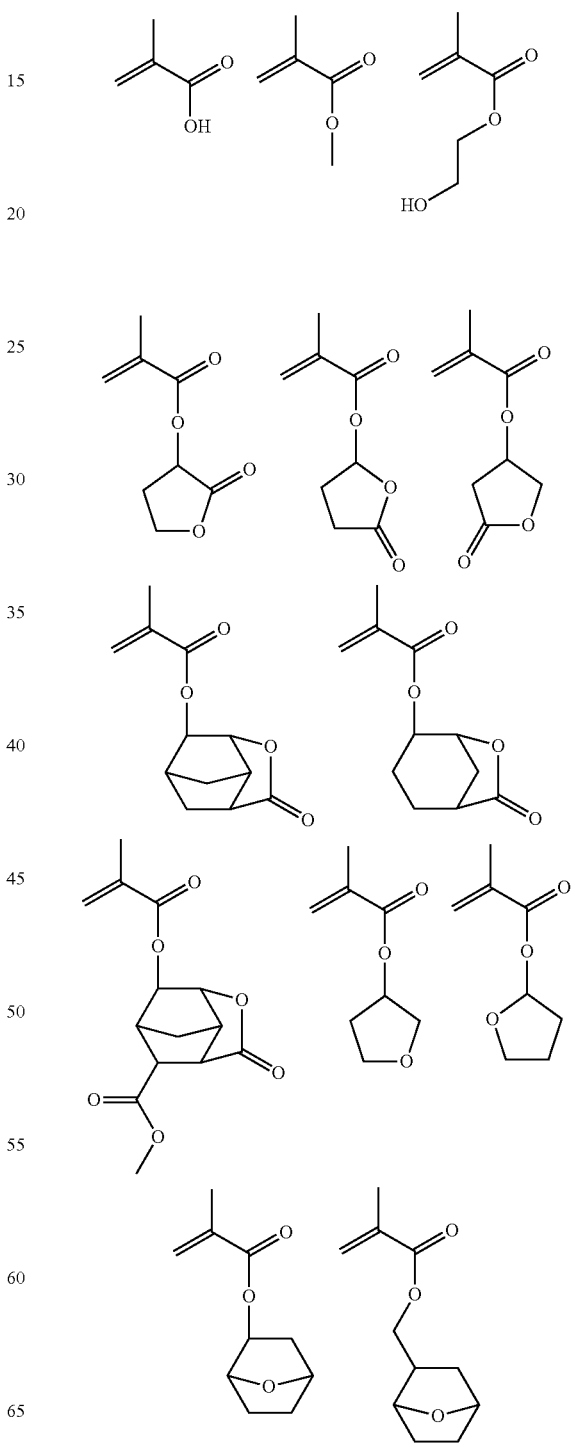

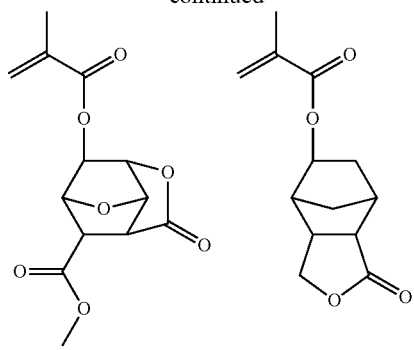
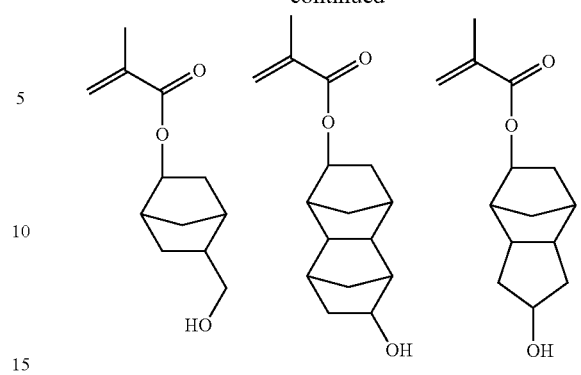
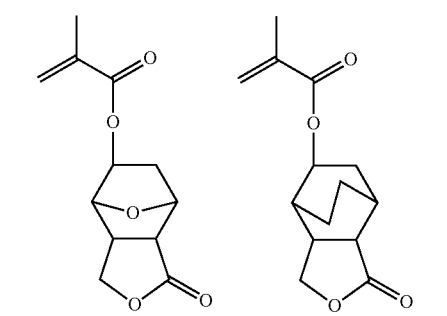
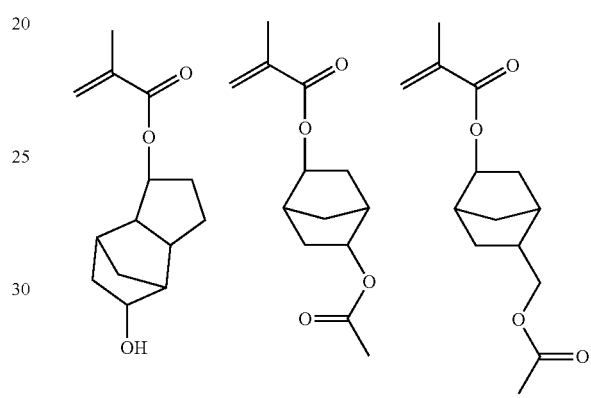
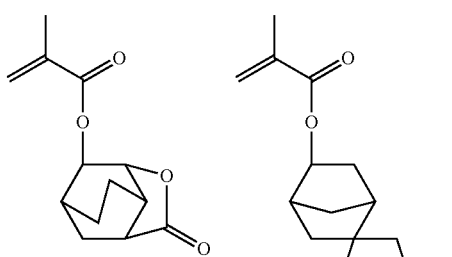
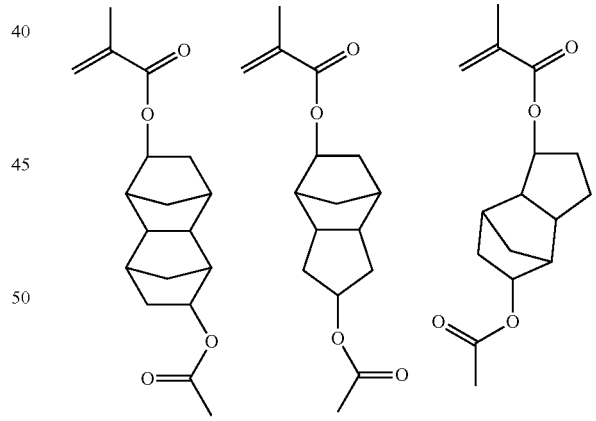
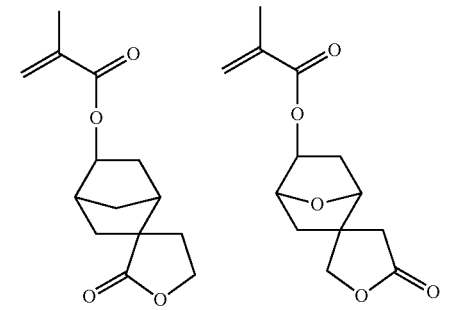
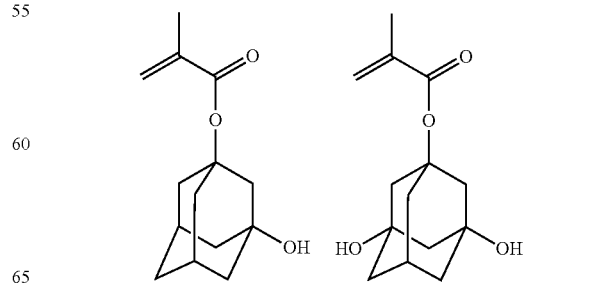

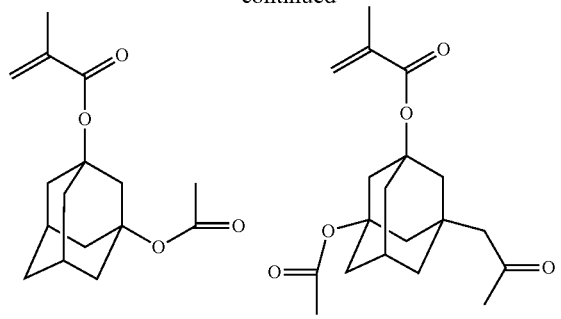
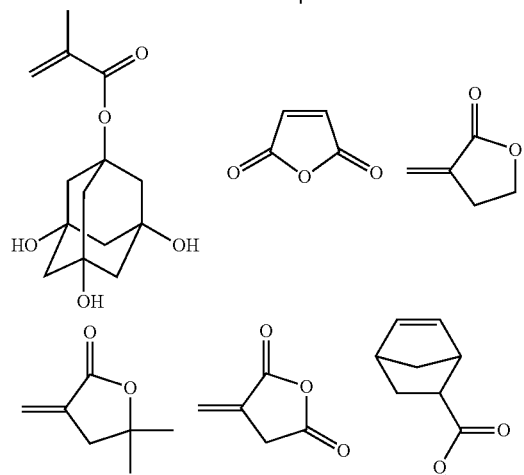
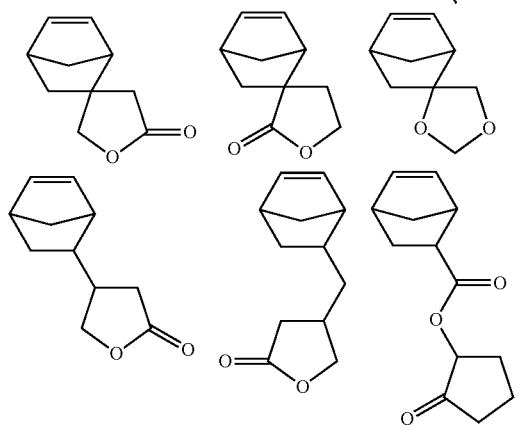
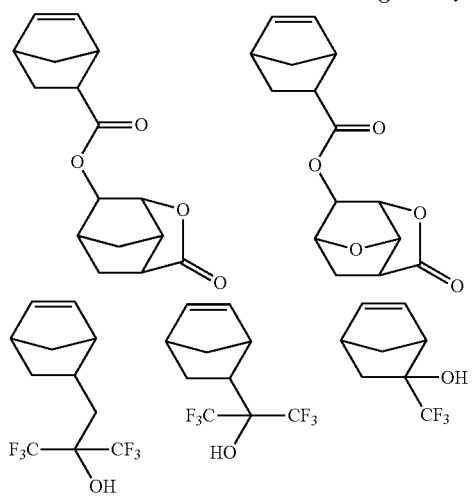
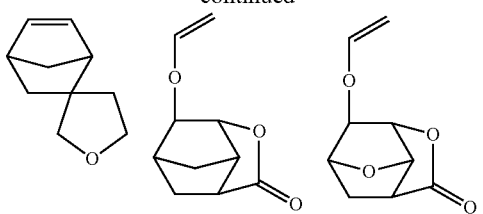
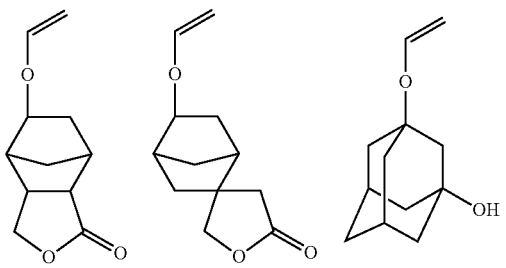
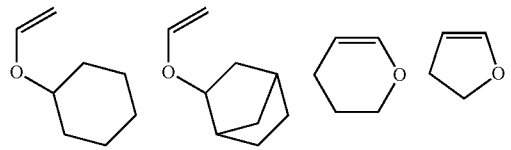
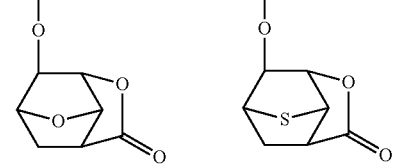
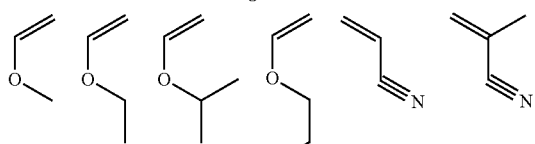
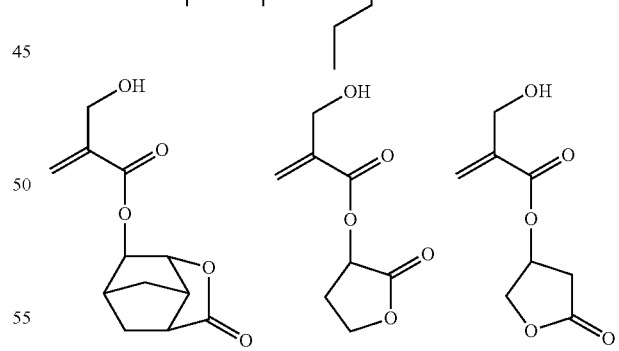
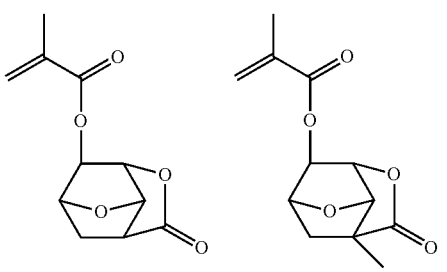

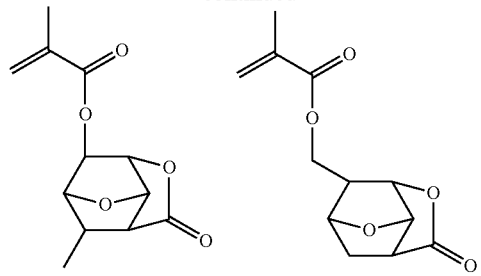
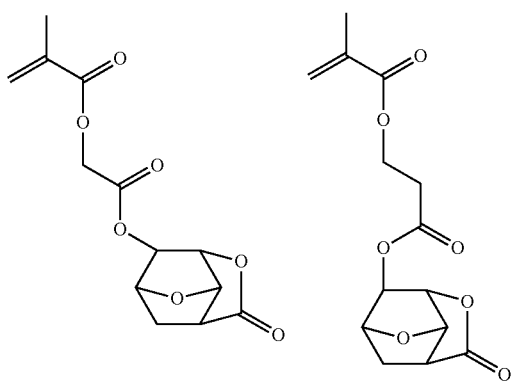
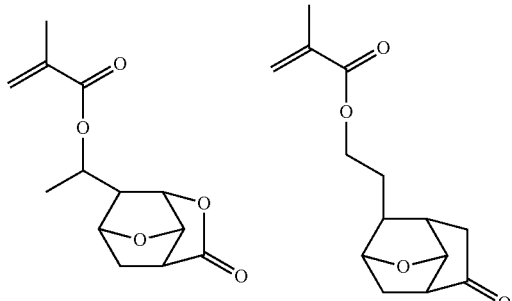
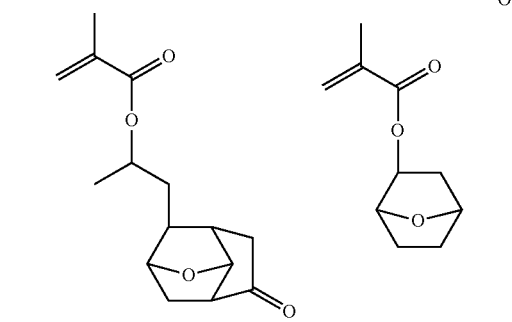
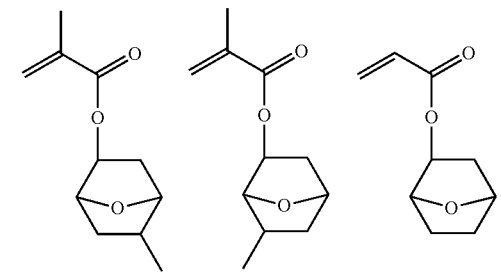
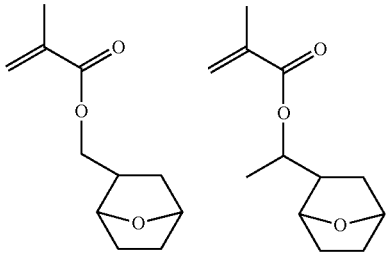
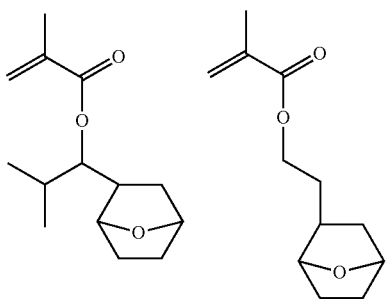
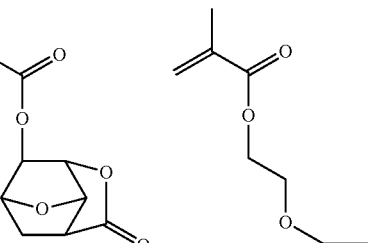
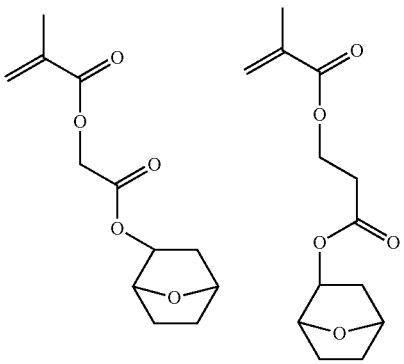
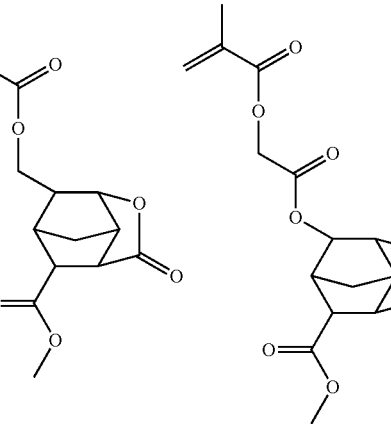

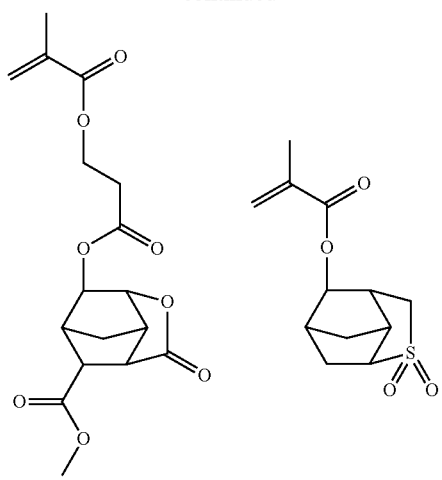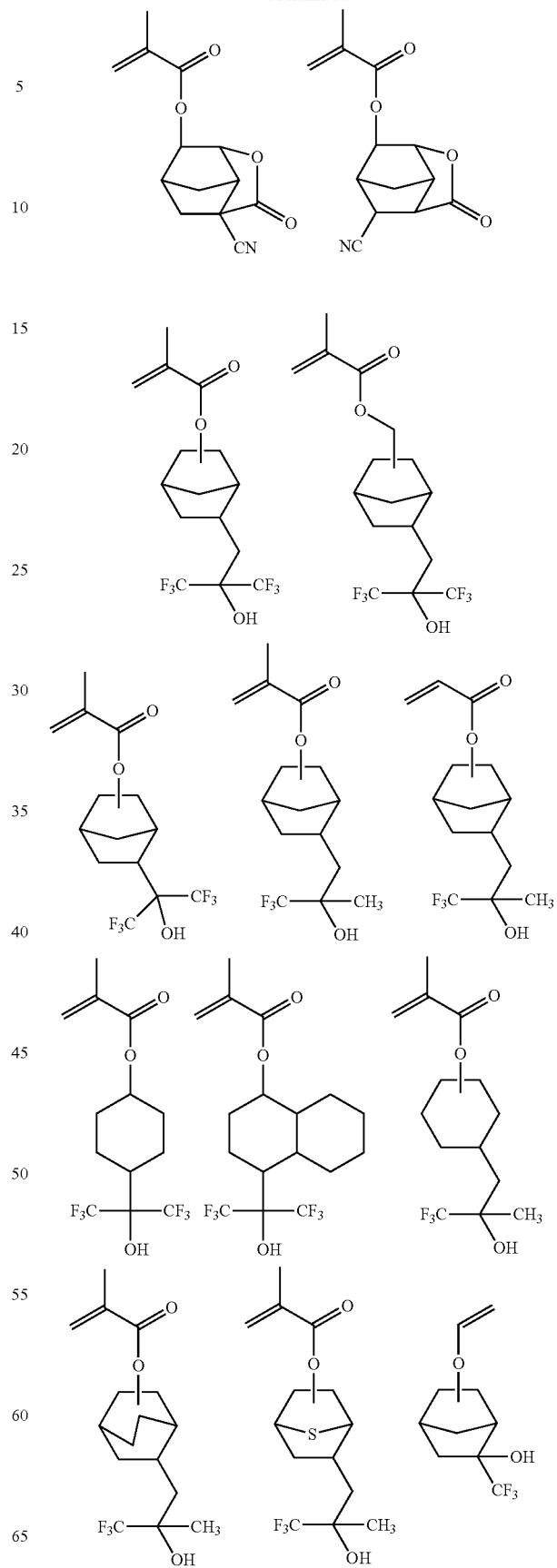

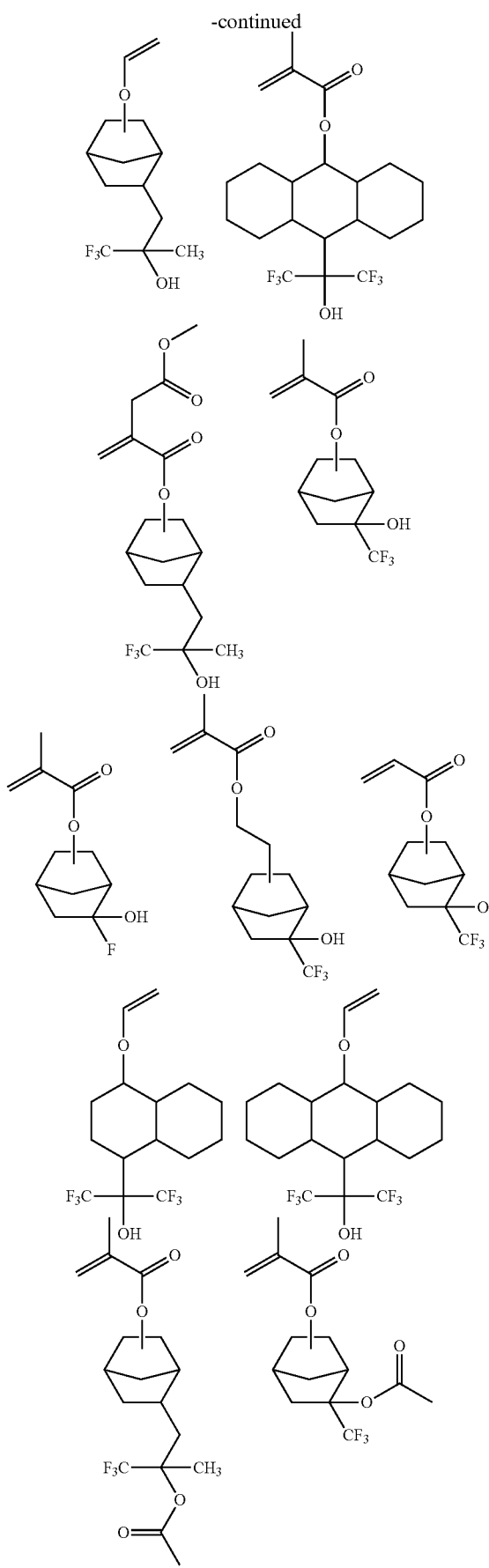
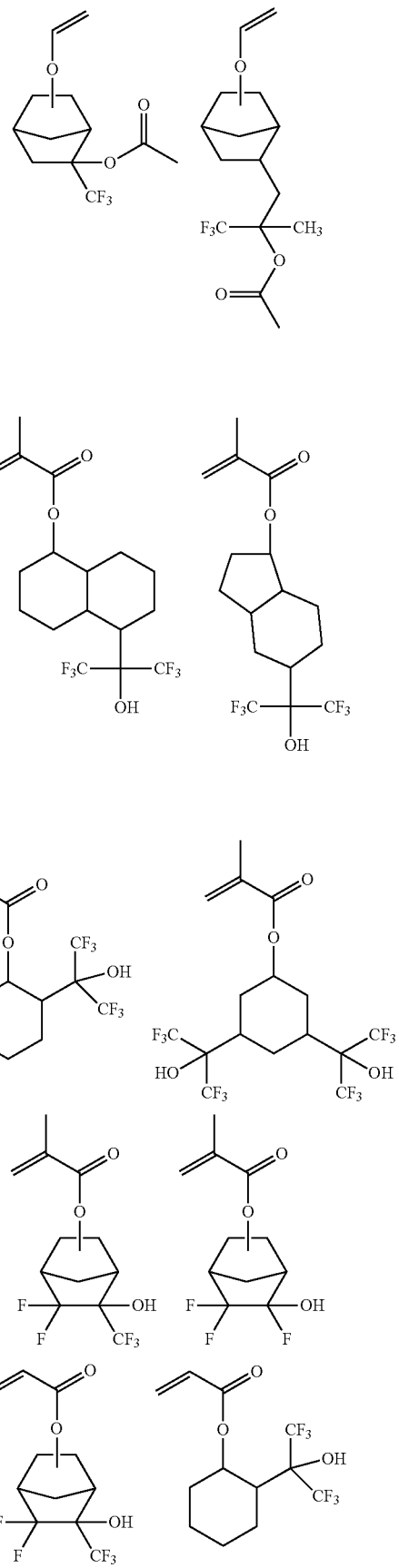

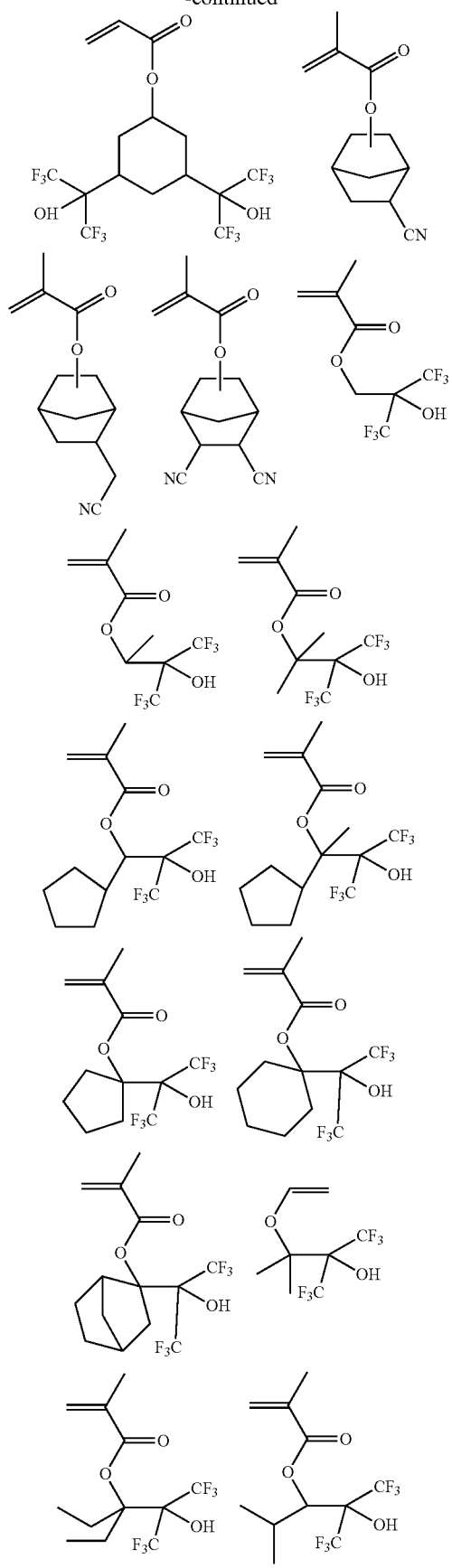
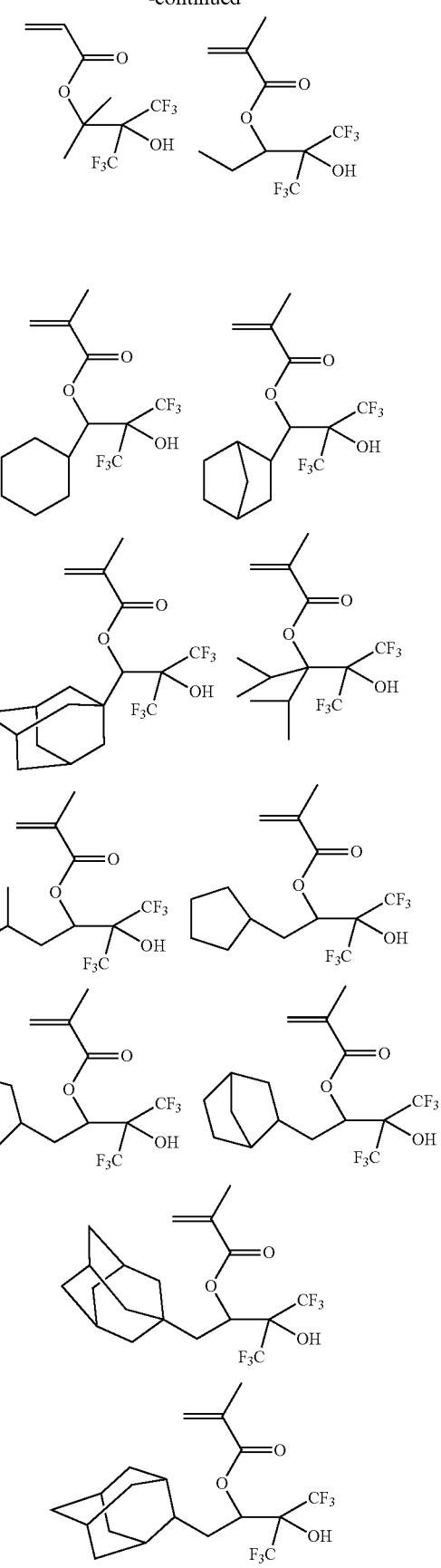

-continued
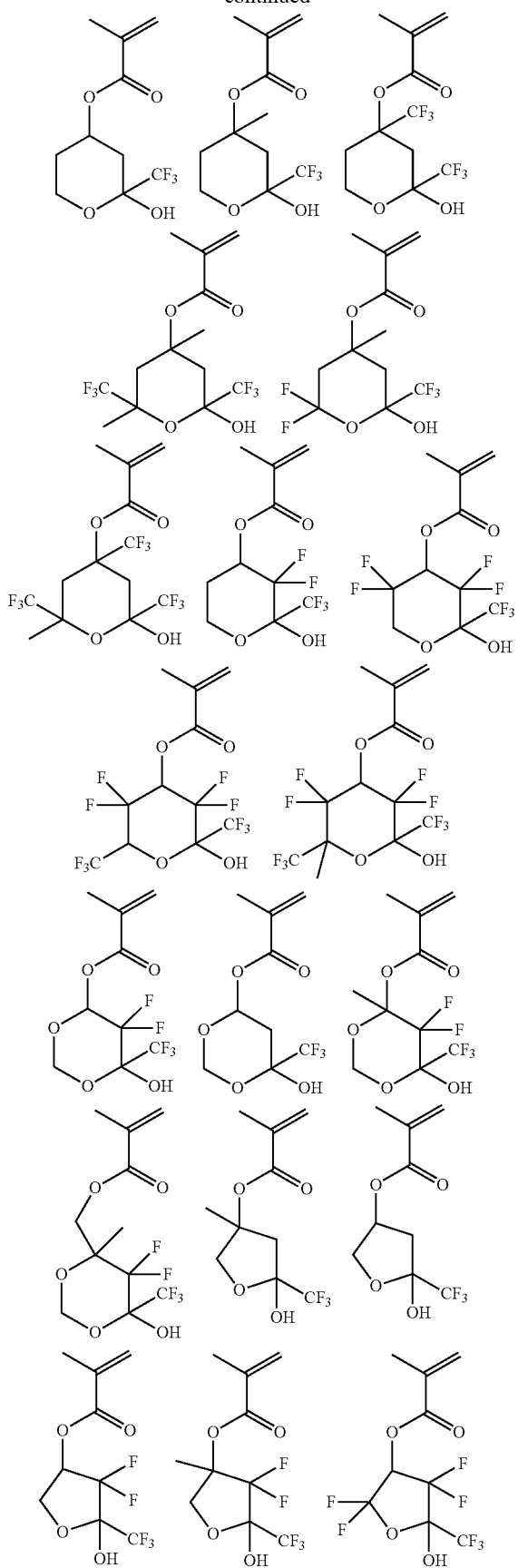
-continued
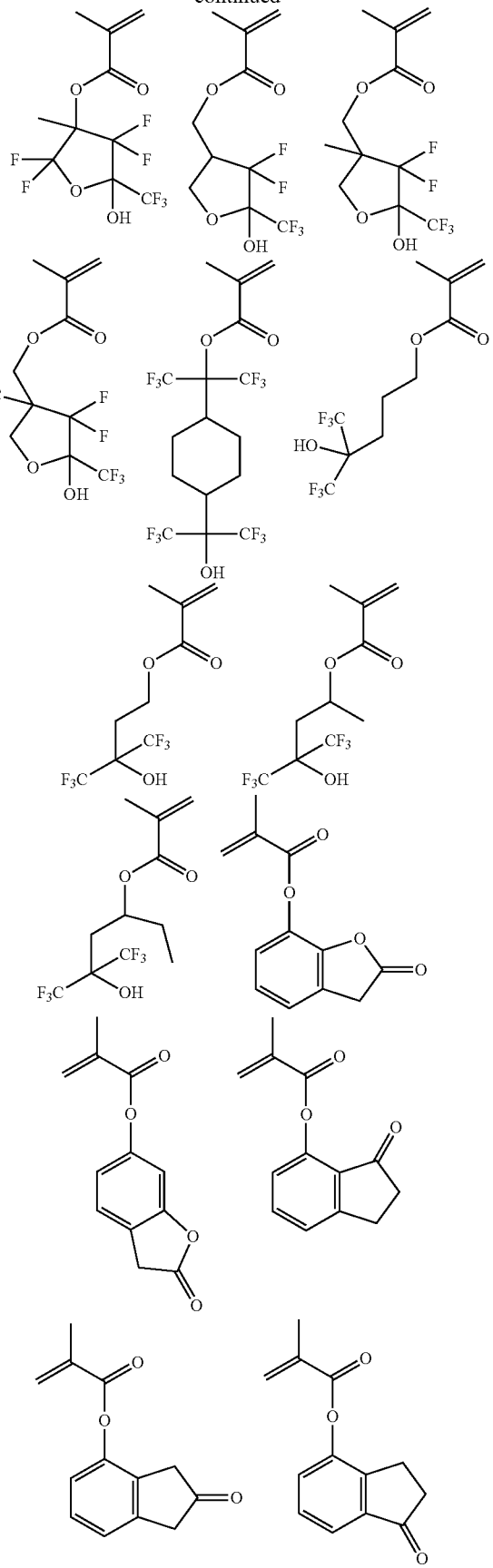

35
-continued
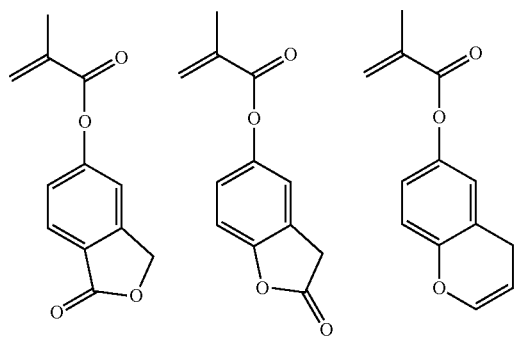
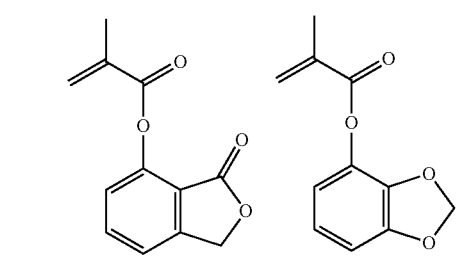
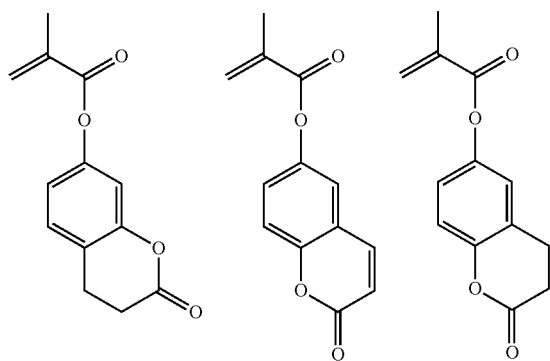
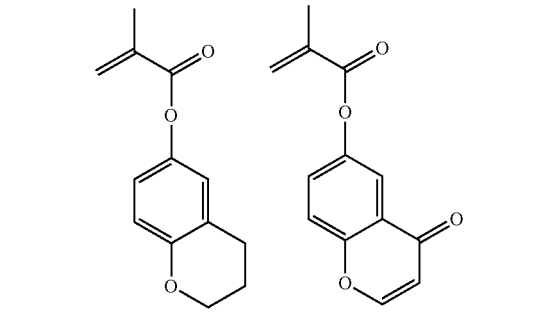
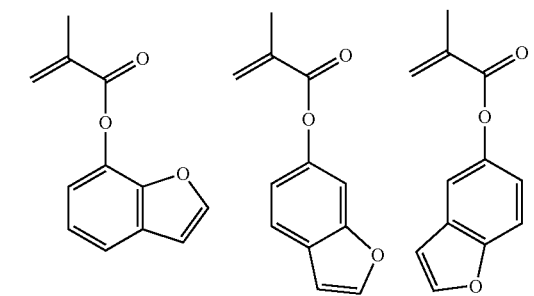
36
-continued
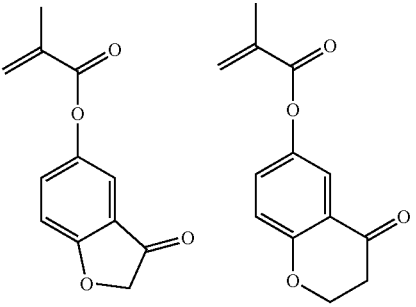
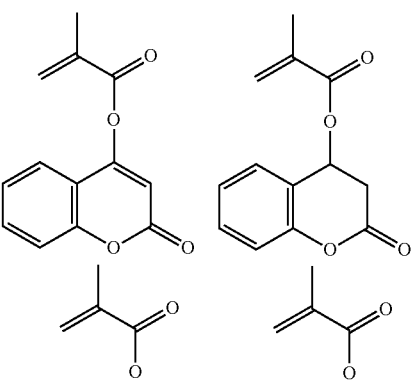
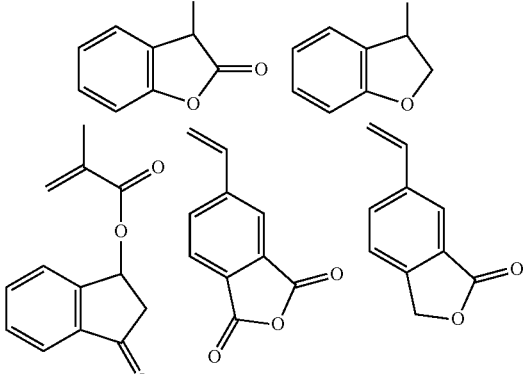
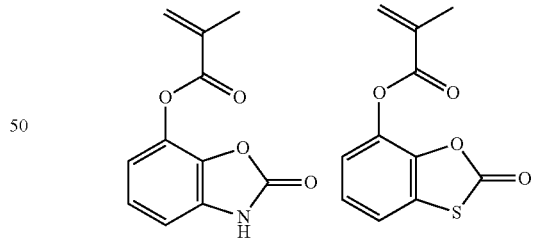
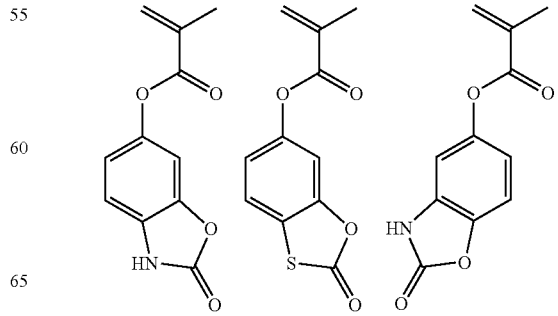

37
-continued
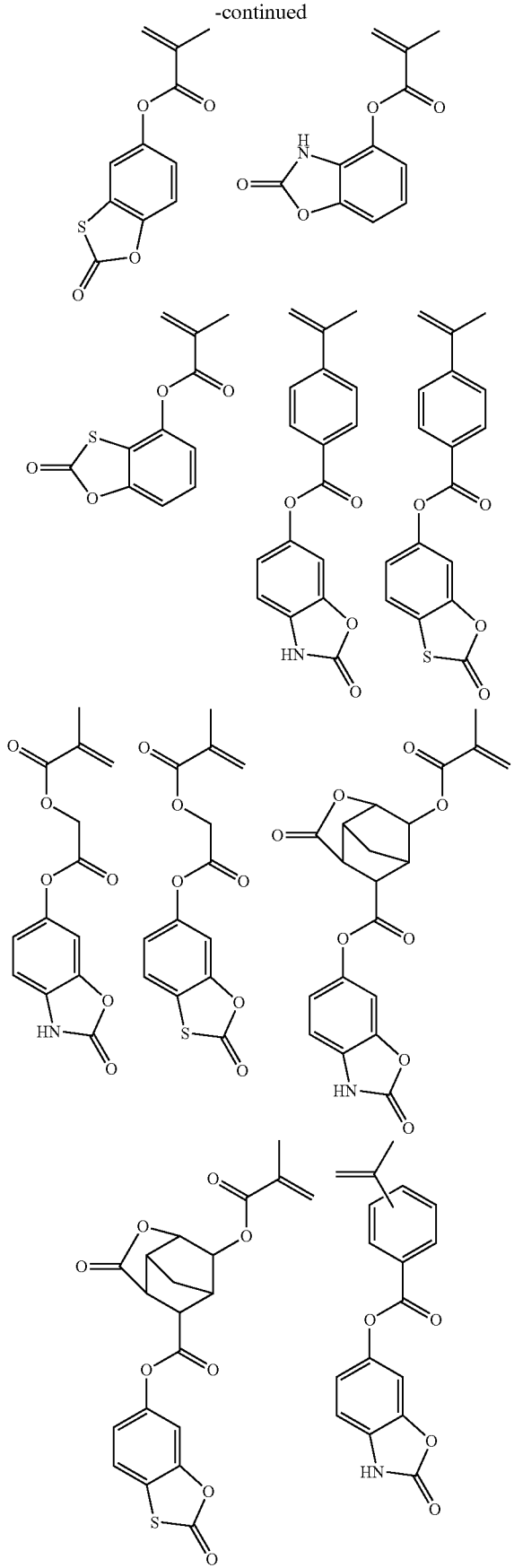
38
-continued
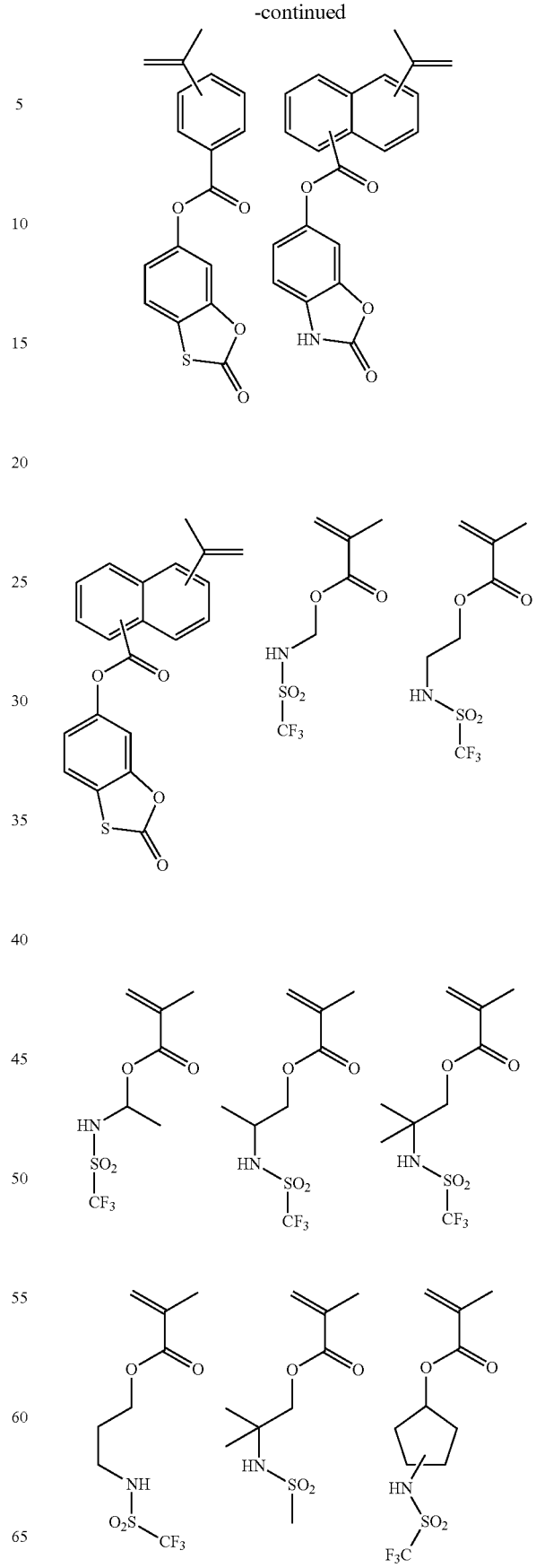

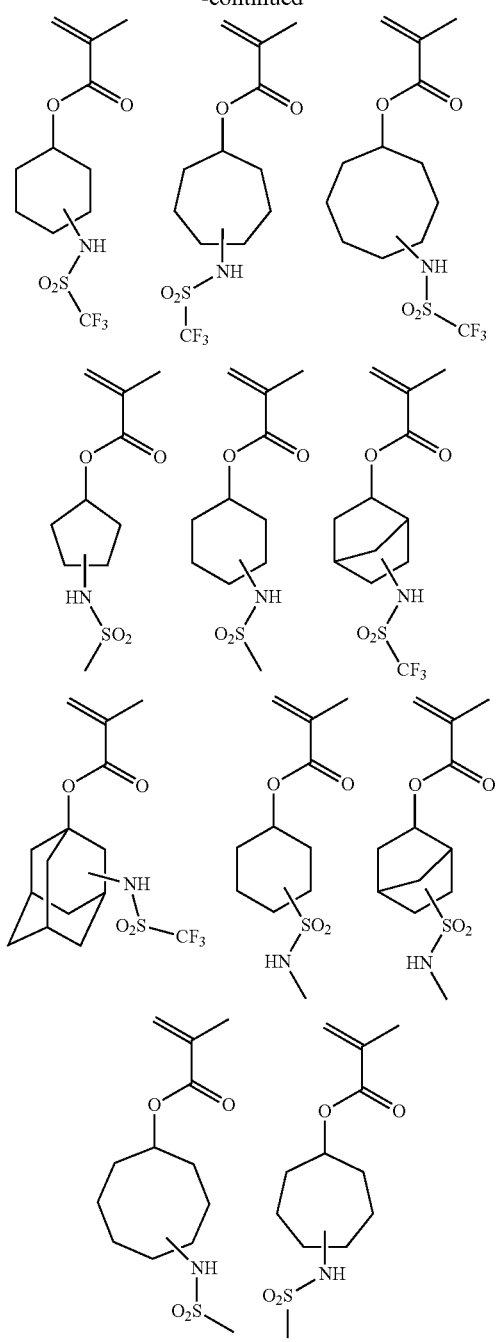

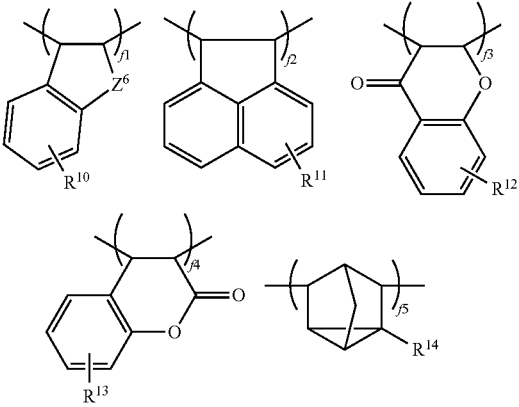

Herein $R^{10}$ to $R^{14}$ are each independently hydrogen, a $C_1$-$C_{30}$ alkyl, haloalkyl, alkoxy, alkanoyl or alkoxycarbonyl group, $C_6$-$C_{10}$ aryl group, halogen, or 1,1,1,3,3,3-hexafluoro-2-propanol group, and $Z^6$ is methylene, oxygen or sulfur. As used herein, the term "haloalkyl" refers to alkyl in which some or all hydrogen atoms are substituted by halogen.

Examples of suitable monomers from which recurring units (f1) to (f5) of indene, acenaphthylene, chromone, coumarin, and norbornadiene derivatives are derived are given below.

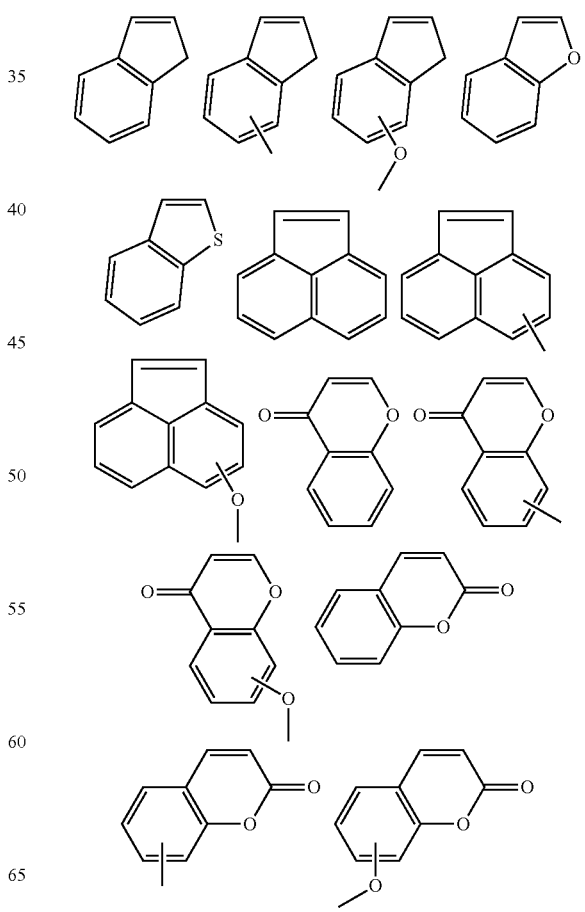

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxy group may be replaced by an acetyl, formyl, pivaloyl or similar group prior to polymerization, and the polymerization be followed by alkaline hydrolysis.

In a more preferred embodiment, the polymer has further copolymerized therein recurring units (f) selected from units (f1) to (f5) of indene, acenaphthylene, chromone, coumarin, and norbornadiene, or derivatives thereof, represented by the following formula (6).

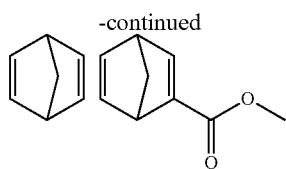

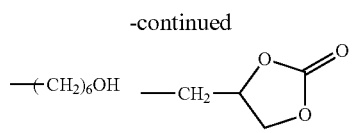

Besides the recurring units (a) to (f), additional recurring units (g) may be copolymerized in the polymer, which include recurring units derived from styrene, vinylnaphthalene, vinylanthracene, vinylpyrene, methyleneindane, and the like.

The acid labile group represented by $R^{51}$ in formula (4) may be selected from a variety of such groups. The acid labile groups may be the same or different and preferably include groups of the following formulae (A-1) to (A-3).

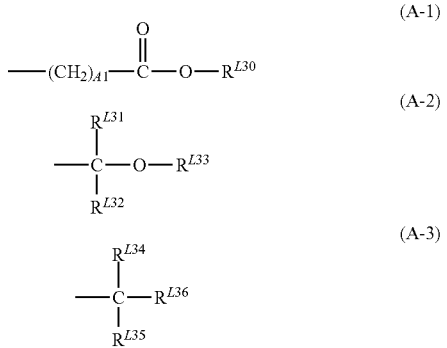

In formula (A-1), $R^{L30}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter A1 is an integer of 0 to 6.

In formula (A-2), $R^{L31}$ and $R^{L32}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{L33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the substituted alkyl groups are shown below.

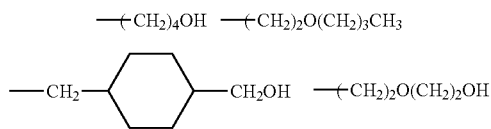

A pair of $R^{L31}$ and $R^{L32}$, $R^{L31}$ and $R^{L33}$, or $R^{L32}$ and $R^{L33}$ may bond together to form a ring with the carbon and oxygen atoms to which they are attached. Each of $R^{L31}$, $R^{L32}$ and $R^{L33}$ is a straight or branched alkylene group of 1 to 18 carbon atoms, preferably 1 to 10 carbon atoms when they form a ring, while the ring preferably has 3 to 10 carbon atoms, more preferably 4 to 10 carbon atoms.

Examples of the acid labile groups of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups having the formulae (A-1)-1 to (A-1)-10.

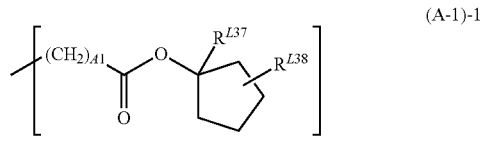

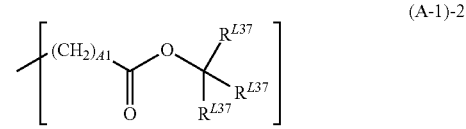

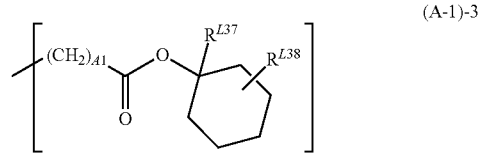

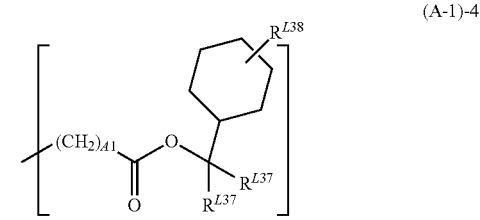

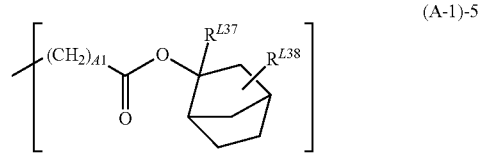

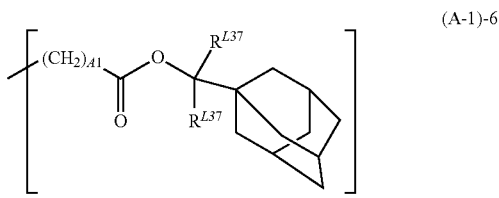

(A-1)-7
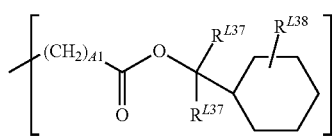

(A-1)-8
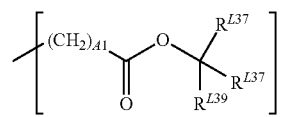

(A-1)-9
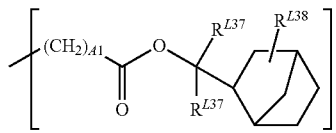

(A-1)-10
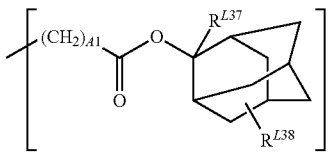

Herein $R^{L37}$ is each independently a straight, branched or cyclic $C_1$-$C_{10}$ alkyl group or $C_6$-$C_{20}$ aryl group. $R^{L38}$ is hydrogen or a straight, branched or cyclic $C_1$-$C_{10}$ alkyl group. $R^{L39}$ is each independently a straight, branched or cyclic $C_2$-$C_{10}$ alkyl group or $C_6$-$C_{20}$ aryl group. A1 is an integer of 0 to 6.

Of the acid labile groups of formula (A-2), the straight and branched ones are exemplified by the following groups having formulae (A-2)-1 to (A-2)-35.

(A-2)-1
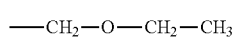

(A-2)-2

(A-2)-3

(A-2)-4

(A-2)-5
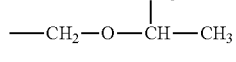

(A-2)-6
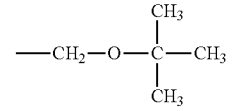

(A-2)-7
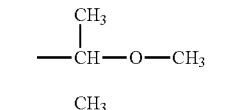

(A-2)-8
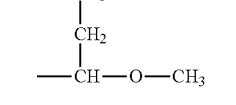

(A-2)-9
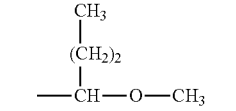

(A-2)-10
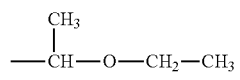

(A-2)-11
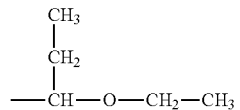

(A-2)-12
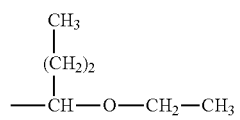

(A-2)-13
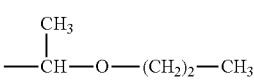

(A-2)-14
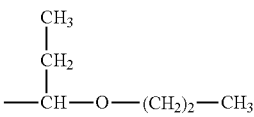

(A-2)-15
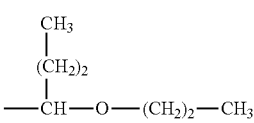

(A-2)-16
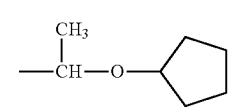

(A-2)-17
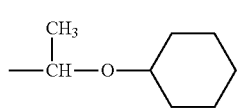

(A-2)-18
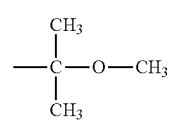

(A-2)-19
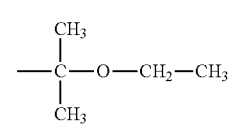

(A-2)-20
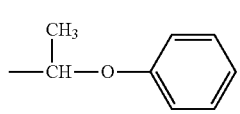

(A-2)-21
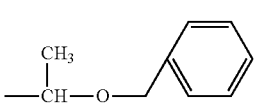

(A-2)-22

(A-2)-23

(A-2)-24 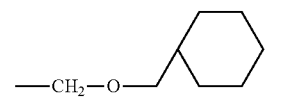

(A-2)-25 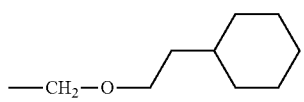

(A-2)-26 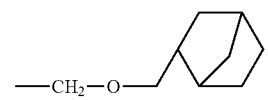

(A-2)-27 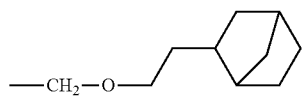

(A-2)-28 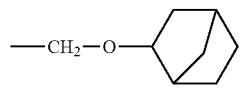

(A-2)-29 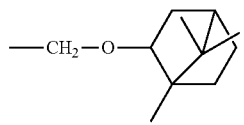

(A-2)-30 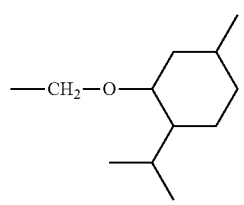

(A-2)-31 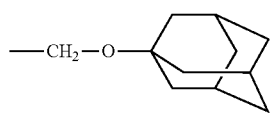

(A-2)-32 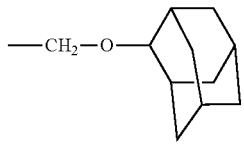

(A-2)-33 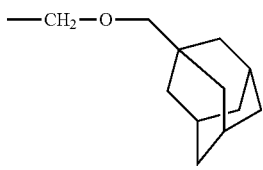

(A-2)-34 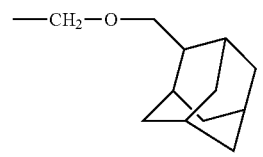

(A-2)-35 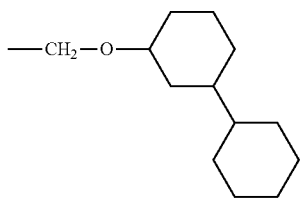

Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.

Other examples of acid labile groups include those of the following formula (A-2a) or (A-2b) while the polymer may be crosslinked within the molecule or between molecules with these acid labile groups.

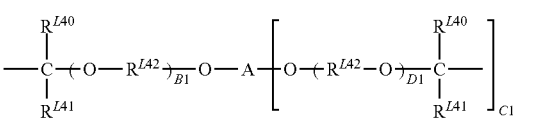
(A-2a)

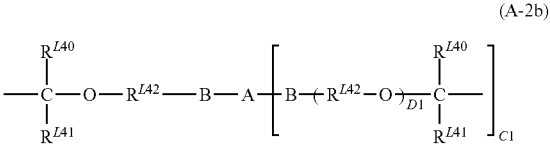
(A-2b)

Herein $R^{L40}$ and $R^{L41}$ each are hydrogen or a straight, branched or cyclic $C_1$-$C_8$ alkyl group, or $R^{L40}$ and $R^{L41}$, taken together, may form a ring with the carbon atom to which they are attached, and $R^{L40}$ and $R^{L41}$ are straight or branched $C_1$-$C_8$ alkylene groups when they form a ring. $R^{L42}$ is a straight, branched or cyclic $C_1$-$C_{10}$ alkylene group. Each of B1 and D1 is 0 or an integer of 1 to 10, preferably 0 or an integer of 1 to 5, and C1 is an integer of 1 to 7. "A" is a (C1+1)-valent aliphatic or alicyclic saturated hydrocarbon group, aromatic hydrocarbon group or heterocyclic group having 1 to 50 carbon atoms, which may be separated by a heteroatom or in which some hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkyltriyl and alkyltetrayl groups, and $C_6$-$C_{30}$ arylene groups, which may contain a heteroatom or in which some hydrogen atoms attached to carbon atoms may be substituted by hydroxyl, carboxyl, acyl groups or halogen atoms. The subscript C1 is preferably an integer of 1 to 3.

The crosslinking acetal groups of formulae (A-2a) and (A-2b) are exemplified by the following formulae (A-2)-36 through (A-2)-43.

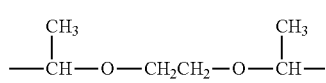
(A-2)-36

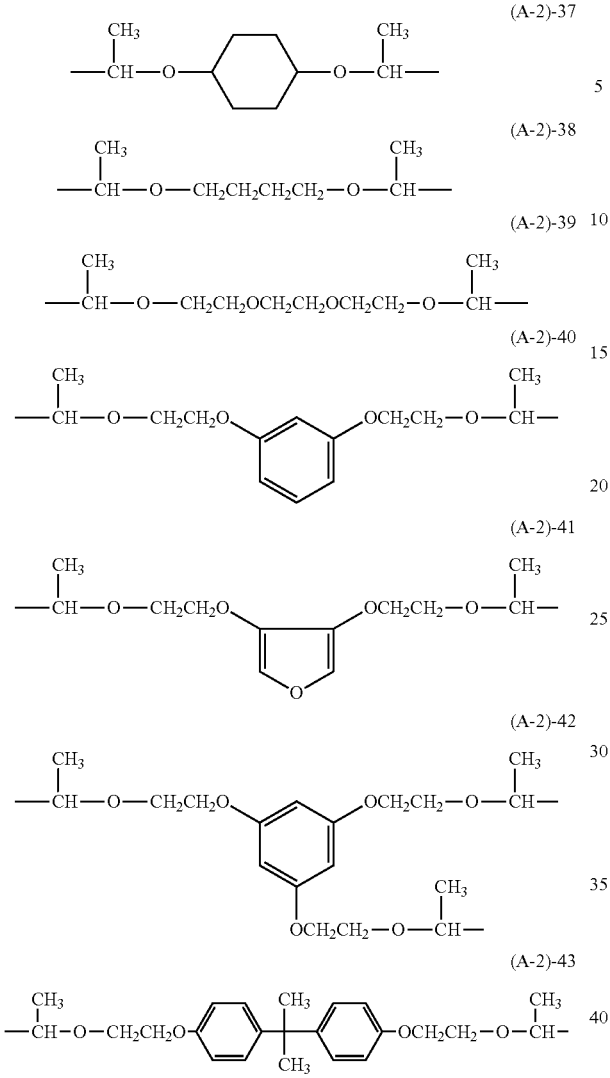

In formula (A-3), $R^{L34}$, $R^{L35}$ and $R^{L36}$ each are a monovalent hydrocarbon group, typically a straight, branched or cyclic $C_1$-$C_{20}$ alkyl group, which may contain a heteroatom such as oxygen, sulfur, nitrogen or fluorine. A pair of $R^{L34}$ and $R^{L35}$, $R^{L34}$ and $R^{L36}$, or $R^{L35}$ and $R^{L36}$ may bond together to form a $C_3$-$C_{20}$ ring with the carbon atom to which they are attached.

Exemplary tertiary alkyl groups of formula (A-3) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other exemplary tertiary alkyl groups include those of the following formulae (A-3)-1 to (A-3)-18.

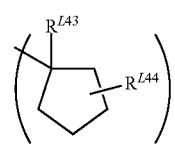

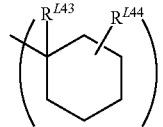

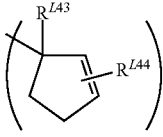

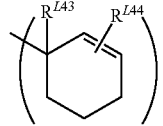

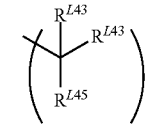

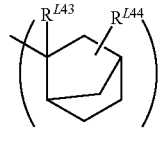

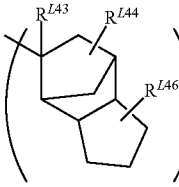

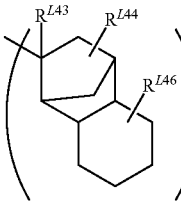

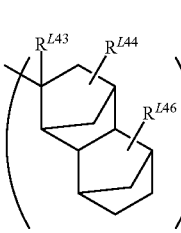

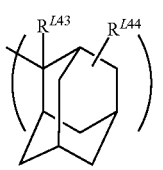

-continued (A-3)-11 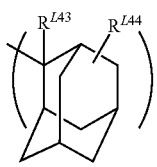

(A-3)-12 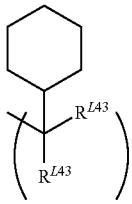

(A-3)-13 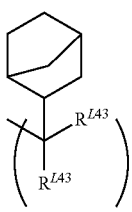

(A-3)-14 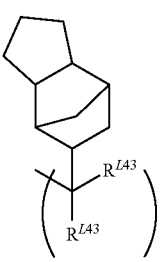

(A-3)-15 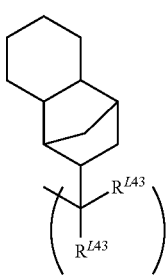

(A-3)-16 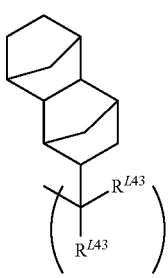

(A-3)-17 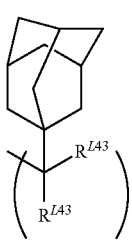

-continued (A-3)-18 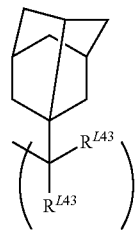

Herein $R^{L43}$ is each independently a straight, branched or cyclic $C_1$-$C_8$ alkyl group or $C_6$-$C_{20}$ aryl group, typically phenyl or naphthyl, $R^{L44}$ and $R^{L46}$ each are hydrogen or a straight, branched or cyclic $C_1$-$C_{20}$ alkyl group, and $R^{L45}$ is a $C_6$-$C_{20}$ aryl group, typically phenyl.

The polymer may be crosslinked within the molecule or between molecules with groups having $R^{L47}$ which is a di- or multi-valent alkylene or arylene group, as shown by the following formulae (A-3)-19 and (A-3)-20.

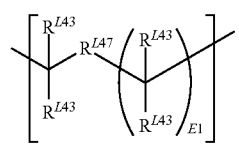
(A-3)-19

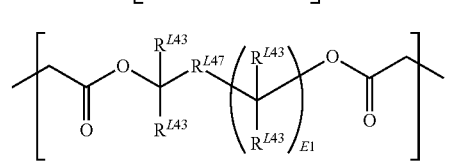
(A-3)-20

Herein $R^{L43}$ is as defined above, $R^{L47}$ is a straight, branched or cyclic $C_1$-$C_{20}$ alkylene group or arylene group, typically phenylene, which may contain a heteroatom such as oxygen, sulfur or nitrogen, and E1 is an integer of 1 to 3.

Of recurring units having acid labile groups of formula (A-3), recurring units of (meth)acrylate having an exo-form structure represented by the formula (A-3)-21 are preferred.

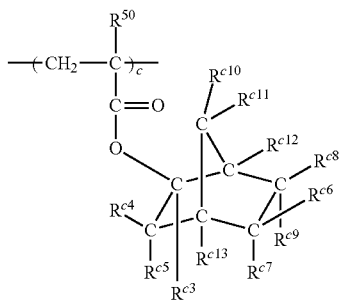
(A-3)-21

Herein, $R^{50}$ is as defined above. $R^{c3}$ is a straight, branched or cyclic $C_1$-$C_8$ alkyl group or an optionally substituted $C_6$-$C_{20}$ aryl group. $R^{c4}$ to $R^{c9}$, $R^{c12}$ and $R^{c13}$ are each independently hydrogen or a monovalent $C_1$-$C_{15}$ hydrocarbon group which may contain a heteroatom. $R^{c10}$ and $R^{c11}$ are hydrogen. Alternatively, a pair of $R^{c4}$ and $R^{c5}$, $R^{c6}$ and $R^{c8}$, $R^{c6}$ and $R^{c9}$, $R^{c7}$ and $R^{c9}$, $R^{c7}$ and $R^{c13}$, $R^{c8}$ and $R^{c12}$, $R^{c10}$ and $R^{c11}$, or $R^{c11}$ and $R^{c12}$, taken together, may form a ring, and in that event, each ring-forming R is a divalent $C_1$-$C_{15}$ hydrocarbon group which may contain a heteroatom. Also, a pair of $R^{c4}$ and $R^{c13}$, $R^{c10}$ and $R^{c13}$, or $R^{c6}$ and $R^{c8}$ which are attached to vicinal carbon atoms may bond together directly to form a double bond. The formula also represents an enantiomer.

The ester form monomers from which recurring units having an exo-form structure represented by formula (A-3)-21 are derived are described in U.S. Pat. No. 6,448,420 (JP-A 2000-327633). Illustrative non-limiting examples of suitable monomers are given below.

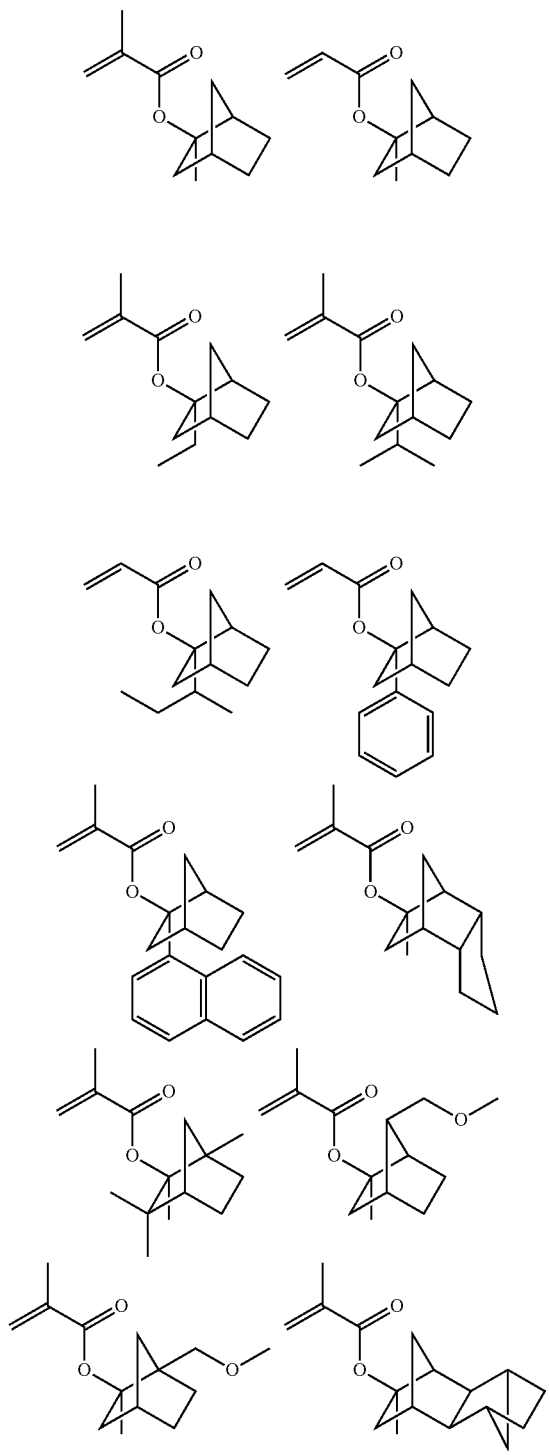

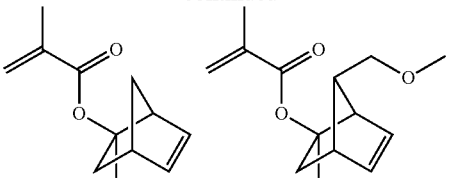

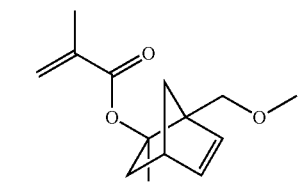

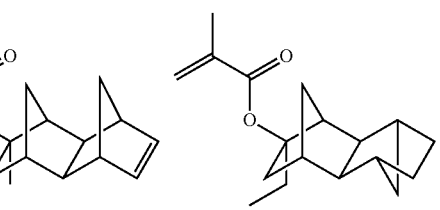

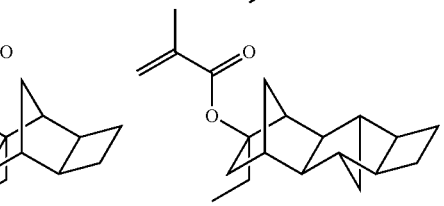

Also included in the acid labile groups of formula (A-3) are acid labile groups of (meth)acrylate having furandiyl, tetrahydrofurandiyl or oxanorbornanediyl as represented by the following formula (A-3)-22.

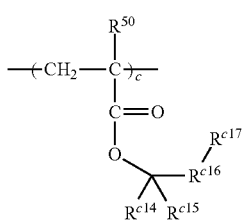

(A-3)-22

Herein, $R^{50}$ is as defined above. $R^{c14}$ and $R^{c15}$ are each independently a monovalent, straight, branched or cyclic $C_1$-$C_{10}$ hydrocarbon group, or $R^{c14}$ and $R^{c15}$, taken together, may form an aliphatic hydrocarbon ring with the carbon atom to which they are attached. $R^{c16}$ is a divalent group selected from furandiyl, tetrahydrofurandiyl and oxanorbornanediyl. $R^{c17}$ is hydrogen or a monovalent, straight, branched or cyclic $C_1$-$C_{10}$ hydrocarbon group which may contain a heteroatom.

Examples of the monomers from which the recurring units substituted with acid labile groups having furandiyl, tetrahydrofurandiyl and oxanorbornanediyl are derived are shown below. Note that Me is methyl and Ac is acetyl.

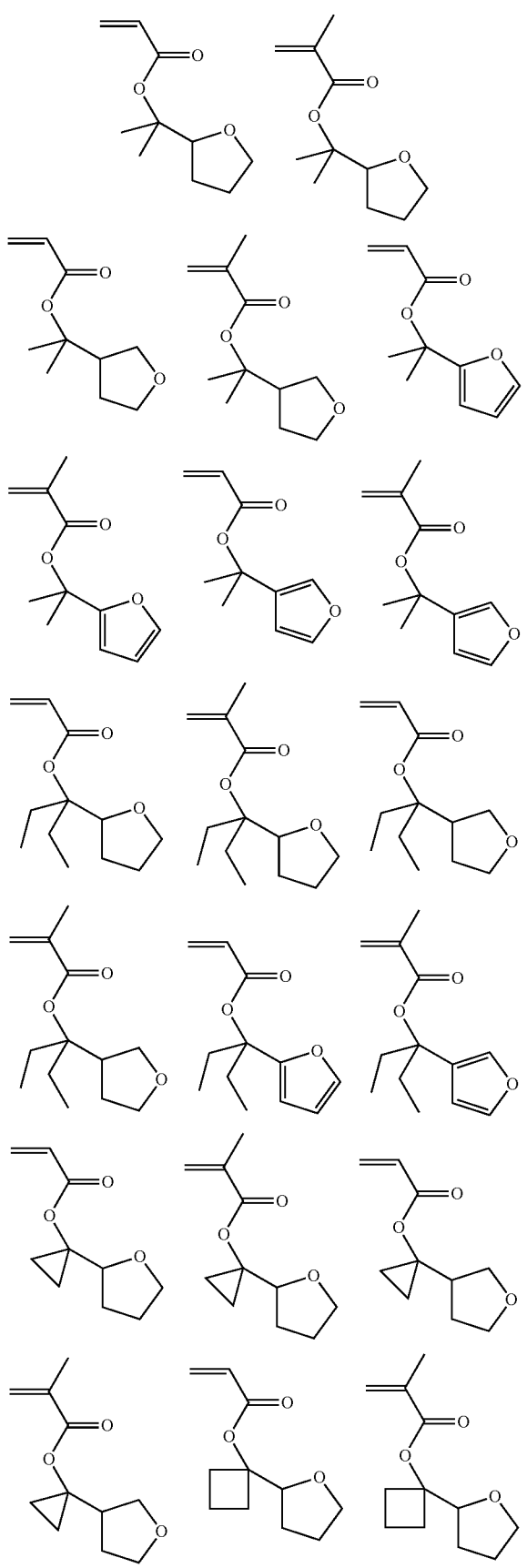
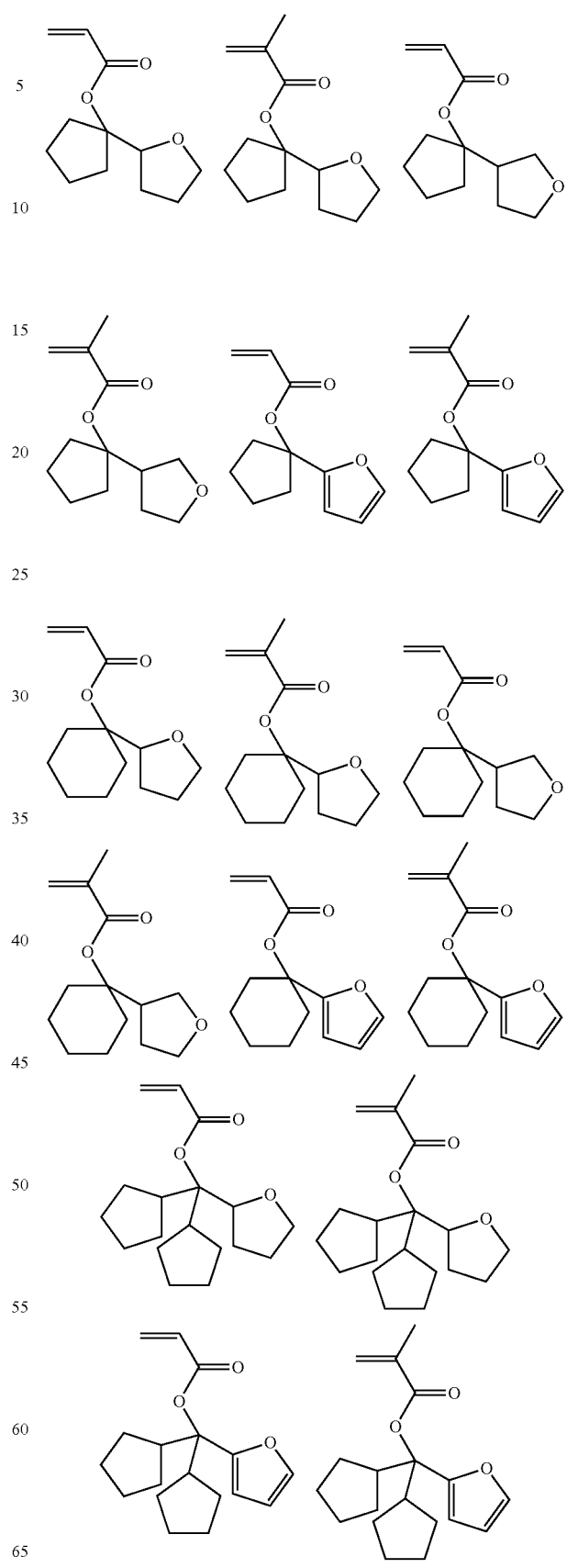

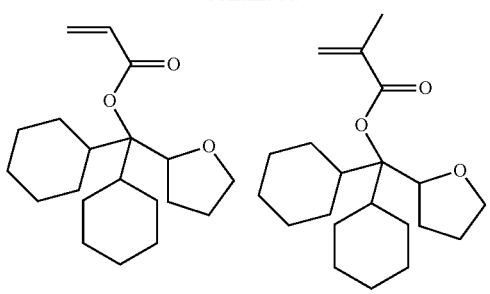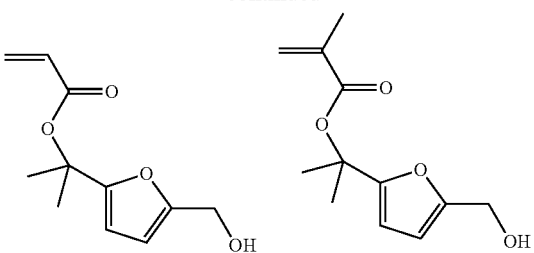

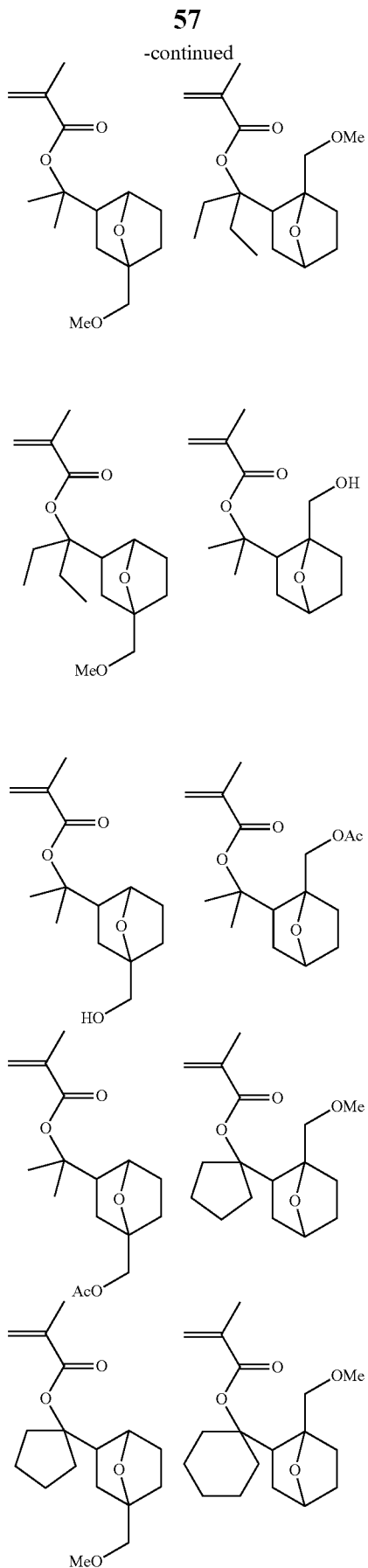

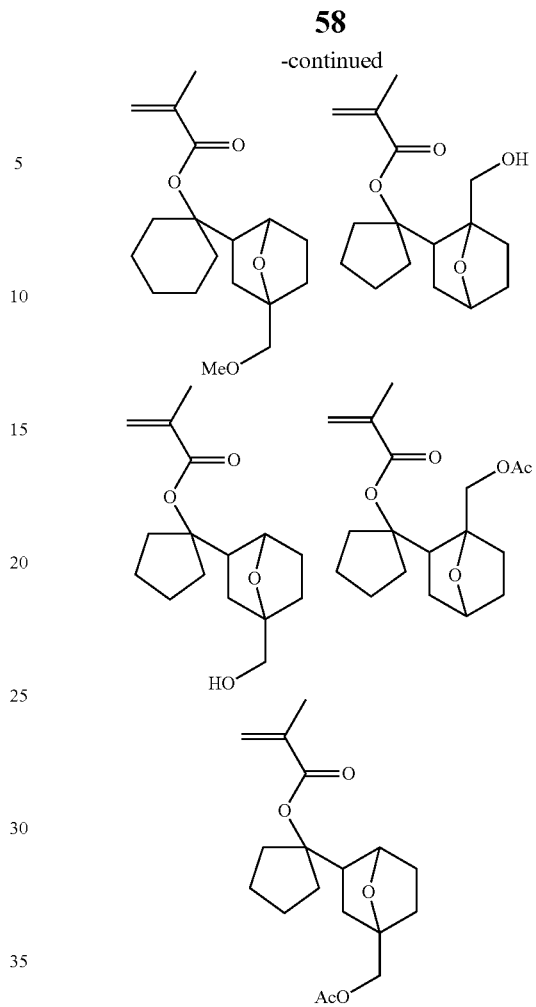

The polymer used herein may be synthesized by any desired methods, for example, by dissolving one or more monomers selected from the monomers to form the recurring units (a) to (g) in an organic solvent, adding a radical polymerization initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis as mentioned above, for thereby converting the polymer product to polyhydroxystyrene or hydroxypolyvinylnaphthalene. For alkaline hydrolysis, a base such as aqueous ammonia or triethylamine may be used. The reaction temperature is −20° C. to 100° C., preferably 0° C. to 60° C., and the reaction time is 0.2 to 100 hours, preferably 0.5 to 20 hours.

In the copolymer, recurring units (a) to (g) may be incorporated in the following molar fraction:

0<a<1.0, preferably 0.05≤a≤0.9, and more preferably 0.07≤a≤0.8;
0≤b1<1.0, 0≤b2<1.0, 0≤b3<1.0, and 0<b1+b2+b3<1.0, preferably 0≤b1≤0.5, 0≤b2≤0.5, 0≤b3≤0.5, and 0.01≤b1+b2+b3≤0.5, and more preferably 1≤b1≤0.3, 0≤b2≤0.3, 0≤b3≤0.3, and 0.03≤b1+b2+b3≤0.3;
0≤c<1.0, preferably 0≤c 0.9, and more preferably 0≤c≤0.8;
0≤d≤0.8, preferably 0≤d≤0.7, and more preferably 0≤d≤0.6;
0≤e≤0.5, preferably 0≤e≤0.4, and more preferably 0≤e≤0.3;
0≤f≤0.5, preferably 0≤f≤0.4, and more preferably 0≤f≤0.3;
0≤g≤0.5, preferably 0≤g≤0.4, and more preferably 0≤g≤0.3; and a+b+c+d+e+f+g=1 (notably b=b1+b2+b3).

The meaning of a+b+c=1, for example, is that in a polymer comprising recurring units (a), (b), and (c), the sum of recurring units (a), (b), and (c) is 100 mol % based on the total amount of entire recurring units. The meaning of a+b+c <1 is that the sum of recurring units (a), (b), and (c) is less than 100 mol % based on the total amount of entire recurring units, indicating the inclusion of other recurring units.

The polymer serving as the base resin in the resist composition should preferably have a weight average molecular weight (Mw) in the range of 1,000 to 500,000, and more preferably 2,000 to 30,000, as measured by GPC versus polystyrene standards. With too low a Mw, the resist composition may become less heat resistant. A polymer with too high a Mw may lose alkaline solubility and give rise to a footing phenomenon after pattern formation.

If a multi-component polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The polymer is advantageously used as a base resin in a positive resist composition, typically chemically amplified positive resist composition. Specifically, the polymer is used as a base resin and combined with any desired components including an organic solvent, acid generator, dissolution regulator, basic compound, surfactant, and acetylene alcohol to formulate a positive resist composition. This positive resist composition has a very high sensitivity in that the dissolution rate in developer of the polymer in exposed areas is accelerated by catalytic reaction. In addition, the resist film has a high dissolution contrast, resolution, exposure latitude, and process adaptability, and provides a good pattern profile after exposure, yet better etch resistance, and minimal proximity bias because of restrained acid diffusion. By virtue of these advantages, the composition is fully useful in commercial application and suited as a pattern-forming material for the fabrication of VLSIs. Particularly when an acid generator is incorporated to formulate a chemically amplified positive resist composition capable of utilizing acid catalyzed reaction, the composition has a higher sensitivity and is further improved in the properties described above.

The positive resist composition may further comprise an organic solvent, basic compound, dissolution regulator, surfactant, and acetylene alcohol, alone or in combination. Inclusion of a dissolution regulator may lead to an increased difference in dissolution rate between exposed and unexposed areas and a further improvement in resolution. Addition of a basic compound may be effective in suppressing the diffusion rate of acid in the resist film, achieving a further improvement in resolution. Addition of a surfactant may improve or control the coating characteristics of the resist composition.

The positive resist composition may include an acid generator in order for the composition to function as a chemically amplified positive resist composition. Typical of the acid generator used herein is a photoacid generator (PAG) capable of generating an acid in response to actinic light or radiation. It is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary acid generators are described in U.S. Pat. No. 7,537,880 (JP-A 2008-111103, paragraphs [0122] to [0142]). In the embodiment wherein a polymer having recurring units (b) copolymerized therein is used as the base resin, the PAG may be omitted.

Examples of the organic solvent used herein are described in JP-A 2008-111103, paragraphs [0144] to [0145](U.S. Pat. No. 7,537,880). Specifically, exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof. Exemplary basic compounds are described in JP-A 2008-111103, paragraphs [0146] to [0164], for example, primary, secondary and tertiary amine compounds, specifically amine compounds having a hydroxyl, ether, ester, lactone, cyano or sulfonate group. Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. Also useful are quenchers of polymer type as described in JP-A 2008-239918. The polymeric quencher segregates at the resist surface after coating and thus enhances the rectangularity of resist pattern. When a protective film is applied as is often the case in the immersion lithography, the polymeric quencher is also effective for preventing any film thickness loss of resist pattern or rounding of pattern top.

An appropriate amount of the acid generator used is 0.01 to 100 parts, and preferably 0.1 to 80 parts. An appropriate amount of the organic solvent used is 50 to 10,000 parts, especially 100 to 5,000 parts. The dissolution regulator may be blended in an amount of 0 to 50 parts, preferably 0 to 40 parts, the basic compound in an amount of 0 to 100 parts, preferably 0.001 to 50 parts, and the surfactant in an amount of 0 to 10 parts, preferably 0.0001 to 5 parts. All amounts are expressed in parts by weight relative to 100 parts by weight of the base resin.

Process

The positive resist composition, typically chemically amplified positive resist composition comprising a polymer having an acid-deprotection group of formula (2), an acid generator, and a basic compound in an organic solvent is used in the fabrication of various integrated circuits. Pattern formation using the resist composition may be performed by well-known lithography processes. The process generally involves coating, prebake, exposure, bake (PEB), and development. If necessary, any additional steps may be added.

The positive resist composition is first applied onto a substrate on which an integrated circuit is to be formed (e.g., Si, SiO$_2$, SiN, SiON, TiN, WSi, BPSG, SOG, or organic antireflective coating) or a substrate on which a mask circuit is to be formed (e.g., Cr, CrO, CrON, MoSi, or SiO$_2$) by a suitable coating technique such as spin coating, roll coating, flow coating, dip coating, spray coating or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.1 to 2.0 μm thick.

The resist film is then exposed to a desired pattern of high-energy radiation such as UV, deep-UV, EB, x-ray, excimer laser light, γ-ray, synchrotron radiation or EUV (soft x-ray), directly or through a mask. The exposure dose is preferably about 1 to 200 mJ/cm$^2$, more preferably about 10 to 100 mJ/cm$^2$, or 0.1 to 100I μC/cm$^2$, more preferably 0.5 to 50 μC/cm$^2$. The resist film is further baked (PEB) on a hot plate at 60 to 150° C. for 10 seconds to 30 minutes, preferably 80 to 120° C. for 30 seconds to 20 minutes.

Thereafter the resist film is developed in a developer in the form of an aqueous base solution for 3 seconds to 3 minutes, preferably 5 seconds to 2 minutes by conventional techniques such as dip, puddle or spray techniques. Suitable developers are 0.1 to 10 wt %, preferably 2 to 10 wt %, more preferably 2 to 8 wt % aqueous solutions of tetramethylammonium hydroxide (TMAH), tetraethylammonium hydroxide (TEAH), tetrapropylammonium hydroxide (TPAH) and tetrabutylammonium hydroxide (TBAH). The resist film in the exposed area is dissolved in the developer whereas the resist film in the unexposed area is not dissolved. In this way, the desired positive pattern is formed on the substrate. It is appreciated that the resist composition of the invention is best suited for micro-patterning using such high-energy radiation as EB, EUV (soft x-ray), x-ray, γ-ray and synchrotron radiation among others.

Although TMAH aqueous solution is generally used as the developer, TEAH, TPAH and TBAH having a longer alkyl chain are effective in inhibiting the resist film from being swollen during development and thus preventing pattern collapse. JP 3429592 describes an example using an aqueous TBAH solution for the development of a polymer comprising recurring units having an alicyclic structure such as adamantane methacrylate and recurring units having an acid labile group such as t-butyl methacrylate, the polymer being water repellent due to the absence of hydrophilic groups.

The TMAH developer is most often used as 2.38 wt % aqueous solution, which corresponds to 0.26N. The TEAH, TPAH, and TBAH aqueous solutions should preferably have an equivalent normality. The concentration of TEAH, TPAH, and TBAH that corresponds to 0.26N is 3.84 wt %, 5.31 wt %, and 6.78 wt %, respectively.

When a pattern with a line size of 32 nm or less is resolved by the EB and EUV lithography, there arises a phenomenon that lines become wavy, lines merge together, and merged lines collapse. It is believed that this phenomenon occurs because lines are swollen in the developer and the thus expanded lines merge together. Since the swollen lines containing liquid developer are as soft as sponge, they readily collapse under the stress of rinsing. For this reason, the developer using a long-chain alkyl developing agent is effective for preventing film swell and hence, pattern collapse.

Alternatively, a negative tone pattern may be formed by organic solvent development. The organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

At the end of organic solvent development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. The solvents may be used alone or in admixture. Besides the foregoing solvents, aromatic solvents may be used, for example, toluene, xylene, ethylbenzene, isopropylbenzene, tert-butylbenzene and mesitylene.

EXAMPLE

Synthesis Examples, Comparative Synthesis Examples, Examples and Comparative Examples are given below for further illustrating the invention, but they should not be construed as limiting the invention thereto. Mw is a weight average molecular weight as measured by GPC versus polystyrene standards, and Mw/Mn designates molecular weight distribution or dispersity. All parts (pbw) are by weight.

Monomer Synthesis

Polymerizable acid-labile compounds within the scope of the invention were synthesized as follows.

Monomer Synthesis Example 1

Synthesis of Monomer 1

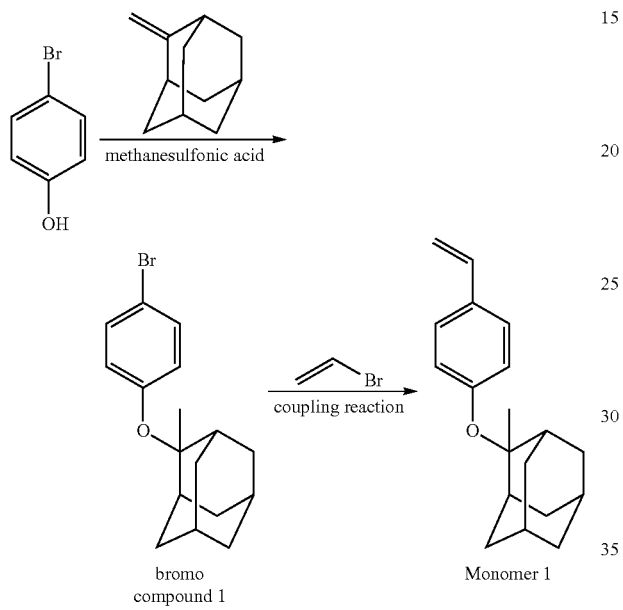

Synthesis Example 1-1-1

Synthesis of Bromo Compound 1

To a mixture of 639.5 g of p-bromophenol, 109.6 g of methyleneadamantane, and 2,700 g of toluene kept below 5° C., 7.1 g of methanesulfonic acid was added. The contents were stirred at the temperature for 15 hours. 591 g of a 25 wt % sodium hydroxide aqueous solution was added to the reaction solution to quench the reaction, from which the organic layer was recovered. The organic layer was washed with water and saturated saltwater, and concentrated, yielding 168.5 g of crude bromo compound 1.

$^1$H-NMR (600 MHz in CDCl$_3$): δ=1.34 (3H, s), 1.54 (2H, d), 1.70-1.88 (8H, m), 2.04 (2H, s), 2.32 (2H, d), 6.84 (2H, d), 7.31 (2H, d) ppm Synthesis Example 1-1-2

Synthesis of Monomer 1

A Grignard reagent was prepared from 88.7 g of bromo compound 1 (synthesized in Synthesis Example 1-1-1), 7.7 g of magnesium and 160 mL of tetrahydrofuran before it was added to a suspension of 52.6 g of zinc chloride in 700 mL of tetrahydrofuran kept below 40° C. The contents were stirred at the temperature for 1 hour, yielding an organozinc reagent. This reagent was added dropwise to a solution of 44.3 g of vinyl bromide and 1.2 g (1 mmol) of tetrakis(triphenylphosphine)palladium(0) in 700 mL of tetrahydrofuran at 40° C. After the completion of dropwise addition, the solution was aged for 30 minutes. The reaction solution was poured into a saturated ammonium chloride aqueous solution, followed by extraction with ethyl acetate in a standard way. The resulting crude product was purified by vacuum distillation, obtaining 53.4 g of the target compound (yield 72%).

b.p.: 125-126° C./16 Pa $^1$H-NMR (600 MHz in CDCl$_3$): δ=1.38 (3H, s), 1.55 (2H, d), 1.70-1.91 (8H, m), 2.08 (2H, s), 2.37 (2H, d), 5.11 (1H, dd), 5.60 (1H, dd), 6.65 (1H, dd), 6.91-6.94 (2H, m), 7.26-7.29 (2H, m) ppm Monomer Synthesis Example 2

Synthesis of Monomer 2

Monomer 2 was synthesized by the same procedure as in Monomer Synthesis Examples 1-1-1 and 1-1-2 aside from using methylenecyclopentane instead of methyleneadamantane. Yield 63%.

Monomer Synthesis Example 3

Synthesis of Monomer 3

Monomer 3 was synthesized by the same procedure as in Monomer Synthesis Examples 1-1-1 and 1-1-2 aside from using methylenecyclohexane instead of methyleneadamantane. Yield 65%.

Monomer Synthesis Example 4

Synthesis of Monomer 4

Monomer 4 was synthesized by the same procedure as in Monomer Synthesis Examples 1-1-1 and 1-1-2 aside from using 2-ethylydeneadamantane instead of methyleneadamantane. Yield 58%.

Monomer Synthesis Example 5

Synthesis of Monomer 5

Monomer 5 was synthesized by the same procedure as in Monomer Synthesis Examples 1-1-1 and 1-1-2 aside from using 2-methylenenorbornane instead of methyleneadamantane. Yield 75%.

Monomer Synthesis Example 6

Synthesis of Monomer 6

Monomer 6 was synthesized by the same procedure as in Monomer Synthesis Examples 1-1-1 and 1-1-2 aside from using m-bromophenol instead of p-bromophenol. Yield 68%.

Monomer Synthesis Example 7

Synthesis of Monomer 7

Monomer 7 was synthesized by the same procedure as in Monomer Synthesis Examples 1-1-1 and 1-1-2 aside from using m-bromophenol instead of p-bromophenol and methylenecyclohexane instead of methyleneadamantane. Yield 63%.

Monomer Synthesis Example 8

Synthesis of Monomer 8

Monomer 8 was synthesized by the same procedure as in Monomer Synthesis Examples 1-1-1 and 1-1-2 aside from using m-bromophenol instead of p-bromophenol and 2-methylenenorbornane instead of methyleneadamantane. Yield 69%.

Monomer Synthesis Example 9

Synthesis of Monomer 9

Monomer 9 was synthesized by the same procedure as in Monomer Synthesis Examples 1-1-1 and 1-1-2 aside from using 2-ethylydenenorbornane instead of methyleneadamantane. Yield 66%.

Monomer Synthesis Example 10

Synthesis of Monomer 10

Monomer 10 was synthesized by the same procedure as in Monomer Synthesis Examples 1-1-1 and 1-1-2 aside from using ethylydenecyclopentane instead of methyleneadamantane. Yield 60%.

Monomer Synthesis Example 11

Synthesis of Monomer 11

Monomer 11 was synthesized by the same procedure as in Monomer Synthesis Examples 1-1-1 and 1-1-2 aside from using isopropylidenecyclopentane instead of methyleneadamantane. Yield 55%.

Monomer 1

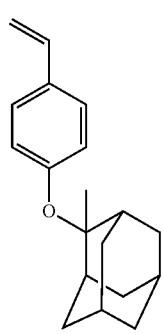

Monomer 2

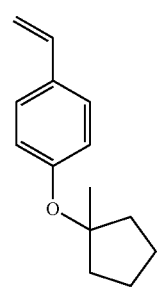

Monomer 3

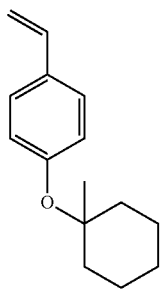

Monomer 4

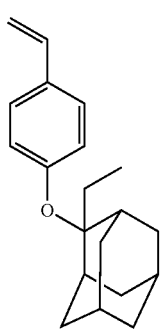

Monomer 5

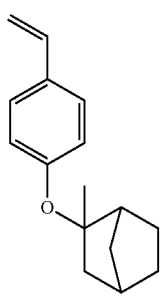

Monomer 6

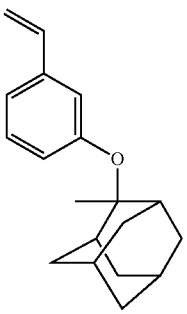

Monomer 7

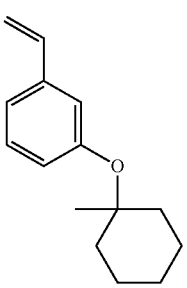

Monomer 8
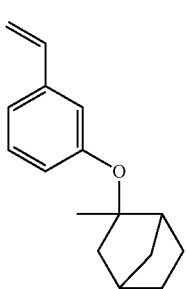
Monomer 9
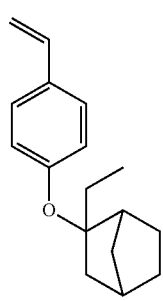
Monomer 10
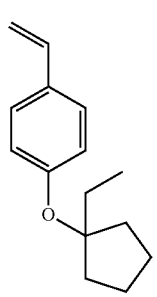
Monomer 11
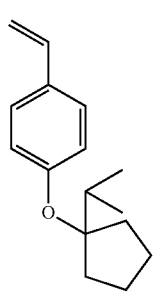
PAG monomers 1 to 7 are identified below.
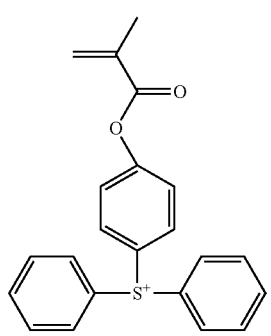
PAG monomer 1
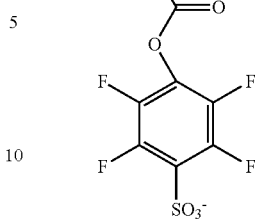
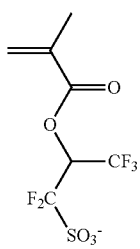
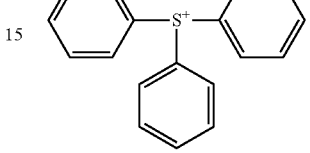
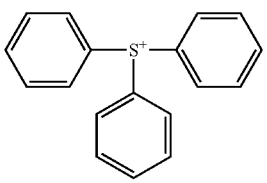
PAG monomer 2                PAG monomer 2
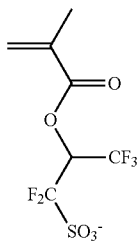
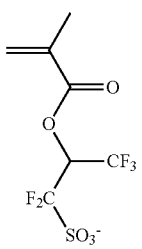
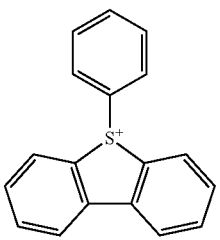
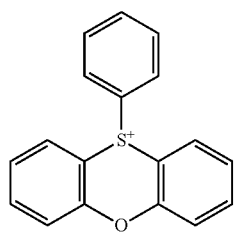
PAG monomer 4                PAG monomer 5
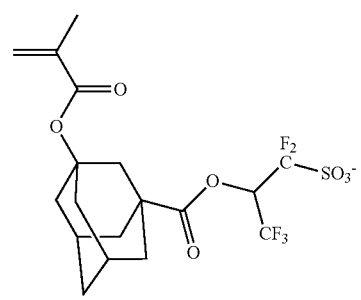
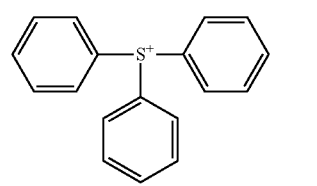
PAG monomer 6

-continued

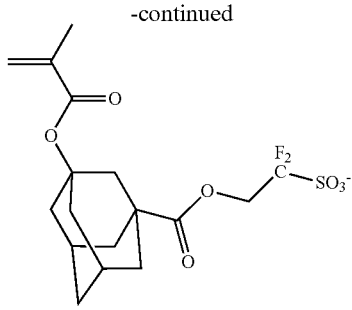

PAG monomer 7

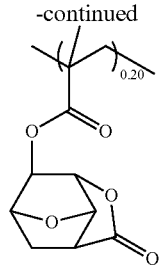

Polymer Synthesis

Polymer Synthesis Example 1

A 2-L flask was charged with 13.4 g of Monomer 1, 3.6 g of 4-hydroxyphenyl methacrylate, 4.5 g of 3-oxo-2,7-dioxatricyclo[$4.2.1.0^{4,8}$]nonan-9-yl methacrylate, 6.5 g of PAG monomer 1, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of azobisisobutyronitrile (AIBN) was added as a polymerization initiator. The reactor was heated at 60° C. and reaction run for 15 hours. The reaction solution was precipitated from 1 L of isopropyl alcohol. The white solid was filtered and vacuum dried at 60° C., obtaining a white polymer.

The polymer was analyzed by $^{13}$C-NMR, $^{1}$H-NMR, and GPC, with the analytical data shown below.

Copolymer Composition (Molar Ratio)

Monomer 1: 4-hydroxyphenyl mechacrylate:3-oxo-2,7-dioxatricyclo[$4.2.1.0^{4,8}$]nonan-9-yl methacrylate:PAG monomer 1=0.50:0.20:0.20:0.10

Mw=8,300

Mw/Mn=1.89

This is designated Polymer 1.

Polymer 1

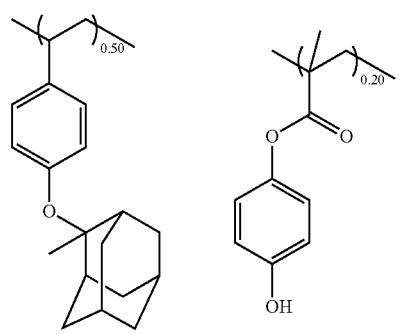

Polymer Synthesis Example 2

A 2-L flask was charged with 4.0 g of Monomer 2, 5.5 g of 3-ethyl-3-exotetracyclo[$4.4.0.1^{2,5}.1^{7,10}$]dodecanyl methacrylate, 3.6 g of 4-hydroxyphenyl methacrylate, 6.7 g of 3-oxo-2,7-dioxatricyclo[$4.2.1.0^{4,8}$]nonan-9-yl methacrylate, 5.7 g of PAG monomer 2, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was filtered and vacuum dried at 60° C., obtaining a white polymer.

The polymer was analyzed by $^{13}$C-NMR, $^{1}$H-NMR, and GPC, with the analytical data shown below.

Copolymer Composition (Molar Ratio)

Monomer 2: 3-ethyl-3-exotetracyclo[$4.4.0.1^{2,5}.1^{7,10}$]dodecanyl methacrylate:4-hydroxyphenyl mechacrylate:3-oxo-2,7-dioxatricyclo[$4.2.1.0^{4,8}$]nonan-9-yl methacrylate:PAG monomer 2=0.20:0.20:0.20:0.30:0.10

Mw=8,100

Mw/Mn=1.69

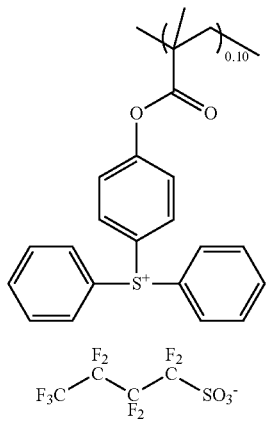

This is designated Polymer 2.

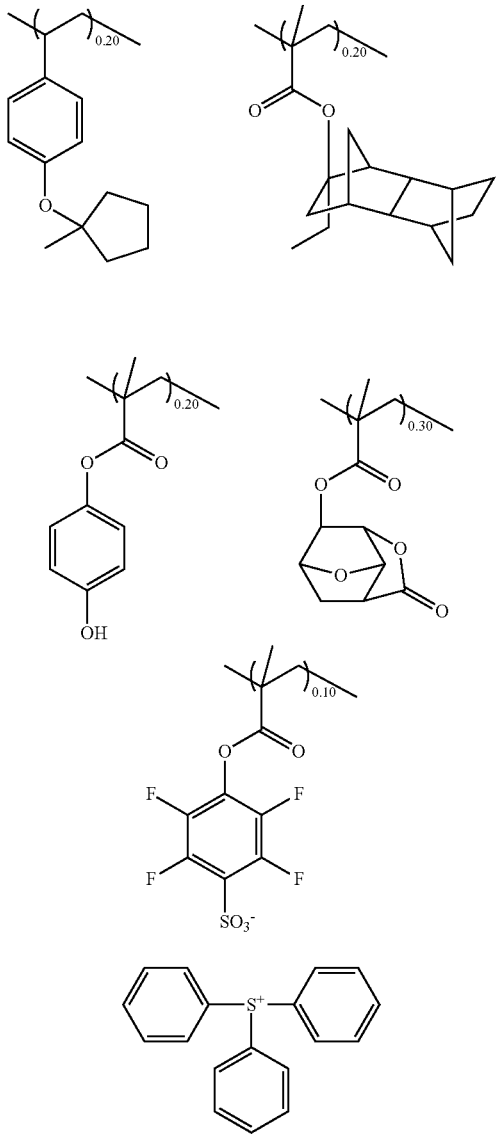

Polymer 2

Polymer Synthesis Example 3

A 2-L flask was charged with 6.5 g of Monomer 3, 5.5 g of 3-ethyl-3-exotetracyclo[4.4.0.1$^{2,5}$.1$^{7,10}$]dodecanyl methacrylate, 3.6 g of 4-hydroxyphenyl methacrylate, 6.7 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was filtered and vacuum dried at 60° C., obtaining a white polymer.

The polymer was analyzed by $^{13}$C-NMR, $^1$H-NMR, and GPC, with the analytical data shown below.

Copolymer Composition (Molar Ratio)
  Monomer 3: 3-ethyl-3-exotetracyclo[4.4.0.1$^{2,5}$.1$^{7,10}$] dodecanyl methacrylate:4-hydroxyphenyl mechacrylate:3-oxo-2,7-dioxatricyclo[4.2.1.0$^{4,8}$]nonan-9-yl methacrylate:PAG monomer 3=0.20:0.20:0.20:0.30:0.10
Mw=7,200
Mw/Mn=1.77

This is designated Polymer 3.

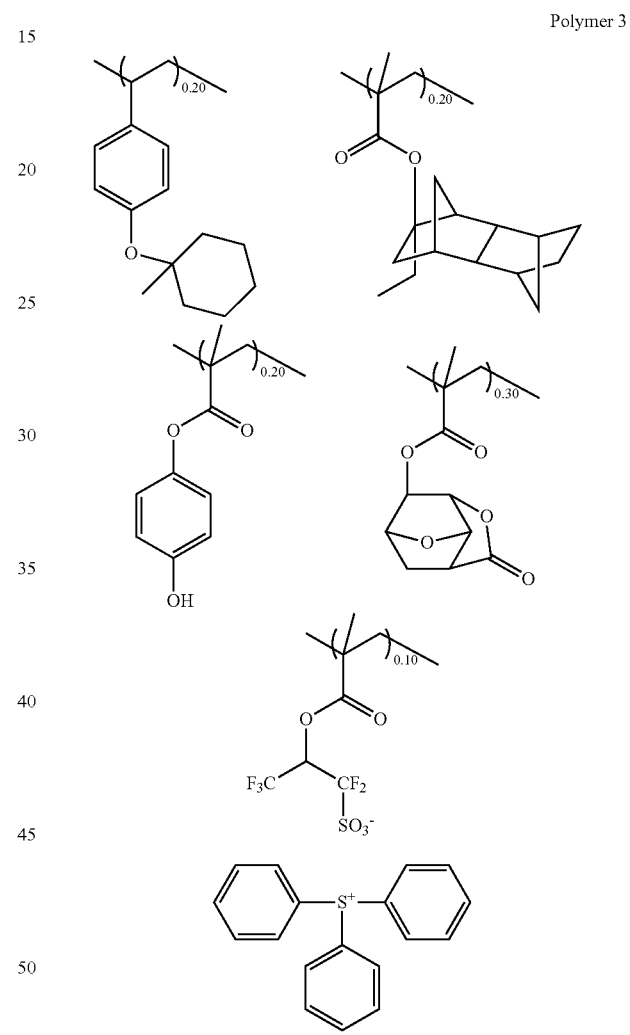

Polymer 3

Polymer Synthesis Example 4

A 2-L flask was charged with 4.2 g of Monomer 4, 4.6 g of 1-ethylcyclopentyl methacrylate, 5.4 g of 3-hydroxyphenyl methacrylamide, 4.3 g of 2,7-dihydro-2-oxobenzo[C]furan-5-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was filtered and vacuum dried at 60° C., obtaining a white polymer.

The polymer was analyzed by $^{13}$C-NMR, $^1$H-NMR, and GPC, with the analytical data shown below.
Copolymer Composition (Molar Ratio)
Monomer 4: 1-ethylcyclopentyl methacrylate:3-hydroxyphenyl methacrylamide:2,7-dihydro-2-oxobenzo[C]furan-5-yl methacrylate:PAG monomer 3=0.15:0.25:0.30:0.20:0.10
Mw=7,500
Mw/Mn=1.79
This is designated Polymer 4.

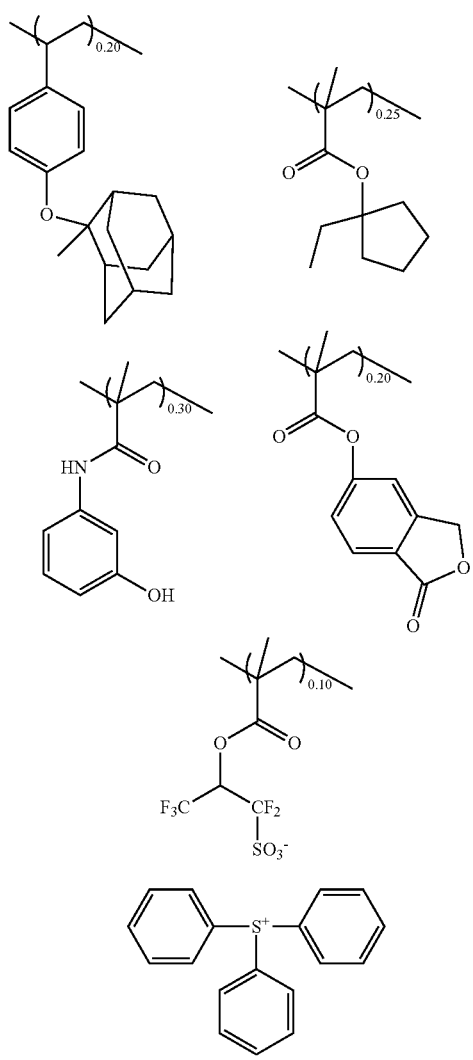

Polymer 4

Polymer Synthesis Example 5

A 2-L flask was charged with 4.6 g of Monomer 5, 3.6 g of 1-ethylcyclopentyl methacrylate, 6.4 g of 6-acetoxy-2-vinylnaphthalene, 3.4 g of 2-oxooxolan-3-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected and dissolved again in a mixture of 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^1$H-NMR, and GPC, with the analytical data shown below.
Copolymer Composition (Molar Ratio)
Monomer 5: 1-ethylcyclopentyl methacrylate:6-hydroxy-2-vinylnaphthalene:2-oxooxolan-3-yl methacrylate:PAG monomer 3=0.20:0.30:0.20:0.10
Mw=8,800
Mw/Mn=1.85
This is designated Polymer 5.

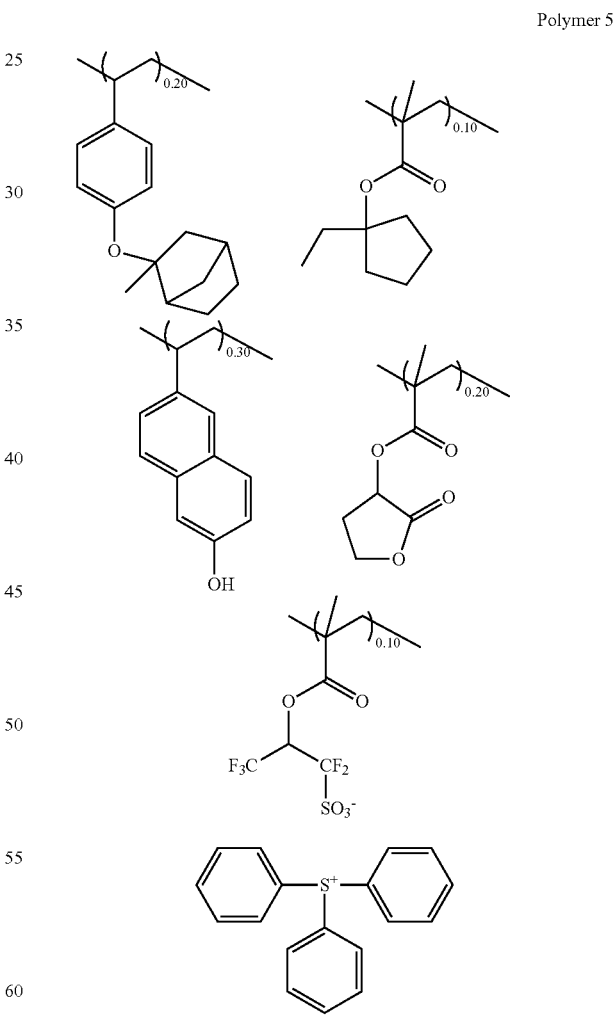

Polymer 5

Polymer Synthesis Example 6

A 2-L flask was charged with 2.6 g of Monomer 6, 5.0 g of 1-methylcyclopentyl methacrylate, 6.5 g of 5-hydroxyindan- 2-yl methacrylate, 4.5 g of 3-oxo-2,7-dioxatricyclo[4.2.1.0$^{4,8}$]nonan-9-yl methacrylate, 5.6 g of PAG monomer 3, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was filtered and vacuum dried at 60° C., obtaining a white polymer.

The polymer was analyzed by $^{13}$C-NMR, $^1$H-NMR, and GPC, with the analytical data shown below.

Copolymer Composition (Molar Ratio)
  Monomer 6: 1-methylcyclopentyl methacrylate:5-hydroxyindan-2-yl methacrylate:3-oxo-2,7-dioxatricyclo[4.2.1.0$^{4,8}$]nonan-9-yl methacrylate:PAG monomer 3=0.10:0.30:0.30:0.20:0.10

Mw=7,200
Mw/Mn=1.66

This is designated Polymer 6.

Polymer 6

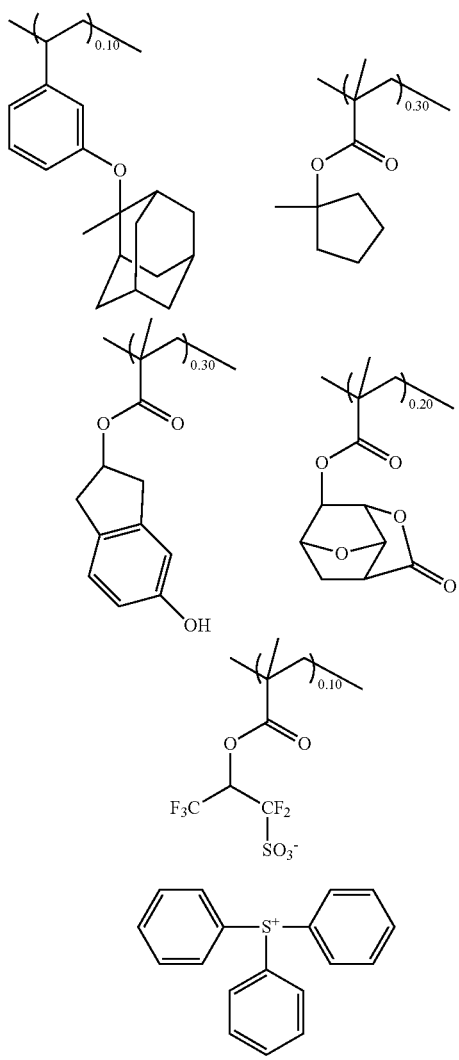

Polymer Synthesis Example 7

A 2-L flask was charged with 3.5 g of Monomer 7, 5.6 g of 3-ethyl-3-cyclooctane methacrylate, 5.3 g of 4-hydroxyphenyl methacrylate, 4.3 g of 2,7-dihydro-2-oxobenzo[C]furan-5-yl methacrylate, 5.6 g of PAG monomer 4, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was filtered and vacuum dried at 60° C., obtaining a white polymer.

The polymer was analyzed by $^{13}$C-NMR, $^1$H-NMR, and GPC, with the analytical data shown below.

Copolymer composition (molar ratio)
  Monomer 7: 3-ethyl-3-cyclooctane methacrylate:4-hydroxyphenyl methacrylate:2,7-dihydro-2-oxobenzo[C]furan-5-yl methacrylate:PAG monomer 4=0.15:0.25:0.30:0.20:0.10

Mw=7,600
Mw/Mn=1.76

This is designated Polymer 7.

Polymer 7

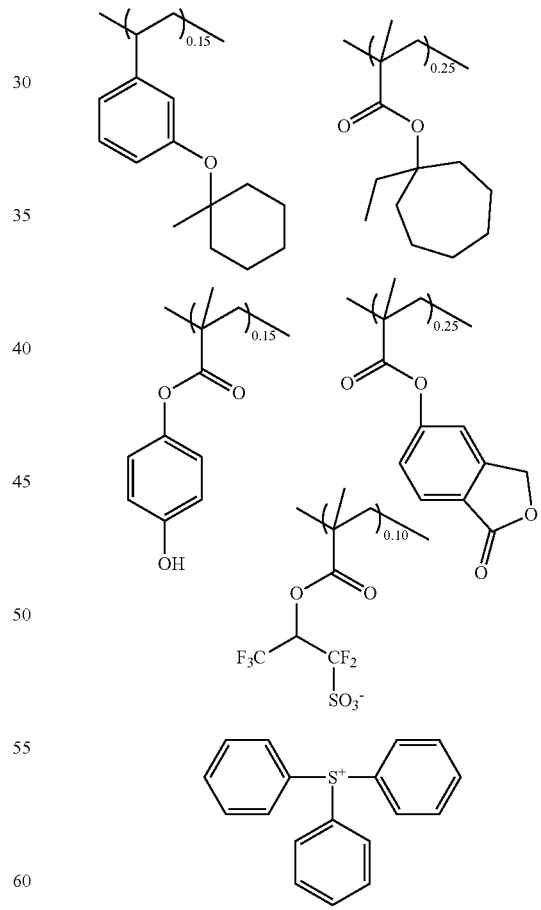

Polymer Synthesis Example 8

A 2-L flask was charged with 3.4 g of Monomer 8, 5.1 g of 1-tert-butylcyclopentyl methacrylate, 5.3 g of 4-hydroxyphenyl methacrylate, 4.5 g of 3-oxo-2,7-dioxatricyclo[4.2.1.0$^{4,8}$]nonan-9-yl methacrylate, 5.7 g of PAG monomer 5, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was filtered and vacuum dried at 60° C., obtaining a white polymer.

The polymer was analyzed by $^{13}$C-NMR, $^1$H-NMR, and GPC, with the analytical data shown below.

Copolymer Composition (Molar Ratio)

Monomer 8: 1-tert-butylcyclopentyl methacrylate:4-hydroxyphenyl methacrylate:3-oxo-2,7-dioxatricyclo [4.2.1.0$^{4,8}$]nonan-9-yl methacrylate:PAG monomer 8=0.15:0.25:0.30:0.20:0.10

Mw=7,100

Mw/Mn=1.96

This is designated Polymer 8.

Polymer Synthesis Example 9

A 2-L flask was charged with 4.8 g of Monomer 9, 3.9 g of 1-isopropylcyclopentyl methacrylate, 5.3 g of 4-hydroxyphenyl methacrylate, 4.5 g of 3-oxo-2,7-dioxatricyclo[4.2.1.0$^{4,8}$]nonan-9-yl methacrylate, 7.4 g of PAG monomer 6, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was filtered and vacuum dried at 60° C., obtaining a white polymer.

The polymer was analyzed by $^{13}$C-NMR, $^1$H-NMR, and GPC, with the analytical data shown below.

Copolymer Composition (Molar Ratio)

Monomer 9: 1-isopropylcyclopentyl methacrylate:4-hydroxyphenyl methacrylate:3-oxo-2,7-dioxatricyclo [4.2.1.0$^{4,8}$]nonan-9-yl methacrylate:PAG monomer 6=0.20:0.20:0.30:0.20:0.10

Mw=7,100

Mw/Mn=1.93

This is designated Polymer 9.

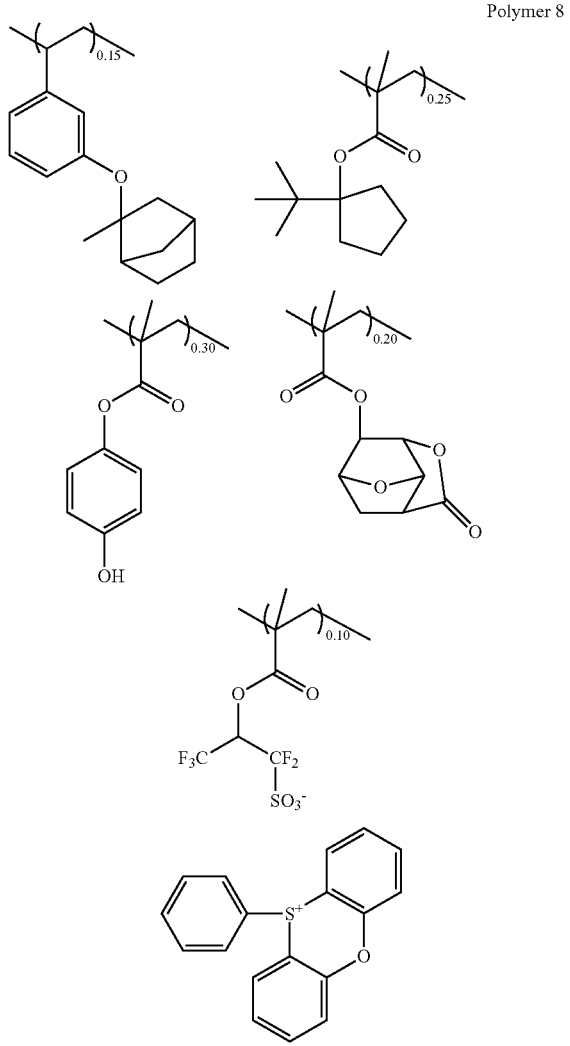

Polymer 8

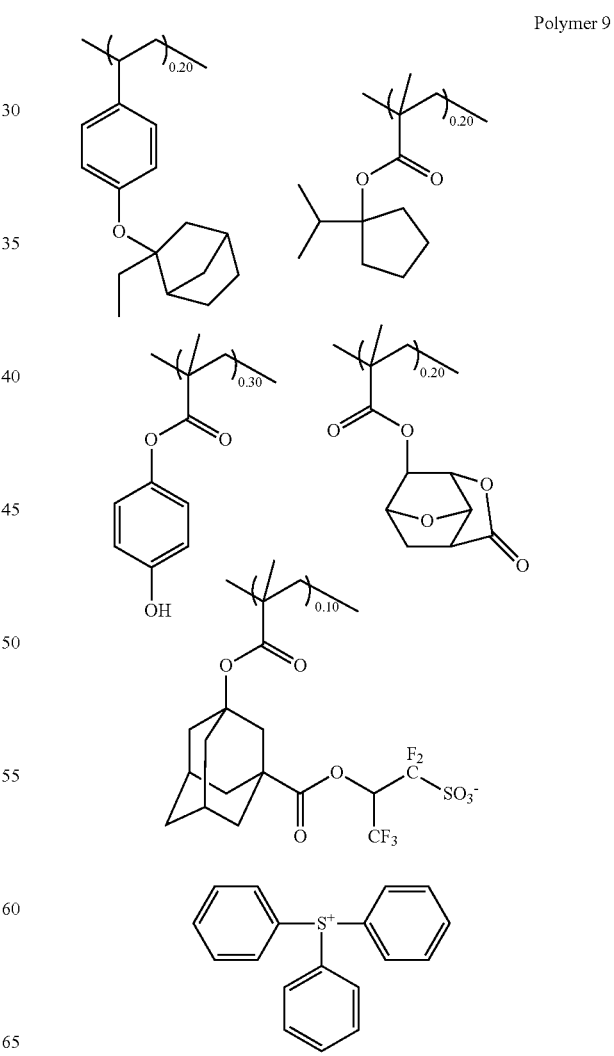

Polymer 9

Polymer Synthesis Example 10

A 2-L flask was charged with 4.3 g of Monomer 10, 3.5 g of 3-cyclohexyl-3-cyclopentane methacrylate, 4.3 g of 4-hydroxyphenyl methacrylate, 6.7 g of 3-oxo-2,7-dioxatricyclo[4.2.1.0$^{4,8}$]nonan-9-yl methacrylate, 6.7 g of PAG monomer 7, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was filtered and vacuum dried at 60° C., obtaining a white polymer.

The polymer was analyzed by $^{13}$C-NMR, $^1$H-NMR, and GPC, with the analytical data shown below.

Copolymer Composition (Molar Ratio)
  Monomer 10: 3-cyclohexyl-3-cyclopentane methacrylate: 4-hydroxyphenyl methacrylate:3-oxo-2,7-dioxatricyclo[4.2.1.0$^{4,8}$]nonan-9-yl methacrylate:PAG monomer 7=0.20:0.15:0.25:0.30:0.10

Mw=7,400
Mw/Mn=1.71
This is designated Polymer 10.

Polymer 10

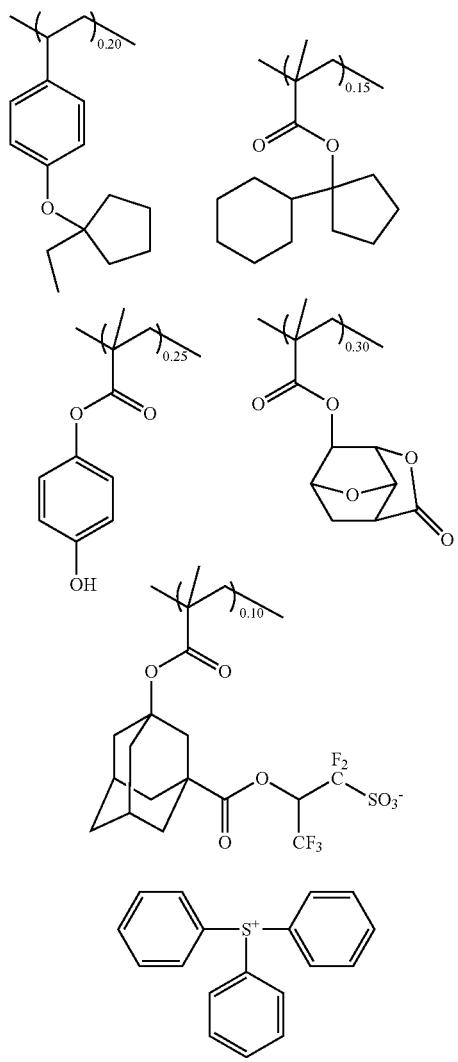

Polymer Synthesis Example 11

A 2-L flask was charged with 4.6 g of Monomer 11, 3.9 g of 1-isopropylcyclopentyl methacrylate, 4.3 g of 4-hydroxyphenyl methacrylate, 6.7 g of 3-oxo-2,7-dioxatricyclo[4.2.1.0$^{4,8}$]nonan-9-yl methacrylate, 6.7 g of PAG monomer 7, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was filtered and vacuum dried at 60° C., obtaining a white polymer.

The polymer was analyzed by $^{13}$C-NMR, $^1$H-NMR, and GPC, with the analytical data shown below.

Copolymer Composition (Molar Ratio)
  Monomer 11: 1-isopropylcyclopentyl methacrylate:4-hydroxyphenyl methacrylate:3-oxo-2,7-dioxatricyclo[4.2.1.0$^{4,8}$]nonan-9-yl methacrylate:PAG monomer 7=0.20:0.15:0.25:0.30:0.10

Mw=7,400
Mw/Mn=1.77
This is designated Polymer 11.

Polymer 11

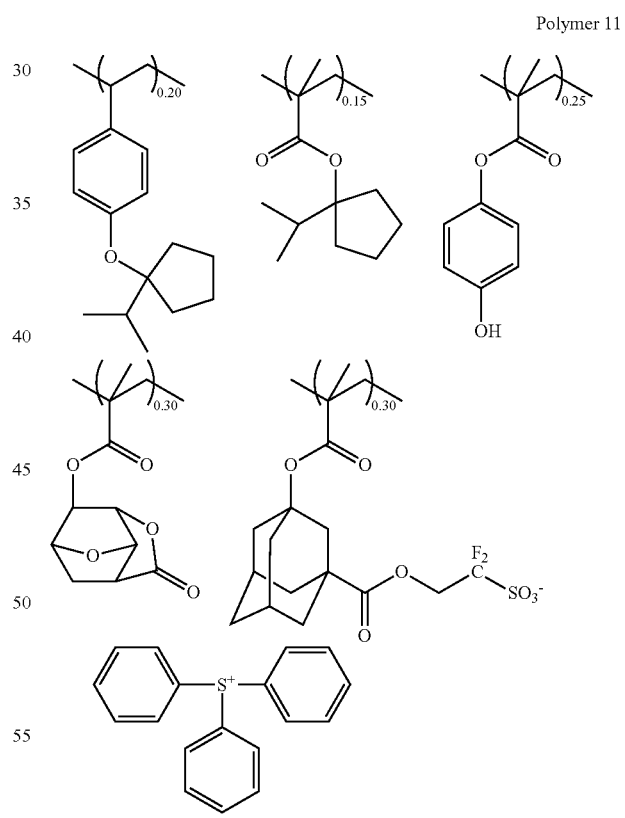

Polymer Synthesis Example 12

A 2-L flask was charged with 6.1 g of Monomer 2, 11.3 g of 4-acetoxystyrene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected and dissolved again in a mixture of 100 mL of methanol and 200 mL of tetrahydrofuran, to which 10 g of triethylamine and 10 g of water were added. Deprotection reaction of acetyl group was conducted at 70° C. for 5 hours, followed by neutralization with acetic acid. The reaction solution was concentrated and dissolved in 100 mL of acetone. By similar precipitation, filtration, and drying at 60° C., a white polymer was obtained.

The polymer was analyzed by $^{13}$C-NMR, $^1$H-NMR, and GPC, with the analytical data shown below.
Copolymer Composition (Molar Ratio)
Monomer 2: 4-hydroxystyrene=0.30:0.70
Mw=9,900
Mw/Mn=1.93
This is designated Polymer 12.

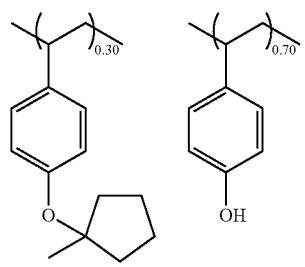

Polymer 12

Comparative Synthesis Example 1

A polymer was synthesized by the same procedure as above.
Copolymer Composition (Molar Ratio)
1-ethylcyclopentyl methacrylate:hydroxystyrene=0.30:0.70
Mw=9,300
Mw/Mn=1.86
This is designated Comparative Polymer 1.

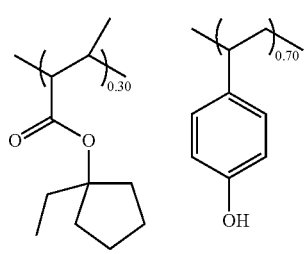

Comparative Polymer 1

Comparative Synthesis Example 2

A polymer was synthesized by the same procedure as above.
Copolymer Composition (Molar Ratio)
4-ethylcyclohexyloxystyrene:4-hydroxystyrene=0.26:0.74
Mw=8,300
Mw/Mn=1.97

This is designated Comparative Polymer 2.

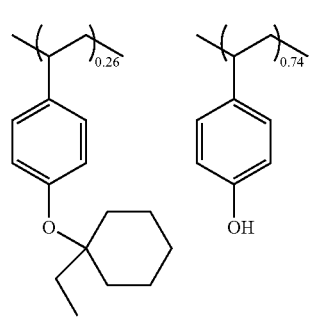

Comparative Polymer 2

Comparative Synthesis Example 3

A polymer was synthesized by the same procedure as above.
Copolymer Composition (Molar Ratio)
4-acetoxystyrene:hydroxystyrene=0.33:0.67
Mw=9,600
Mw/Mn=1.91
This is designated Comparative Polymer 3.

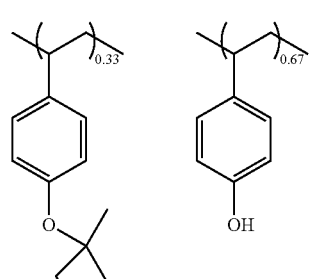

Comparative Polymer 3

Comparative Synthesis Example 4

A polymer was synthesized by the same procedure as above.
Copolymer Composition (Molar Ratio)
4-amyloxystyrene:1-isopropylcyclopentyl methacrylate:4-hydroxyphenyl methacrylate:3-oxo-2,7-dioxatricyclo-[4.2.1.0$^{4,8}$]nonan-9-yl methacrylate:PAG monomer 7=0.20:0.15:0.25:0.30:0.10
Mw=7,000
Mw/Mn=1.77
This is designated Comparative Polymer 4.

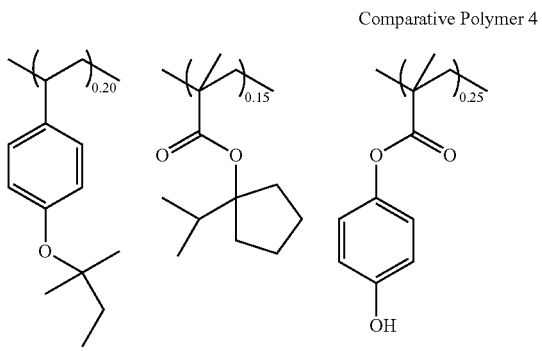

Comparative Polymer 4

-continued

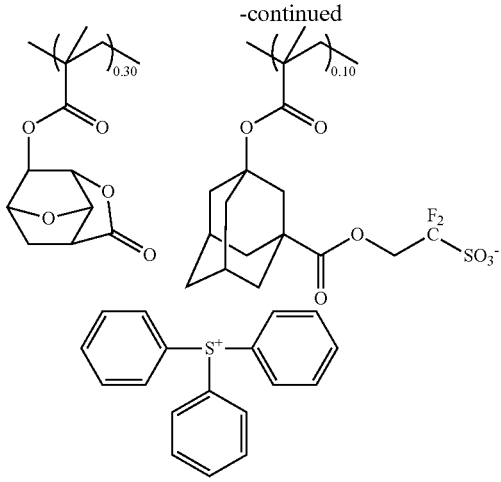

Comparative Synthesis Example 5

A polymer was synthesized by the same procedure as above.

Copolymer Composition (Molar Ratio)

1-ethylcyclopentyl methacrylate:4-hydroxyphenyl methacrylate:3-oxo-2,7-dioxatricyclo[4.2.1.0$^{4,8}$]nonan-9-yl methacrylate:PAG monomer 3=0.30:0.30:0.30:0.10

Mw=7,900

Mw/Mn=1.89

This is designated Comparative Polymer 5.

Comparative Polymer 5

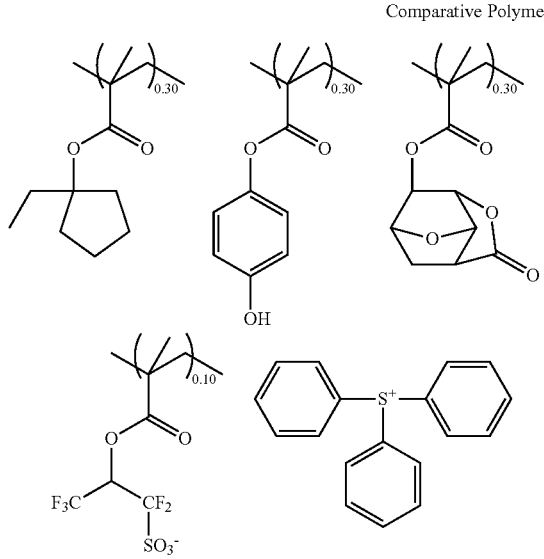

Examples and Comparative Examples

Positive resist compositions were prepared by dissolving each of the polymers synthesized above and selected components in a solvent in accordance with the recipe shown in Table 1, and filtering through a filter having a pore size of 0.2 μm. The solvent contained 100 ppm of a surfactant FC-4430 (3M Sumitomo Co., Ltd.).

The components in Table 1 are as identified below.

Polymers 1 to 12: polymers synthesized in Polymer Synthesis Examples 1 to 12

Comparative Polymers 1 to 5:
  polymers synthesized in Comparative Synthesis Examples 1 to 5

Organic Solvents:
  propylene glycol monomethyl ether acetate (PGMEA)
  cyclohexanone (CyH)

Acid generator: PAG1 of the following structural formula

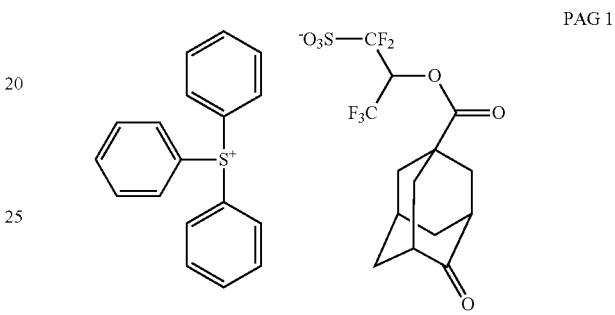

PAG 1

Basic compounds: Amine 1, Amine 2, and Amine 3 of the following structural formulae

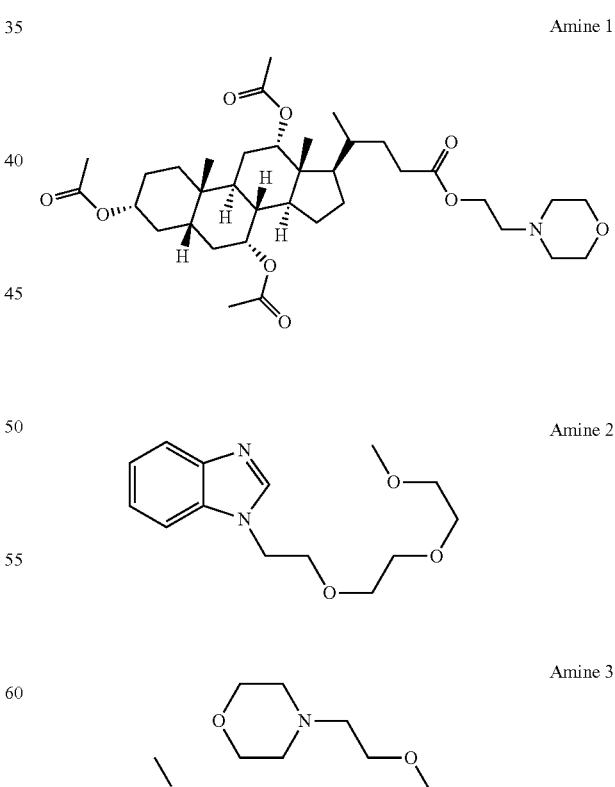

Amine 1

Amine 2

Amine 3

Dissolution regulator: DRI1 of the following structural formula

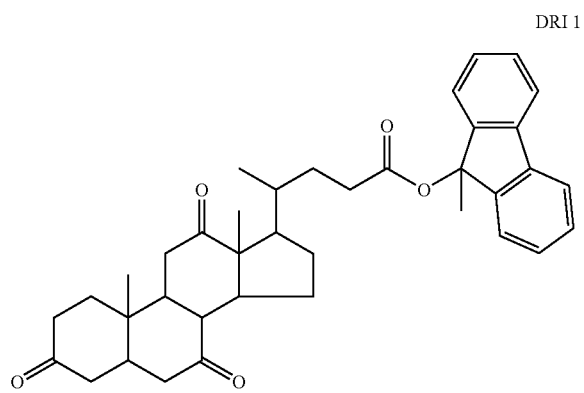 [SMILES: CC(CCC(=O)OC1(C)c2ccccc2-c2ccccc21)C1CCC2C3C(=O)CC4CC(=O)CCC4(C)C3CC(=O)C12C]

DRI 1

EB Writing Test

Using a coater/developer system Clean Track Mark 5 (Tokyo Electron Ltd.), the positive resist composition prepared above was spin coated onto a silicon substrate (diameter 6 inches, vapor primed with hexamethyldisilazane (HMDS)) and pre-baked on a hot plate at 110° C. for 60 seconds to form a resist film of 100 nm thick. Using a system HL-800D (Hitachi Ltd.) at a HV voltage of 50 keV, the resist film was exposed imagewise to EB in a vacuum chamber.

Using Clean Track Mark 5, immediately after the imagewise exposure, the wafer was baked (PEB) on a hot plate for 60 seconds and puddle developed in a 2.38 wt % TMAH aqueous solution for 30 seconds to form a positive pattern.

Resolution is a minimum size at the exposure dose (sensitivity) that provides a 1:1 resolution of a 120-nm line-and-space pattern. The 120-nm line-and-space pattern was measured for line width roughness (LWR) under SEM.

The resist composition is shown in Table 1 together with the sensitivity and resolution of EB lithography.

TABLE 1

|  |  | Polymer (pbw) | Acid generator (pbw) | Base (pbw) | Dissolution regulator (pbw) | Organic solvent (pbw) | PEB temperature (° C.) | Sensitivity ($\mu C/cm^2$) | Resolution (nm) | LWR (nm) |
|---|---|---|---|---|---|---|---|---|---|---|
| Example | 1 | Polymer 1 (100) | — | Amine 1 (1.5) | — | PGMEA(500) CyH(2,000) | 85 | 46 | 85 | 5.2 |
|  | 2 | Polymer 2 (100) | — | Amine 1 (1.5) | — | PGMEA(500) CyH(2,000) | 90 | 41 | 85 | 5.0 |
|  | 3 | Polymer 3 (100) | — | Amine 1 (1.5) | — | PGMEA(500) CyH(2,000) | 90 | 44 | 85 | 5.0 |
|  | 4 | Polymer 4 (100) | — | Amine 1 (1.5) | — | PGMEA(500) CyH(2,000) | 90 | 40 | 85 | 5.2 |
|  | 5 | Polymer 5 (100) | — | Amine 1 (1.5) | — | PGMEA(500) CyH(2,000) | 90 | 42 | 85 | 5.2 |
|  | 6 | Polymer 6 (100) | — | Amine 1 (1.5) | — | PGMEA(500) CyH(2,000) | 90 | 44 | 85 | 5.6 |
|  | 7 | Polymer 7 (100) | — | Amine 1 (1.5) | — | PGMEA(500) CyH(2,000) | 80 | 39 | 85 | 6.0 |
|  | 8 | Polymer 8 (100) | — | Amine 1 (1.5) | — | PGMEA(500) CyH(2,000) | 85 | 40 | 85 | 5.8 |
|  | 9 | Polymer 9 (100) | — | Amine 1 (1.5) | — | PGMEA(500) CyH(2,000) | 90 | 41 | 85 | 5.5 |
|  | 10 | Polymer 10 (100) | — | Amine 3 (1.5) | — | PGMEA(500) CyH(2,000) | 90 | 44 | 85 | 5.1 |
|  | 11 | Polymer 11 (100) | — | Amine 1 (1.5) | — | PGMEA(500) CyH(2,000) | 90 | 38 | 85 | 5.5 |
|  | 12 | Polymer 11 (100) | — | Amine 2 (1.0) | DRI 1 (5.0) | PGMEA(500) CyH(2,000) | 90 | 36 | 85 | 5.8 |
|  | 13 | Polymer 12 (100) | PAG 1 (15) | Amine 1 (1.5) | — | PGMEA(2,500) | 90 | 38 | 85 | 6.8 |
| Comparative Example | 1 | Comparative Polymer 1 (100) | PAG 1 (15) | Amine 1 (1.5) | — | PGMEA(2,500) | 90 | 40 | 100 | 7.2 |
|  | 2 | Comparative Polymer 2 (100) | PAG 1 (15) | Amine 1 (1.5) | — | PGMEA(2,500) | 90 | 44 | 90 | 7.9 |
|  | 3 | Comparative Polymer 3 (100) | PAG 1 (15) | Amine 1 (1.5) | — | PGMEA(2,500) | 90 | 45 | 95 | 7.9 |
|  | 4 | Comparative Polymer 4 (100) | — | Amine 1 (1.5) | — | PGMEA(500) CyH(2,000) | 95 | 55 | 90 | 6.5 |
|  | 5 | Comparative Polymer 5 (100) | — | Amine 1 (1.5) | — | PGMEA(500) CyH(2,000) | 95 | 55 | 90 | 6.5 |

It is evident from Table 1 that the resist compositions using the inventive polymers show satisfactory resolution, sensitivity and edge roughness. Although some polymers comprising an acid generator of polymer type copolymerized therein and having conventional acid labile groups are drastically improved in resolution and edge roughness properties and sometimes superior to those polymers which do not contain an acid generator of polymer type, but fall within the scope of the invention, the polymers having acid labile groups within the scope of the invention and comprising an acid generator copolymerized therein exhibit excellent resolution and minimized edge roughness owing to their synergy.

Japanese Patent Application No. 2012-100568 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer consisting of recurring units (a) of acid labile group-substituted hydroxystyrene having the general formula (2):

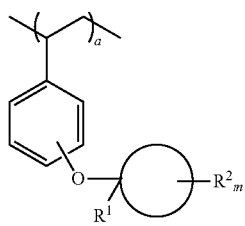

(2)

wherein

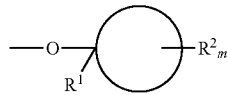

is selected from the group consisting of the following groups:

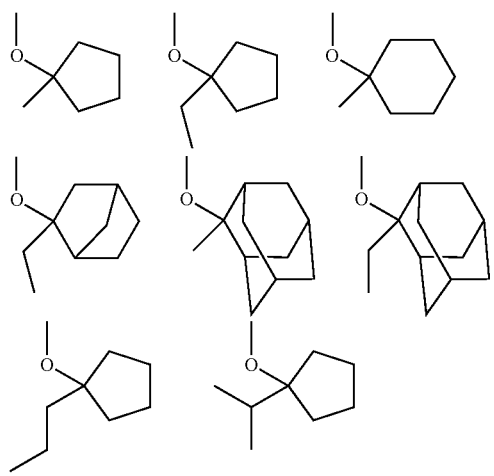

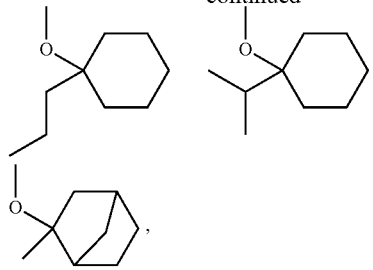

and recurring units selected from sulfonium salt units (b1) to (b3) represented by the general formula (3):

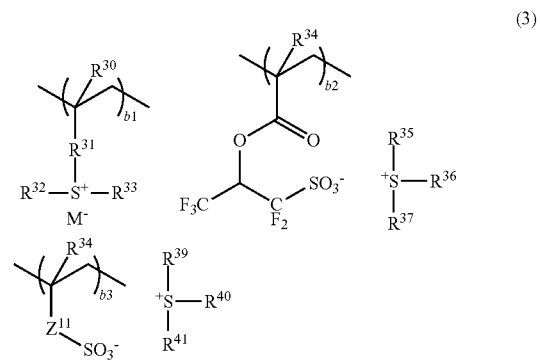

(3)

wherein $R^{30}$, $R^{34}$, and $R^{38}$ each are hydrogen or methyl, $R^{31}$ is a single bond, phenylene, $-O-R^{42}-$, or $-C(=O)-Y^{11}-R^{42}-$, $Y^{11}$ is oxygen or NH, $R^{42}$ is a straight, branched or cyclic $C_1$-$C_6$ alkylene group, alkenylene or phenylene group, which may contain a carbonyl, ester, ether or hydroxyl radical, $R^{32}$, $R^{33}$, $R^{35}$, $R^{36}$, $R^{37}$, $R^{39}$, $R^{40}$, and $R^{41}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group, $Z^{11}$ is a single bond, methylene, ethylene, phenylene, fluorophenylene, $-O-R^{43}-$, or $-C(=O)-Z^{12}-R^{43}-$, $Z^{12}$ is oxygen or NH, $R^{43}$ is a straight, branched or cyclic $C_1$-$C_6$ alkylene group, alkenylene or phenylene group, which may contain a carbonyl, ester, ether or hydroxyl radical, $M^-$ is a non-nucleophilic counter ion, b1, b2 and b3 are in the range of $0 \le b1 \le 0.3$, $0 \le b2 \le 0.3$, $0 \le b3 \le 0.3$, and $0 < b1+b2+b3 \le 0.3$;

recurring units (c) selected from (meth)acrylic acid and derivatives thereof, styrenecarboxylic acid, and vinylnaphthalenecarboxylic acid, each having an acid labile group substituted thereon, represented by the general formula (4):

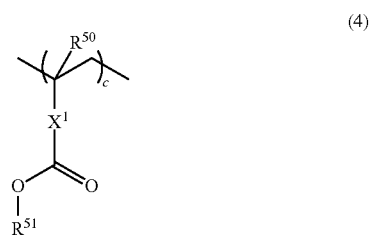

(4)

wherein $R^{50}$ is hydrogen or methyl, $R^{51}$ is an acid labile group selected from the group consisting of those of the following formulae:

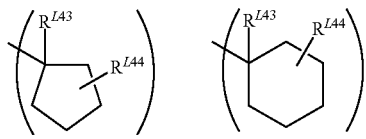

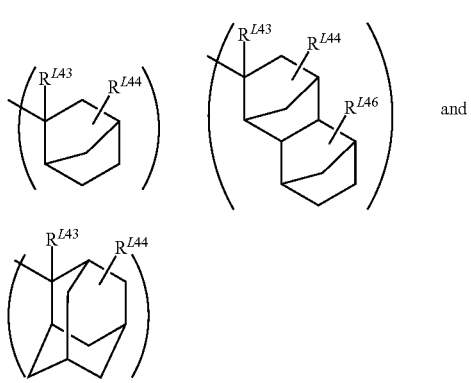

wherein $R^{L43}$ is a straight, branched or cyclic $C_1$-$C_8$ alkyl group or $C_6$-$C_{20}$ aryl group, $R^{L44}$ and $R^{L46}$ each are hydrogen or a straight, branched or cyclic $C_1$-$C_{20}$ alkyl group, $X^1$ is a single bond, —C(=O)—O—$R^{52}$—, phenylene or naphthylene group, and $R^{52}$ is a straight, branched or cyclic $C_1$-$C_{10}$ alkylene group which may have an ester radical, ether radical or lactone ring;

recurring units having a phenolic hydroxyl group, selected from recurring units (d1) to (d9) represented by the general formula (5):

(5)

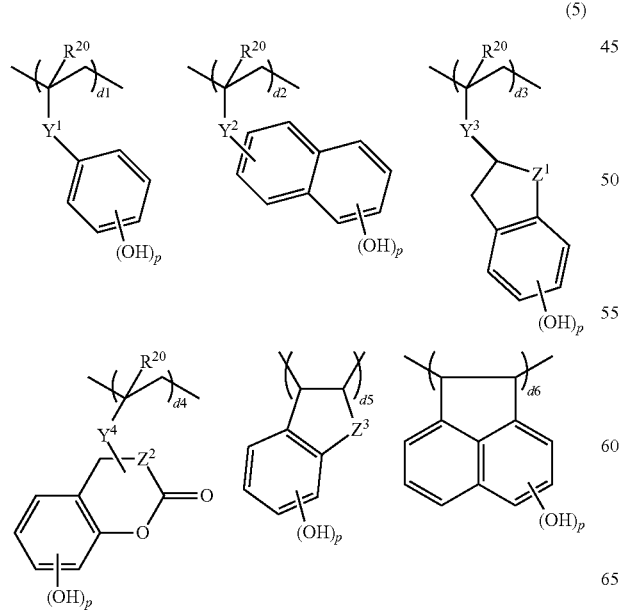

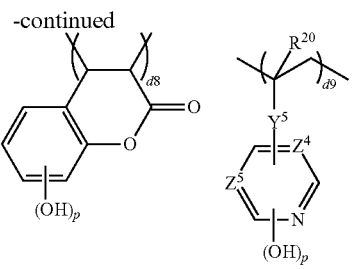

wherein $R^{20}$ is each independently hydrogen or methyl, $Y^1$, $Y^2$ and $Y^5$ each are a single bond or —C(=O)—O—$R^{21}$—, $Y^3$ and $Y^4$ each are —C(=O)—O—$R^{22}$—, $R^{21}$ and $R^{22}$ each are a single bond or a straight, branched or cyclic $C_1$-$C_{10}$ alkylene group which may contain an ether or ester radical, $Z^1$ and $Z^2$ each are methylene or ethylene, $Z^3$ is methylene, oxygen or sulfur, $Z^4$ and $Z^5$ each are CH or nitrogen, and p is 1 or 2; and recurring units (e) having an adhesive group selected from the class consisting of hydroxyl (exclusive of phenolic hydroxyl), lactone ring, ether, ester, carbonyl, cyano, sulfonic acid ester, sulfonamide, cyclic —O—C(=O)—S— and —O—C(=O)—NH—;

said polymer having a weight average molecular weight of 1,000 to 500,000.

2. A positive resist composition comprising the polymer of claim 1 as a base resin.

3. The resist composition of claim 2, further comprising an organic solvent and an acid generator, the composition being a chemically amplified positive resist composition.

4. The resist composition of claim 3, further comprising a dissolution regulator.

5. The resist composition of claim 3, further comprising a basic compound and/or a surfactant as an additive.

6. A pattern forming process comprising the steps of applying the positive resist composition of claim 2 onto a substrate to form a coating, baking, exposing the coating to high-energy radiation, and developing the exposed coating in a developer.

7. A polymer comprising recurring units (a) of acid labile group-substituted hydroxystyrene having the general formula (2):

(2)

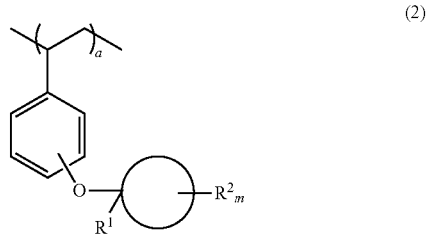

wherein

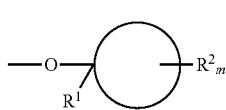

is selected from the group consisting of the following groups:

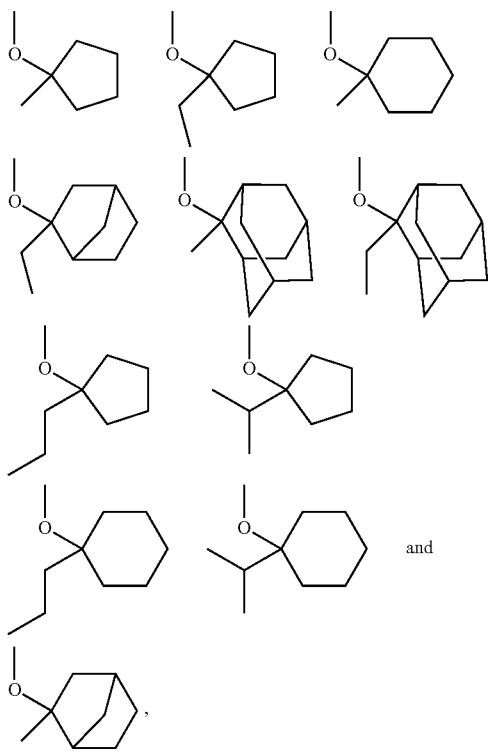

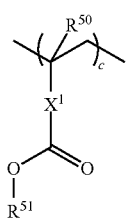

recurring units (c) selected from (meth)acrylic acid and derivatives thereof, styrenecarboxylic acid, and vinylnaphthalenecarboxylic acid, each having an acid labile group substituted thereon, represented by the general formula (4):

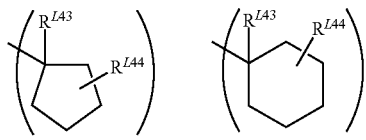

wherein $R^{50}$ is hydrogen or methyl, $R^{51}$ is an acid labile group, $X^1$ is a single bond, —C(=O)—O—$R^{52}$—, phenylene or naphthylene group, and $R^{52}$ is a straight, branched or cyclic $C_1$-$C_{10}$ alkylene group which may have an ester radical, ether radical or lactone ring, wherein the acid labile group of $R^{51}$ is selected from the group consisting of those of the following formulae:

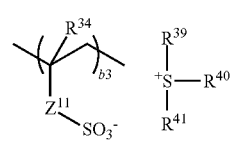

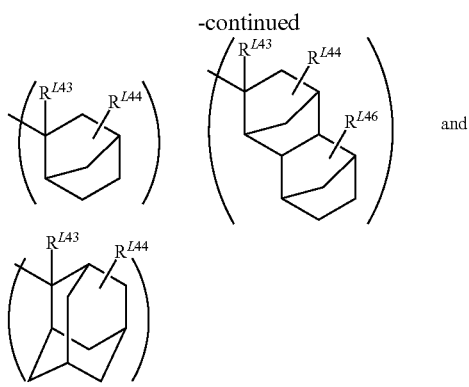

wherein $R^{L43}$ is a straight, branched or cyclic $C_1$-$C_8$ alkyl group or $C_6$-$C_{20}$ aryl group, $R^{L44}$ and $R^{L46}$ each are hydrogen or a straight, branched or cyclic $C_1$-$C_{20}$ alkyl group, said polymer having a weight average molecular weight of 1,000 to 500,000.

8. The polymer of claim 7 which further comprises recurring units selected from sulfonium salt units (b1) to (b3) represented by the general formula (3):

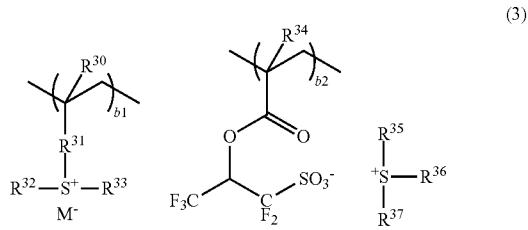

wherein $R^{30}$, $R^{34}$, and $R^{38}$ each are hydrogen or methyl, $R^{31}$ is a single bond, phenylene, —O—$R^{42}$—, or —C(=O)—$Y^{11}$—$R^{42}$—, $Y^{11}$ is oxygen or NH, $R^{42}$ is a straight, branched or cyclic $C_1$-$C_6$ alkylene group, alkenylene or phenylene group, which may contain a carbonyl, ester, ether or hydroxyl radical, $R^{32}$, $R^{33}$, $R^{35}$, $R^{36}$, $R^{37}$, $R^{39}$, $R^{49}$, and $R^{41}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group, $Z^{11}$ is a single bond, methylene, ethylene, phenylene, fluorophenylene, —O—$R^{43}$—, or —C(=O)—$Z^{12}$—$R^{43}$—, $Z^{12}$ is oxygen or NH, $R^{43}$ is a straight, branched or cyclic $C_1$-$C_6$ alkylene group, alkenylene or phenylene group, which may contain a carbonyl, ester, ether or hydroxyl radical, $M^-$ is a non-nucleophilic counter ion, b1, b2 and b3 are in the range of $0 \leq b1 \leq 0.3$, $0 \leq b2 \leq 0.3$, $0 \leq b3 \leq 0.3$, and $0 < b1+b2+b3 \leq 0.3$.

9. The polymer of claim 7 which further comprises recurring units having a phenolic hydroxyl group, selected from recurring units (d1) to (d9) represented by the general formula (5):

(5)

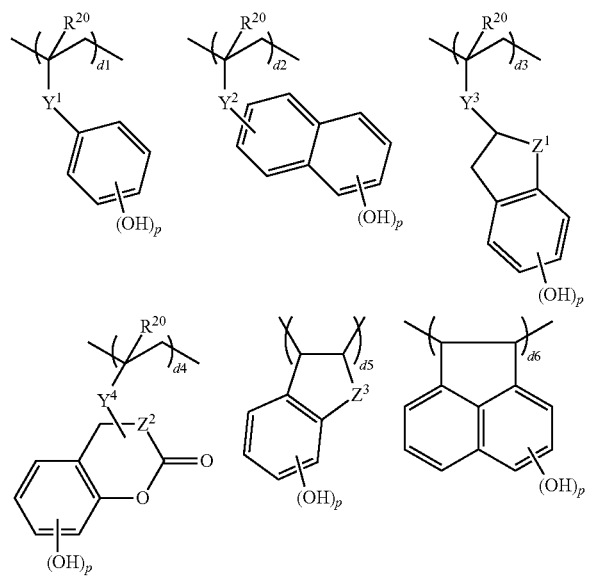

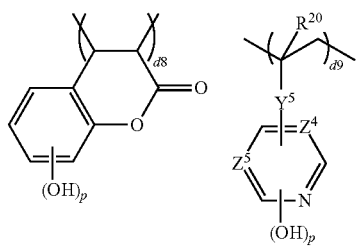

wherein $R^{20}$ is each independently hydrogen or methyl, $Y^1$, $Y^2$ and $Y^5$ each are a single bond or —C(=O)—O—$R^{21}$—, $Y^3$ and $Y^4$ each are —C(=O)—O—$R^{22}$—, $R^{21}$ and $R^{22}$ each are a single bond or a straight, branched or cyclic $C_1$-$C_{10}$ alkylene group which may contain an ether or ester radical, $Z^1$ and $Z^2$ each are methylene or ethylene, $Z^3$ is methylene, oxygen or sulfur, $Z^4$ and $Z^5$ each are CH or nitrogen, and p is 1 or 2; and recurring units (e) having an adhesive group selected from the class consisting of hydroxyl (exclusive of phenolic hydroxyl), lactone ring, ether, ester, carbonyl, cyano, sulfonic acid ester, sulfonamide, cyclic —O—C(=O)—S— and —O—C(=O)—NH—.

10. A positive resist composition comprising the polymer of claim 7 as a base resin.

* * * * *